United States Patent [19]
Peddle

[11] Patent Number: 6,119,049
[45] Date of Patent: Sep. 12, 2000

[54] MEMORY MODULE ASSEMBLY USING PARTIALLY DEFECTIVE CHIPS

[75] Inventor: Charles I. Peddle, San Diego, Calif.

[73] Assignee: Tandon Associates, Inc., Simi Valley, Calif.

[21] Appl. No.: 08/909,489

[22] Filed: Aug. 12, 1997

Related U.S. Application Data

[60] Provisional application No. 60/023,255, Aug. 12, 1996, and provisional application No. 60/049,667, Jun. 16, 1997.

[51] Int. Cl.[7] .................................................. G06F 19/00
[52] U.S. Cl. ......................... 700/121; 700/97; 700/110; 700/117; 29/832; 29/840; 365/200; 365/225.7; 365/230.03
[58] Field of Search ................................ 365/200, 225.7, 365/230.03, 230.06; 29/402.01, 832, 840; 700/95, 97, 110, 116, 117, 9, 17, 121

[56] References Cited

U.S. PATENT DOCUMENTS

| | | | |
|---|---|---|---|
| 3,714,637 | 1/1973 | Beausoleil | 365/200 |
| 3,753,235 | 8/1973 | Daughton et al. | 365/200 |
| 3,781,826 | 12/1973 | Beausoleil | 365/200 |
| 3,984,860 | 10/1976 | Logue | 357/68 |
| 4,333,152 | 6/1982 | Best | 364/521 |
| 4,445,187 | 4/1984 | Best | 364/521 |
| 4,569,026 | 2/1986 | Best | 364/521 |
| 4,992,984 | 2/1991 | Busch et al. | 365/200 |
| 5,006,987 | 4/1991 | Harless | 364/419 |
| 5,208,178 | 5/1993 | Usami | 437/51 |
| 5,240,866 | 8/1993 | Friedman | 437/8 |
| 5,347,306 | 9/1994 | Nitta | 348/15 |
| 5,444,366 | 8/1995 | Chiu | 324/158.1 |
| 5,448,488 | 9/1995 | Oshima | 364/468 |
| 5,461,714 | 10/1995 | Honiden et al. | 395/2.67 |
| 5,490,232 | 2/1996 | Asano et al. | 395/10 |
| 5,598,341 | 1/1997 | Ling et al. | 364/468.17 |
| 5,615,387 | 3/1997 | Crockett, Jr. et al. | 29/402.01 |
| 5,657,281 | 8/1997 | Rao | 365/200 |
| 5,691,907 | 11/1997 | Resler et al. | 364/468.28 |
| 5,832,595 | 11/1998 | Maruyama et al. | 29/402.01 |
| 5,835,378 | 11/1998 | Scepanovic et al. | 364/468.28 |
| 5,887,343 | 3/1999 | Salatino et al. | 29/840 |

OTHER PUBLICATIONS

A Robot Organizing Purposive Behavior By Itself Abstract, Author: Ikeda et al. , Published Jun. 30, 1992.

L.J. Bosch and C.F. Hardiman, "Dynamic Selection of Partial Good Array Chips by Bit Address Selection," IBM Technical Disclosure Bulletin, vol. 25, No. 3B, pp. 1485–1487, Aug. 1982.

F.J. Aichelmann, Jr., "Multiplexed Partial–Good Chip Scheme . . . ", IBM Technical Discosure Bulletin, vol.22, No.1, pp. 138–9, Jun. 1979.

*Primary Examiner*—William Grant
*Assistant Examiner*—Ramesh Patel
*Attorney, Agent, or Firm*—John C. Albrecht

[57] ABSTRACT

Methods and devices for using less-than-perfect memory chips and packages in the manufacture of memory modules. In the preferred method the failed I/O lines in primary memory packages are disconnected and replaced by selected I/O lines from flawless or partially defective backup parts all mounted on the same module. The various processes comprise sorting of partially defective parts according to the results of wafer or packages test, judicious distribution of backup parts on a PC board module and routing of their I/O lines, optimized patching techniques and multi-level tests and repatching routines. The methods and processes are equally applicable to Chip On Board assemblies as well as package assemblies.

71 Claims, 47 Drawing Sheets

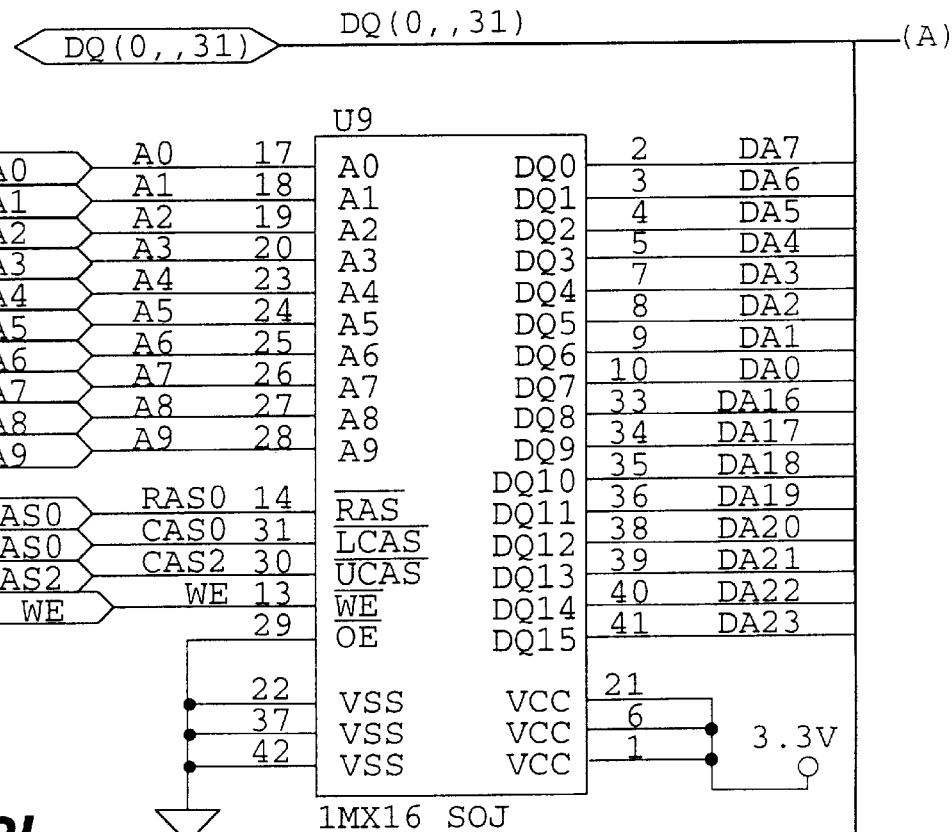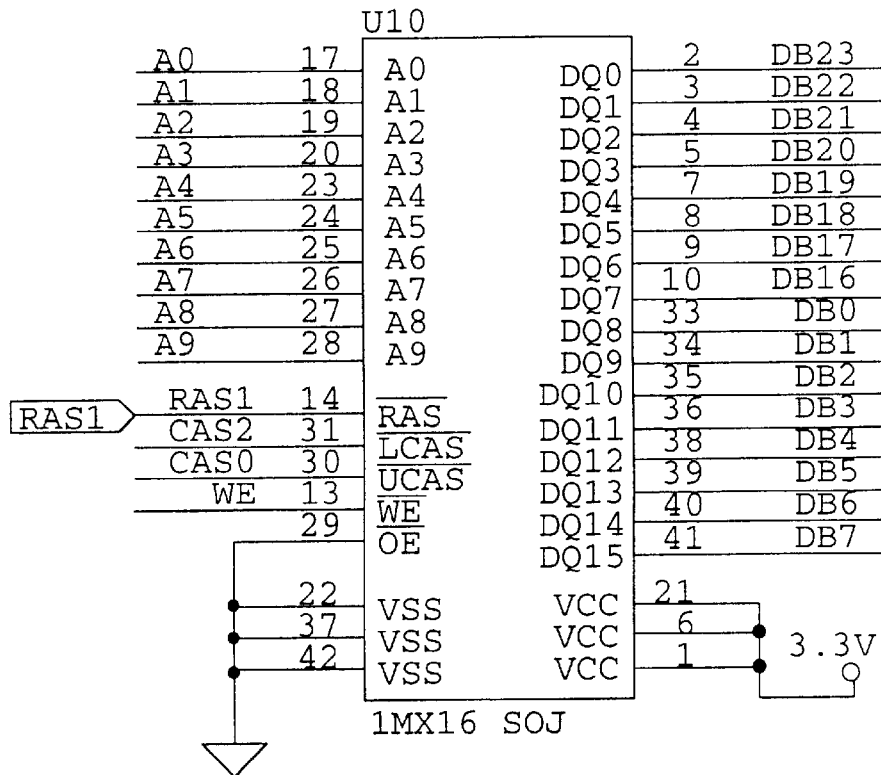
Fig. 2I

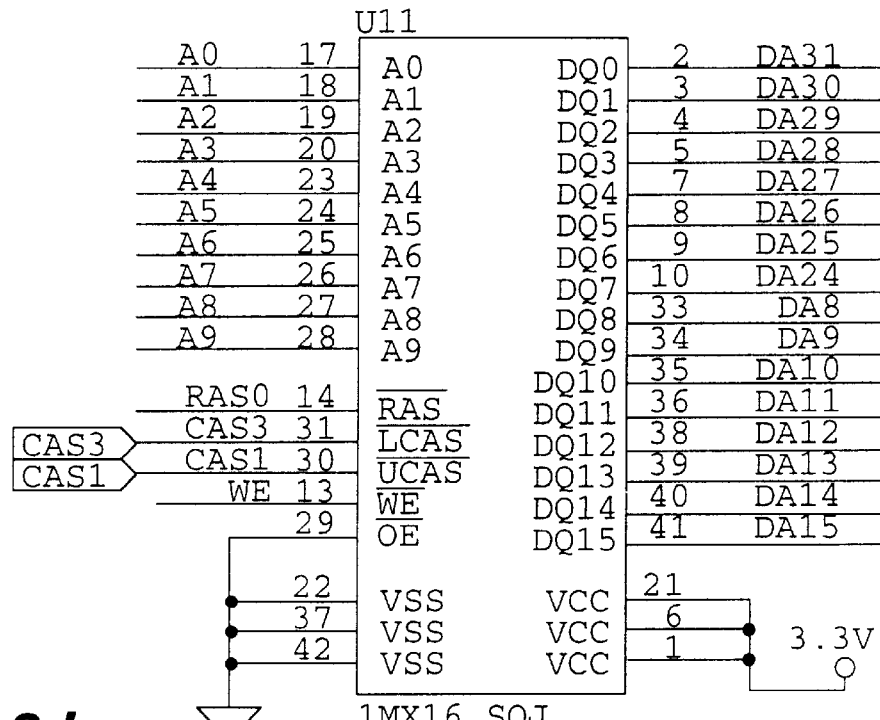
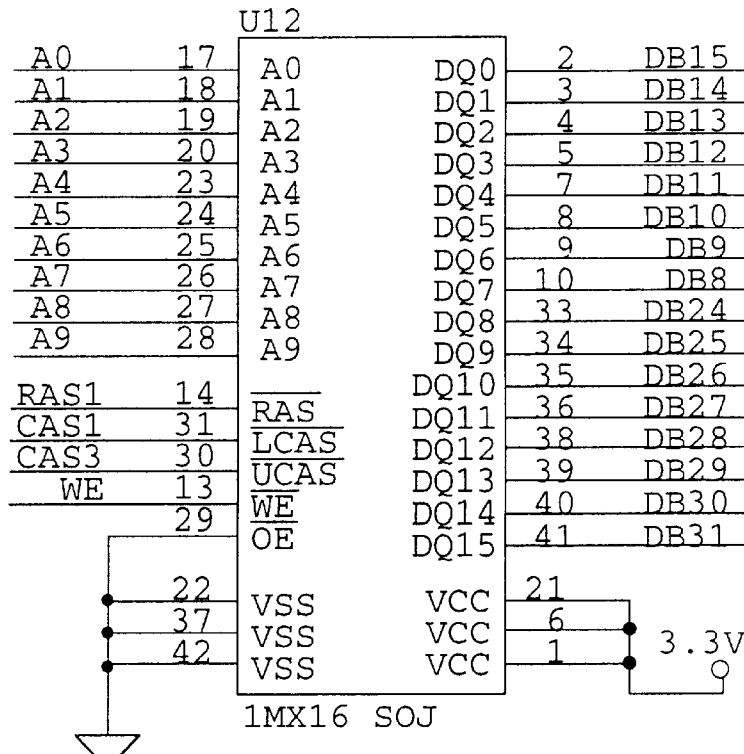
Fig. 2J

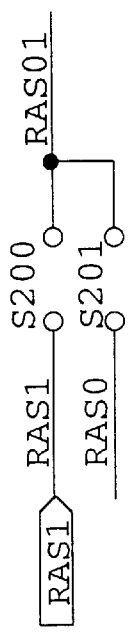
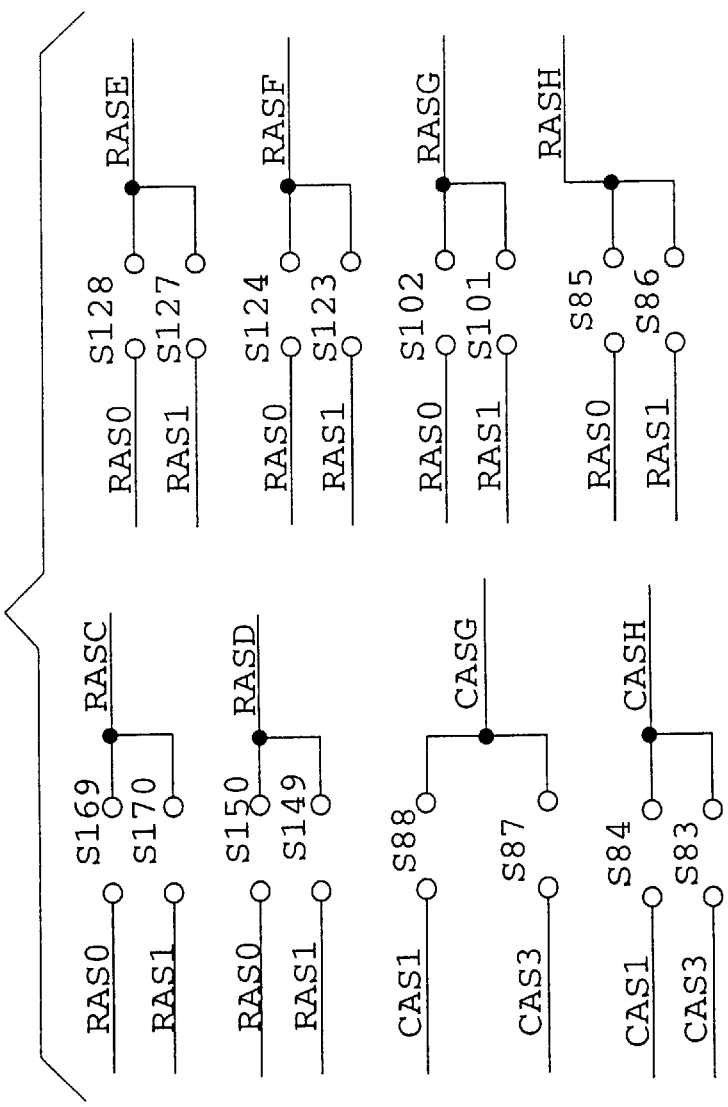

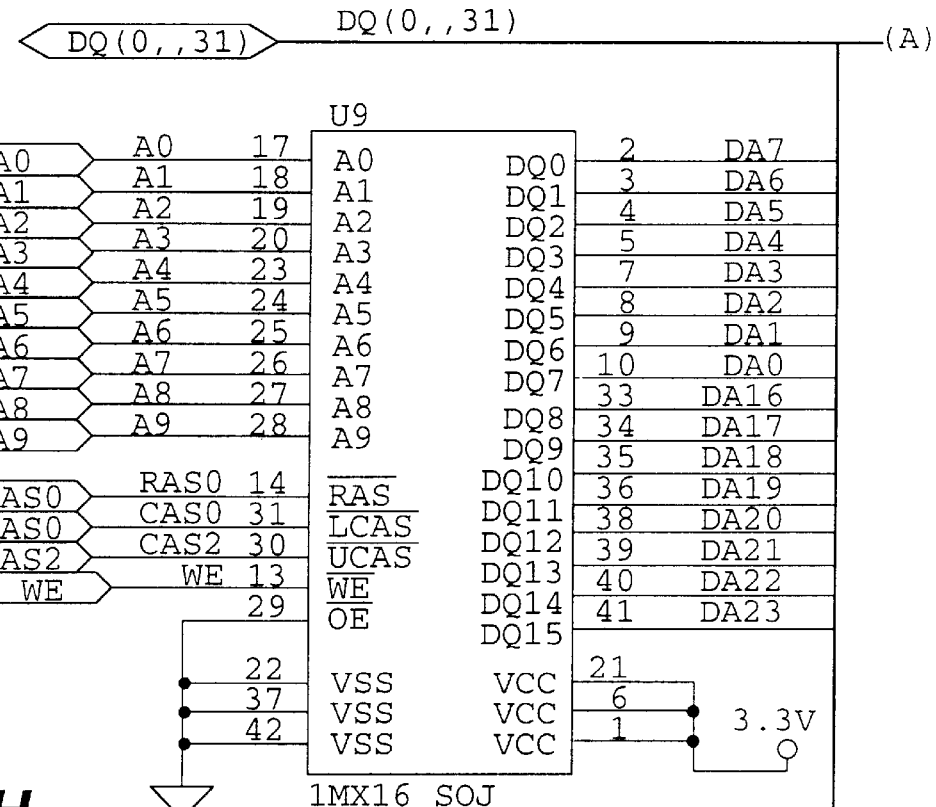
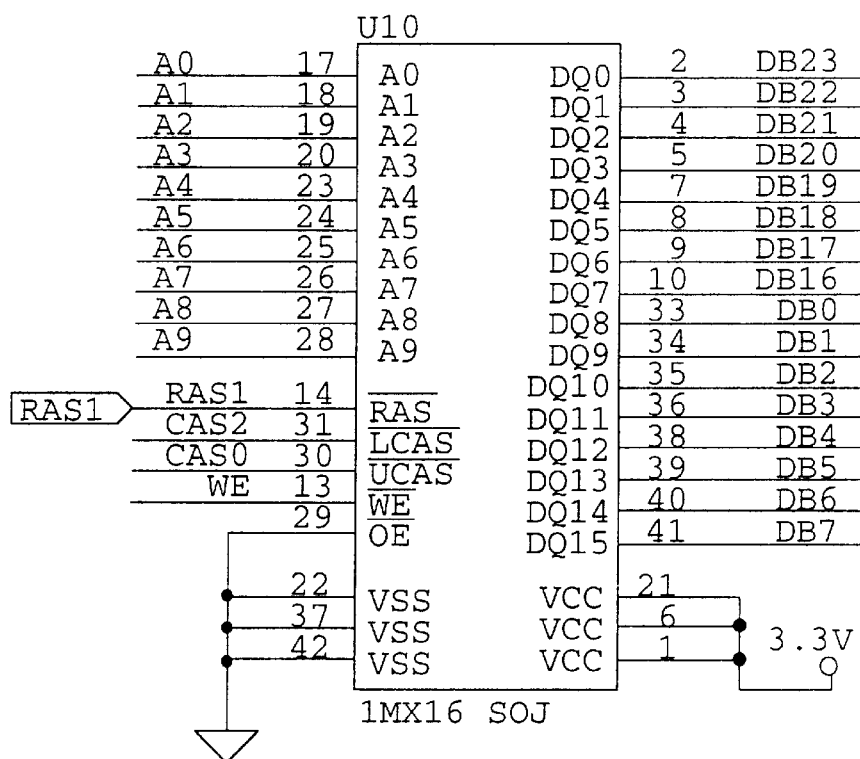
Fig. 4H

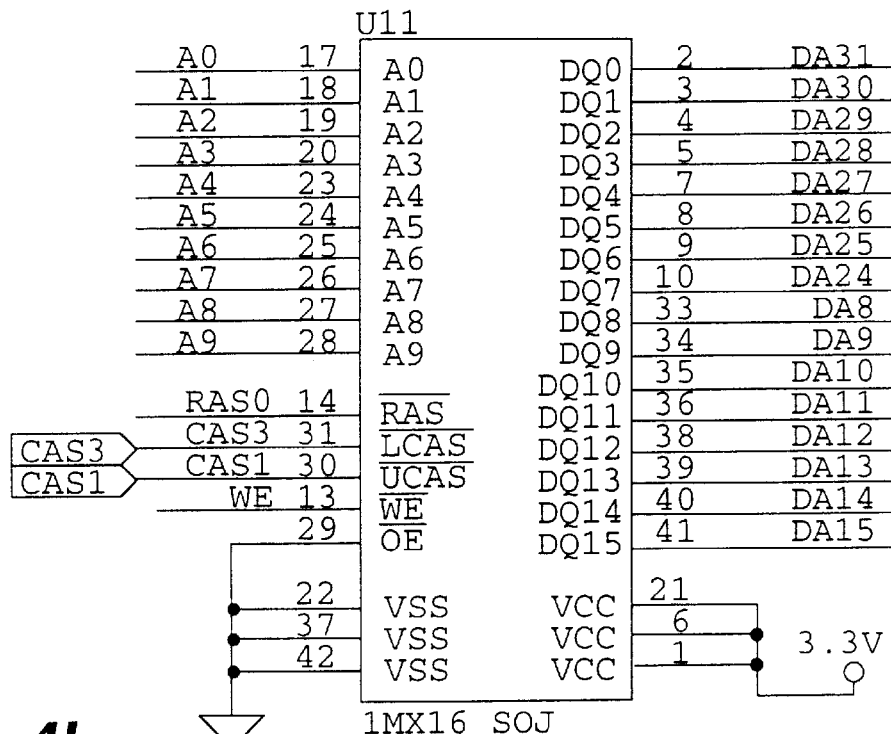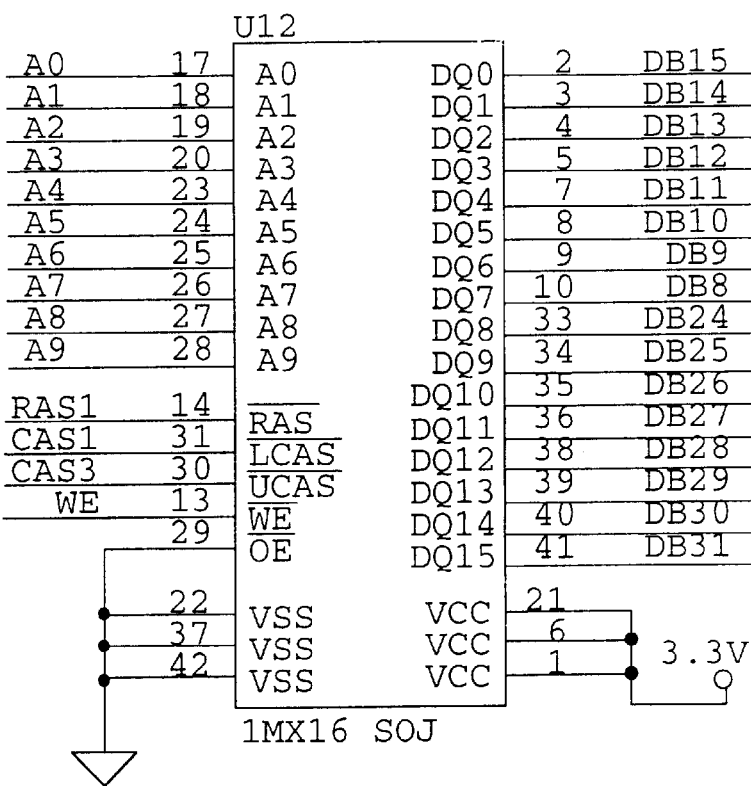
Fig. 4I

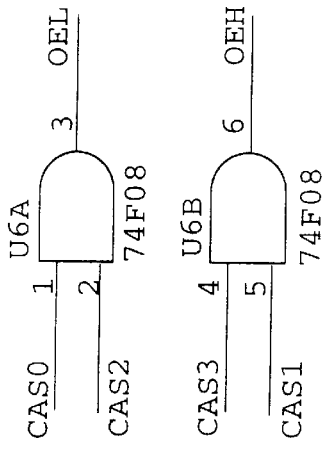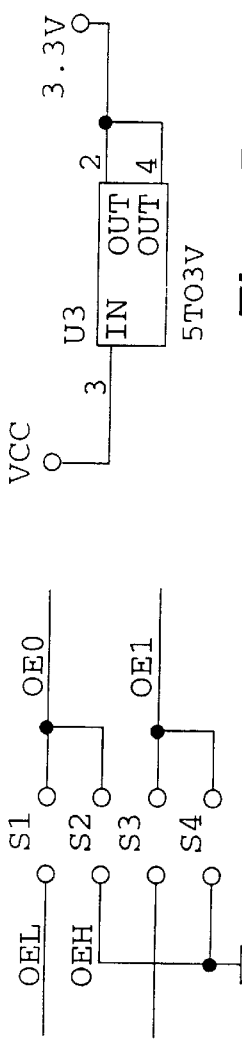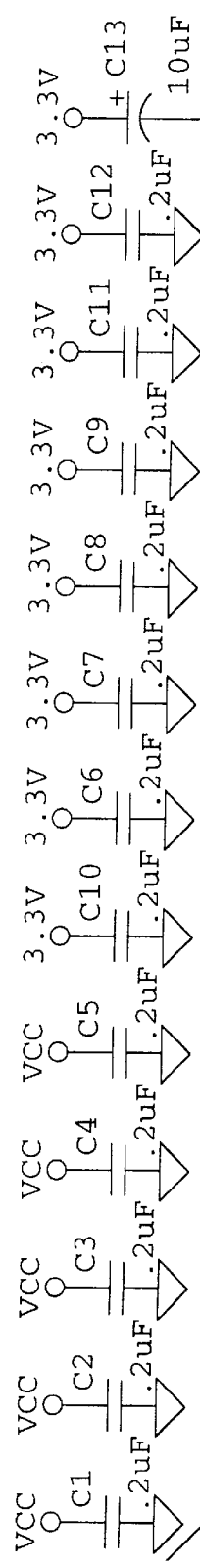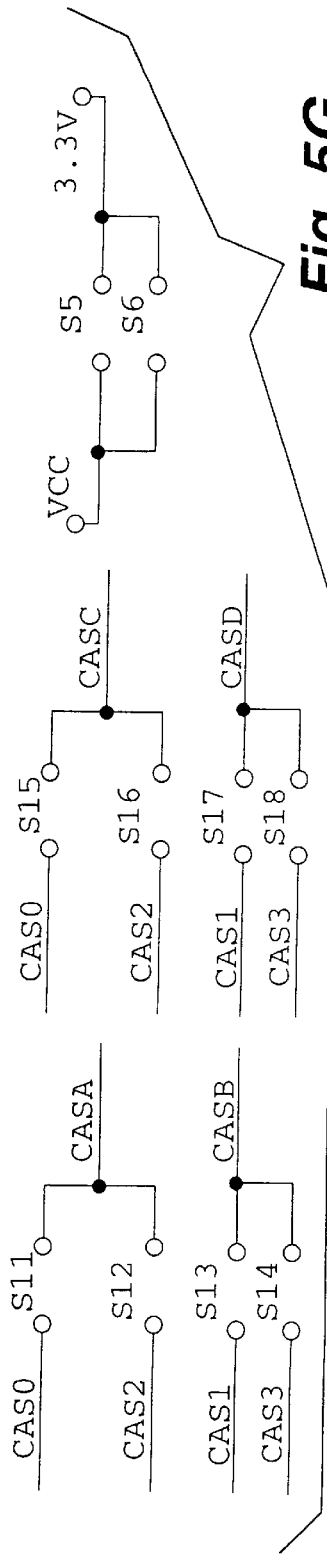

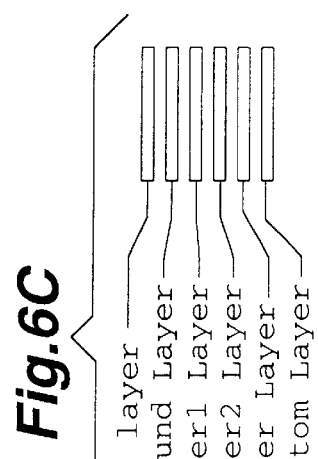

Fig. 7J

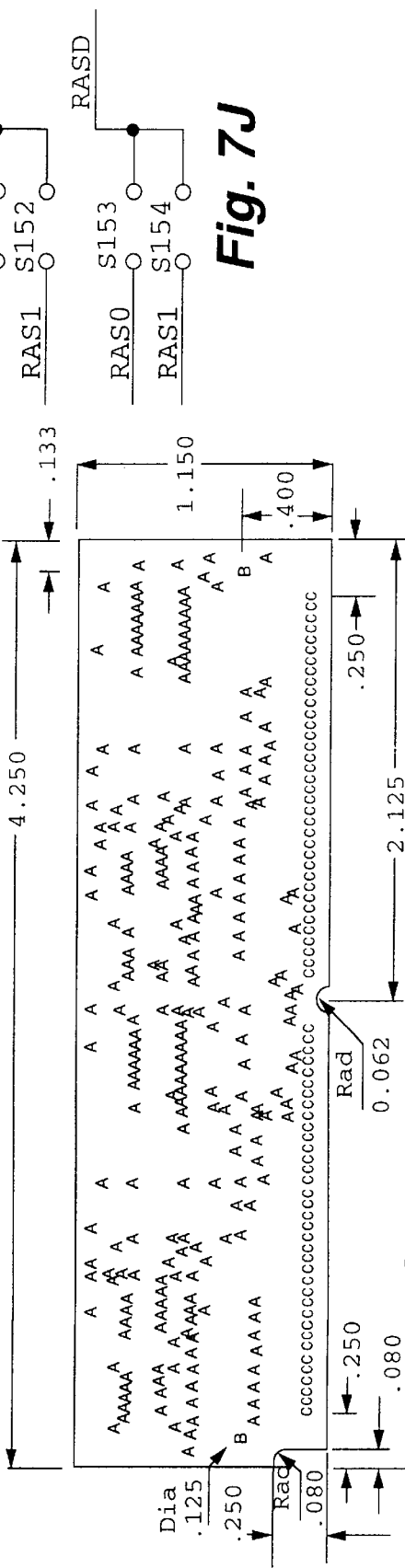

Fig.6A

| DRILL SYMBOL | DRILL SIZE | USED | COMMENT |
|---|---|---|---|
| A | 15 Mils | 230 | Plated |
| C | 20 Mils | 72 | Plated |
| B | 125 Mils | 2 | Non Plated |

Top layer
Ground Layer
Inner1 Layer
Inner2 Layer
Power Layer
Bottom Layer

Fab Notes:
1. Finish Board Thickness To Be 0.050 +/- 0.003
2. Board Material To Be NEMA FR4 in Green Color
3. Copper Thickness To Be 1 Ounce for all Layers.
4. Board Contains Six Copper Layer:
   Top Layer, Ground Layer, Inner1 Layer, Inner2 Layer, Power Layer, Bottom layer.
5. Layer assignment is:

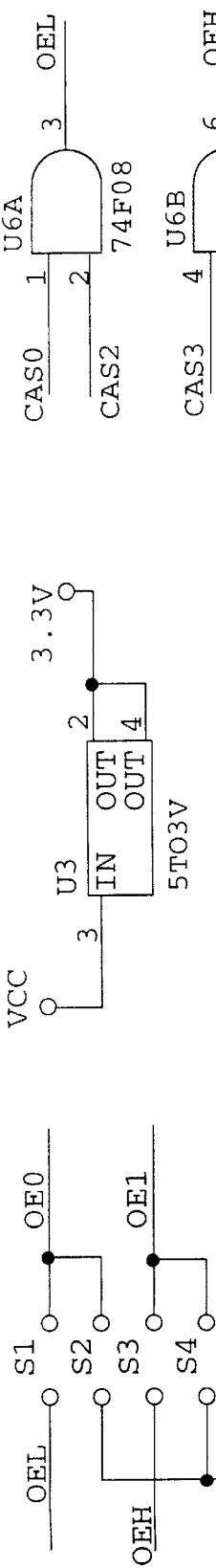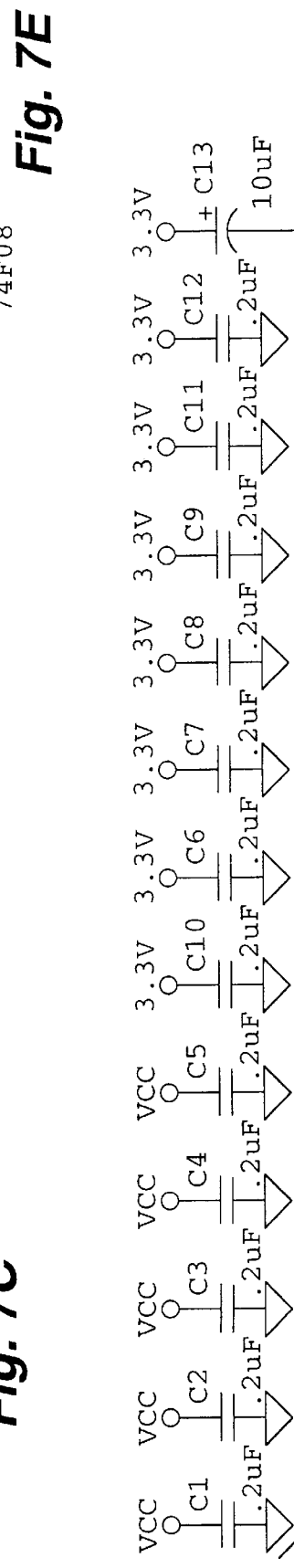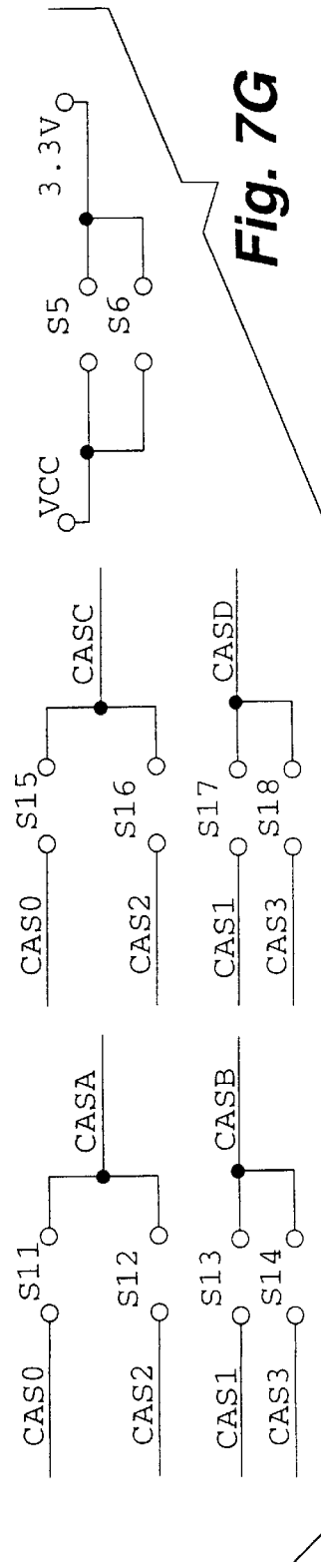

MEMORY MODULE ASSEMBLY USING PARTIALLY DEFECTIVE CHIPS

RELATED APPLICATIONS

This application claims the benefit of U.S. Provisional Application No. 60/023,255 filed Aug. 12, 1996, and U.S. Provisional Application No. 60/049,667 filed Jun. 16, 1997.

FIELD OF THE INVENTION

This invention relates to electronic memory modules, and more specifically to the manufacture of memory modules that selectively use operating segments of a plurality of less-than-perfect chips or packages exclusively, or in combination with perfect ones.

BACKGROUND OF THE INVENTION

An Integrated Circuit (IC) comprises millions of individual transistor or logical circuits, e.g., memory cells.

A die or chip is the smallest manufactured unit form of integrated circuits. They are fabricated in a large array on a single substrate called wafer. The wafer is then cut into individual dice or chips. Chips can be encapsulated into packages, most often one chip per package and sometimes several of them together. Packages are provided with leads for mounting on a Printed Circuit (PC) board to create an electronic module, e.g., a memory module. Sometimes the package state is bypassed and chips are mounted directly on a PC board, e.g., the so-called Chip-On-Board (COB) assembly. Validity tests can be performed on single chips at the wafer level, on individual packages, or on entire modules. Each wafer, package or module may contain manufacturing flaws that invalidate portions of, or whole chips.

The impact of the manufacturing flaws are most often limited so that substantial portions of defective chips remain unaffected. It is common practice to use an excess number of partially good chips, package or modules to assemble a complete memory unit that normally would require a lesser number of fully operating ones. For example, a 1M×9 Single In-line Memory Module (SIMM) could be made with three partially good 1M×3 Dynamic Random Access Memory (DRAM) chip or package sections in lieu of two flawless 1M×4 chips or packages and one 1M×1 flawless one for the parity bit. The identification, isolation and combination of operating segments of partially defective chips, packages or modules often require complex procedures and bulky circuits due to the great number of possible combinations whether or not one tries to combine chips or packages on a single module, or wire together several modules. The new higher density memories have compounded the complexity of such combinations.

IC manufacturers use various types of self-correcting techniques in order to improve the quality of their chips. For example, a series of redundant or spare cells are built into a die. At the wafer level, the die is tested. The defective cells are isolated and some of the spare cells are wired in their place such as by blowing fuse sections prebuilt on the chip. In spite of these highly effective correction techniques, defects are still detected in chips before and after they are encapsulated into packages or assembled on COB modules. The packaging and assembly processes sometimes cause some chips failure. The high cost of high-density chips make the use of less-than-perfect ones an economic necessity. Yet, the prior art does not offer a systematic and efficient approach to the combination of less-than-perfect chips or packages with or without "perfect" ones in order to create economically advantageous memory modules. The instant invention results from a search for quick, versatile and economical processes to assemble memory modules out of less-than-perfect chips.

SUMMARY OF THE INVENTION

The principal and secondary objects of this invention are to selectively utilize operating segments of partially defective memory chips and packages by identifying the working segments in a series of chips before they are encapsulated or a series of packages before or after they are assembled on a memory module and combining their working segments in the most effective manner in a cohesive memory assembly. This invention allows utilization of a maximum number of chips in cost-effective applications transparent to the user.

Those methods and processes differ somewhat depending upon the type of memory devices involved.

They are all predicated upon the fact that the combination or re-routing of I/O lines between chips, packages or modules is subject to mechanical limitations both in terms of circuit size, number of cross-over leads that can be crowded upon a PC board. These limitations require some trade-offs between the types, sizes, and distribution of the chips and packages that can be used to assemble a particular memory unit. The instant invention processes provide a logical approach to the combination of chips and/or packages using decision-guiding programs as well as versatile I/O line recombining hardware.

The disclosure deals with various distinct methods and processes to assemble memory devices using less-than-perfect components.

A first method called patching is more particularly applicable to memory assemblies that use a byte addressing scheme, and consists of substituting I/O lines from backup parts for those failed ones of one or more primary components. The substitution may require the switching of address lines of both backup and primary parts. The backup parts may be partially defective so long as it contains a usable amount of working segments.

A second method, called bit steering, is more particularly applicable to memory assemblies that use a word addressing scheme, and consists of combining working I/O lines out of a series of partially defective components. The working I/O lines are collected and connected linearly to appear like a cohesive memory module. Both methods involve testing of parts in order to identify their working, and failed segments. This testing can be done before and after mounting the parts on a module PC board, or only after they are assembled.

Except in COB modules where chip replacement is not possible, the patching and bit-steering processes may require the replacement of some entire chips or packages if the combination of the originally installed ones cannot yield the desired full memory configuration.

Preassembled testing results allows for a first decisional process on the selection, grouping and layout of the parts on a memory module PC board, then a second decisional process for the patching or bit-steering of the I/O lines and address lines.

Assembly of non-tested parts requires only one decisional process in the combining of the I/O lines of the working segments or bits of already assembled components. Both patching and bit-steering may be done by means of solder dot connections or jumper installations on a printed circuit network.

The solder-dot patterns or other techniques are designed to provided a logical oring of sets of I/O lines.

The invention comprises hardware devices which allows a judicially selected number and type of patching connections as well as decisional processes about the selection and distribution of parts and the choice and assignment of patching or bit-steering I/O lines.

BRIEF DESCRIPTION OF THE DRAWINGS

FIGS. 4A–4M are circuit diagram of a COB module.

FIGS. 5A–5M circuit diagram of an alternative memory module.

FIGS. 6A–6C diagram showing the dimensions of the memory module shown in FIGS. 5A–5M.

DESCRIPTION OF THE PREFERRED EMBODIMENT OF THE INVENTION

Figure 1A:
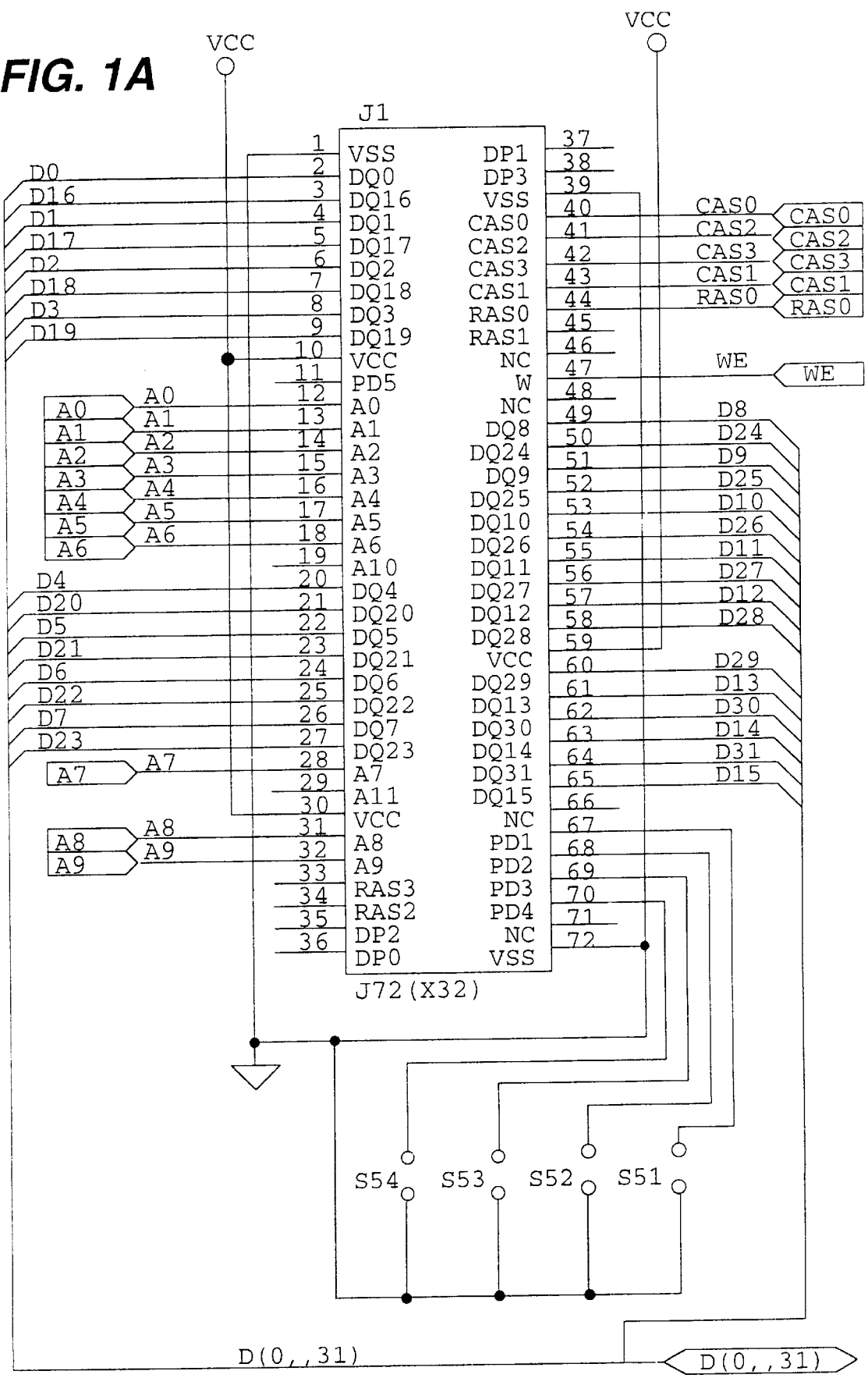
FIGS. 1A–1G are a circuit diagram of a SIMM manufactured according to the invention.

Memories are organized by design into a series of usable configurations. A memory containing sixteen million bits of information storage is usually organized in small blocks of physical locations which have a common address. In the patching method disclosed herein, this organization is called a quadrant. Physical layout and connection define a block for addressing simplicity and minimum layout. On most large memories the quadrant usually comprises either 64 or 128K of bits, where K stands for the power-of-two which most closely corresponds to the actual size of the quadrant. Each memory location has a specific power of two address defined during the layout and accessed by address lines during the standard memory addressing sequence. Half the address is selected with the Row Address Select (RAS) signal, and the second half is selected with the Column Address Select (CAS) signal. Since memory circuit flaws tend to be very random and of small size, only a single area of a quadrant is usually affected, leaving the remainder of the memory circuit fully functional. Chips or packages which are partially functional can be combined on a single PC board to create a complete memory module. There are two basic approaches to the combination of parts to build a particular memory module, patching and bit-steering. For the purposes of these illustrations we will focus on the popular SIMM/DIMM application. Any combination of memory circuits that requires multiple outputs in a controlled layout from a module containing memory devices of any kind can be created using the described techniques.

A memory module has a particular collection of input/output connection points or pins that are defined for the particular application. In most computer applications the memory points are identified as bit O to bit N. In this disclosure we will discuss applications with bit N as 31. This is called as a 32 bit word.

The basic information element in most computer systems is the bit which has logical content of 1 or zero, of true and false. For most computer applications, the next division is byte which consists by certain standard of 8 bits capable of defining 256 characters.

Memory devices are defined by the number of eight-bit bytes, usually expressed in terms of megabyte, e.g., 4M followed by the minimum number bits that can be addressed together, e.g., 4M×4 which is often abbreviated to 4×4.

In the case of the 32 bit word, it contains 4 bytes of information and the 64 bit word contains 8 bytes. Accordingly, in order to store two million 32-bit words, one would need sixteen 1M×4 chips, or four 2M×8 chips or four 1M×16 chips. In order to allow byte addressability, most systems address a byte with a full address and a word as a systems address a byte with a full address and a word as a multiple of bytes. Most systems which work with the wider processors have the ability to address both bytes and words.

In most current systems using dynamic memory, large blocks of memory are addressed by use of the RAS signal and the individual bytes of memory are differentiated by selecting a CAS signal for each independent byte. For an 32 bit word like on a standard SIMM, there are four independent CAS signals each addressing a byte. To address a byte the controller selects the card with a RAS signal enabling all the memories in a bank and then selects all 4 CAS's. This approach creates limitation on the use of partial memories. If the whole word is accessed at one time, all the partial parts can be selected by common RAS and CAS signals, and any part can be connected to any output pin. As long as the address used to store the data corresponds to the address that retrieves the data the ordering of the bits into devices in transparent.

When the 8 consecutive bits are to be addressed by a common RAS signals but are differentiated from other chips using different CAS, the problem becomes more complex.

Most memory devices come with a minimum number of CAS controls pins. In the case of the 1×1, 4×1, 1×4, a single RAS line, and a single CAS line are used. Devices using byte addressability use patching techniques while devices that use a word address scheme can use bit steering to accomplish the assignment of bits to make a complete word.

Bit steering in its simplest form is taking known partial devices, selecting the working bits, and connecting them in order to the I/O lines. A simple example would be the connection of the three working outputs of a 1×4 chip to the first three bits of a byte, then connecting the second device with its three bit, to connect to the next 3 bits and then connecting the two bits from a third device to form a complete device.

For the simple example above, 8 wires or about twenty solder-dot connections are required to allow for all combinations of 1×3 and 1×2 devices. In such a device, the parts would be selected by the test program and the connection could be made automatically by selecting solder screens. The use of wide chips in combination is a rapid way to select enough outputs. The chip analysis program needs only to add enough chips to make sure that the number of working outputs are 32 or 64 as required. Most bit steering solutions use either direct connections, using wiring, or a specialized jumper board. The full word addressability function allows for maximum utilization of a minimum number of chips, i.e., the program only needs to select enough chips to provide the right amount of outputs. Wiring complexity and non-byte addressability impact this solution although the jumper board can solve the connection problem.

Figure 3:
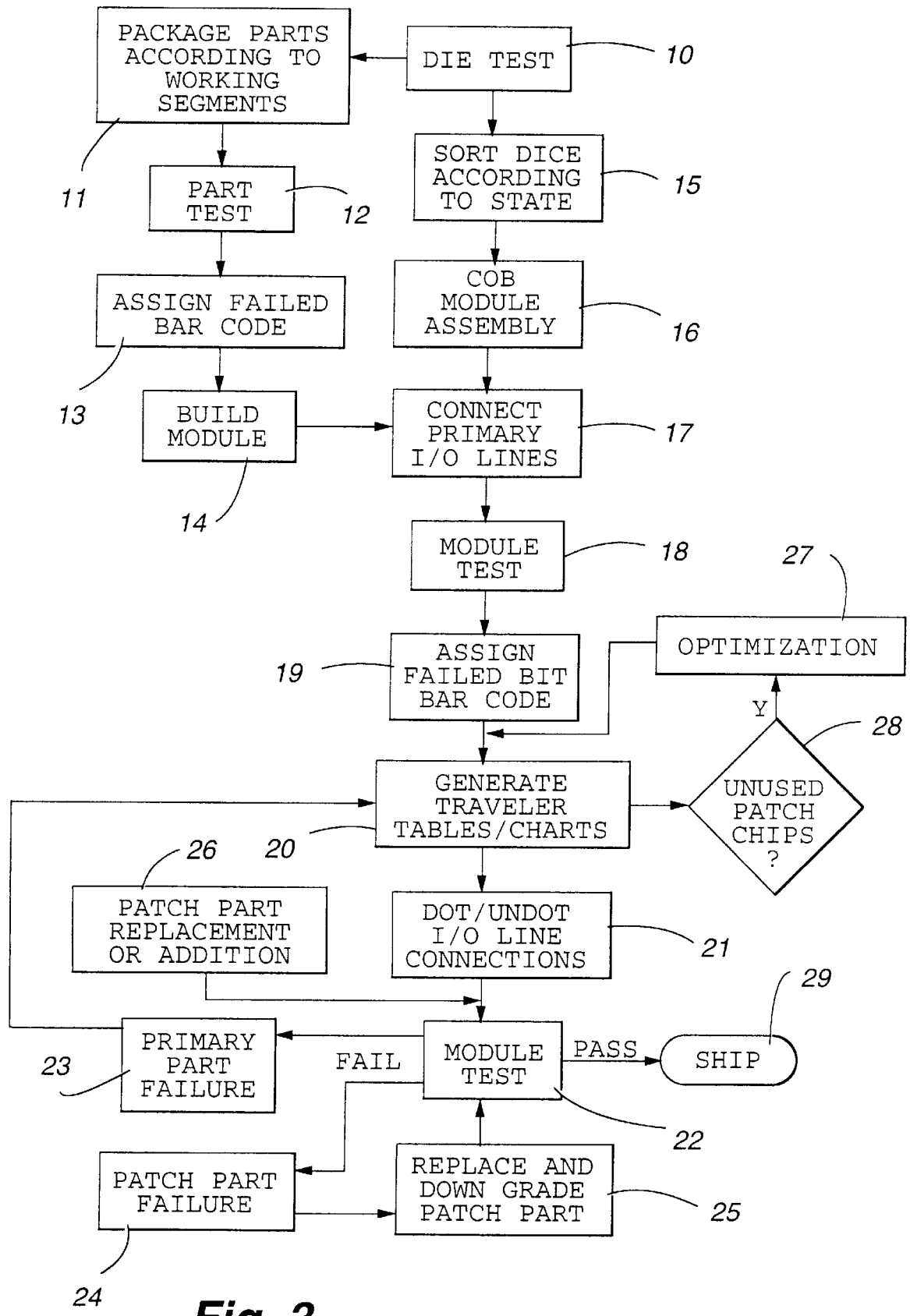
FIG. 3 a flow chart of the patching process.

Referring now to the drawings, one of the preferred embodiments of the invention will be described in connection with the assembly of two memory modules using pre-tested parts and the patching method. The basic process is illustrated in the flow chart for FIG. 3.

The concept is to separate the parts at the beginning of the process and decide how to use them most efficiently. For example, it is better economics to package the better parts one way and the more defective parts another way. If a part is known to have a high probability of not making it all the way through as a patchable 1×16, it is more efficient to package that part and use it as a patch 1×16 or as a 256×16 part.

The first step is to decide how many quadrants in a part are failing and how to best use the remaining circuit for maximum effectiveness. Usually a wafer test 10 for each memory die is conducted to determine if the part is perfect. In the past, only perfect dice were packaged, and the defective ones were rejected.

In this more economical process the test is followed by a novel packaging step 11 that assesses the possibility of using the partially defective dice. Due to the difficulty of keeping track of individual circuits, various macro sorts are done at the wafer level, from which bins of various categories of defective yet usable chips are accumulated.

Typically the sorted dice are broken into those that demonstrate specific types, numbers and concentrations of working quadrants. For instances a type is selected such that when the dice are packaged the memory part will function as one that is ¾ good i.e., which has three quarters of its I/O lines functioning. In the case of a die with 4 output, three of the 4 I/O lines will be fully functional.

Parts with more random defects are grouped into "mostly good" memory devices based on the number of quadrants that are working, and "less good" memory devices where only a few quadrants are working. Parts that are not functional because of severe damage are discarded.

As memory chip capacity increases, and particularly in the new 64 meg memory chips, e.g., a 8M×8, 4M×16 or 2M×32, salvageable segments are likely to be substantial. Additional differential categories may be used.

Once the functional status of a memory part is known, it is possible to define the type of packaging that will optimize its use. For instance, a 16 Meg chip with a single quadrant, i.e., 64 KB failure would work as a 3 out of 4, e.g., a 4×M3 part, as well as a 15 out of 16 part, e.g., a 1M×15.

At this point, a distinction must be made between thinly packaged parts, typically those holding less than one megabyte, and deeply packaged parts.

Deeper configuration parts are most often used in patching applications, and sometimes unpatched as thinner or as deeper memory configurations. In the testing for this kind of part, one must first decide if it can be used as a full memory with degraded output count. Most of the parts that pass that test will be used to patch bigger memory wide parts e.g., a 4 meg part that has 3/1 outputs working, will be used to patch three output pins of a 16 meg part with three outputs failing in a byte.

The deeper configuration chips are analyzed for the maximum working widths and the categorized as either a "wide lesser part" or a "deeper less I/O part". The decision criteria may vary depending upon the requirement of the final application. For instance, in the case of the 4 Meg part that has an ability to be either a fully functioning 256 k by 4 or a 1 meg by 1, the determination will depend upon the availability of patch parts for the bigger 256×16 applications. A table is used to reach the packaging scheme that is the most appropriate taking into account the various parameters.

As an aside, once it has been established that the parts have had a known set of failures during any time during the process, the object is to make a resultant product that is transparent to the user, both functionally and, in the preferred embodiment, visually transparent.

After testing 12, optionally every part is given 13 a bar code or some other form of identification that identifies a data base containing the quadrant test pattern for that part, and is assigned a interim value. This test data allows the production planners to make the most judicious use of a part at any time in the process.

The parts are then selected, grouped and assembled 14 on a PC board or other similar support according to the nature and location of their working segments, to provide the desired memory device. COB modules are sorted 15 and assembled 16 taking into account the results of the die test 10.

One of the main advantages of judiciously selecting and laying out pre-tested parts according to the first method is the possibility of optimizing the capacity of the memory module while at the same time limiting the amount of patching required.

The selection and layout of the parts often involve some tradeoffs. High density chips, for instance, require less parts and minimum patching. But, if the parts have a large amount of defective segments, it is more efficient to use low density ones even if more patching is required.

In the process, parts are intermixed in their assignments of bits and bytes to allow the biggest number of patching arrangements in accordance with decision tables.

This first-described decisional process is preferably accomplished automatically by computer according to programming methods well-known by those skilled in the data processing arts. Using as input earlier mentioned test data and the type and number of memory modules that must be assembled, such a computerized process can generate, not only the mapping of each module in terms of what kind of part is to be used, where they are to be mounted but also how they are to be patched together.

While, in the above-description of the pretesting and grouping processes, the terms "die", "dice", and "parts" have been used, it should be understood that the processes are similarly applicable to dice (e.g., in COB modules) as well as packages in which one or more dice have been encapsulated.

As mentioned above, there are options of patching by address and I/O. In general, thin-wide parts (e.g. 1×16) are almost always patched by using I/O mapping. Often a better patch for deeper parts is an addressed controlled patch where the I/O's are common between patch part and the part to be patched, and the selection of which part is active is determined by address mapping rather than by I/O mapping. Also possible, is the combination of low cost patch parts to map for one I/O, for example 2 partial 4×1 parts which are controlled by address mapping to patch one I/O bit from a 4/4 part.

The first method, that is the patching of assembled part I/O lines will be described next. Note that the patching techniques discussed below applies also to cases where untested parts have been mounted on the PC board, and tested together as a module, and to re-tested modules. In each case the patching is done in accordance with the latest test results.

The following discussion applies to parts which have multiple byte words. In the case of the 1×16 and 256×16 chips, we can predict that multiple failures will occur, making some combination of outputs unusable. Although the layouts of the parts make it likely that several bits in sequence will fail in the more damaged parts, in less damaged parts it is equally likely that a failure could occur on any bit.

Figure 1B:
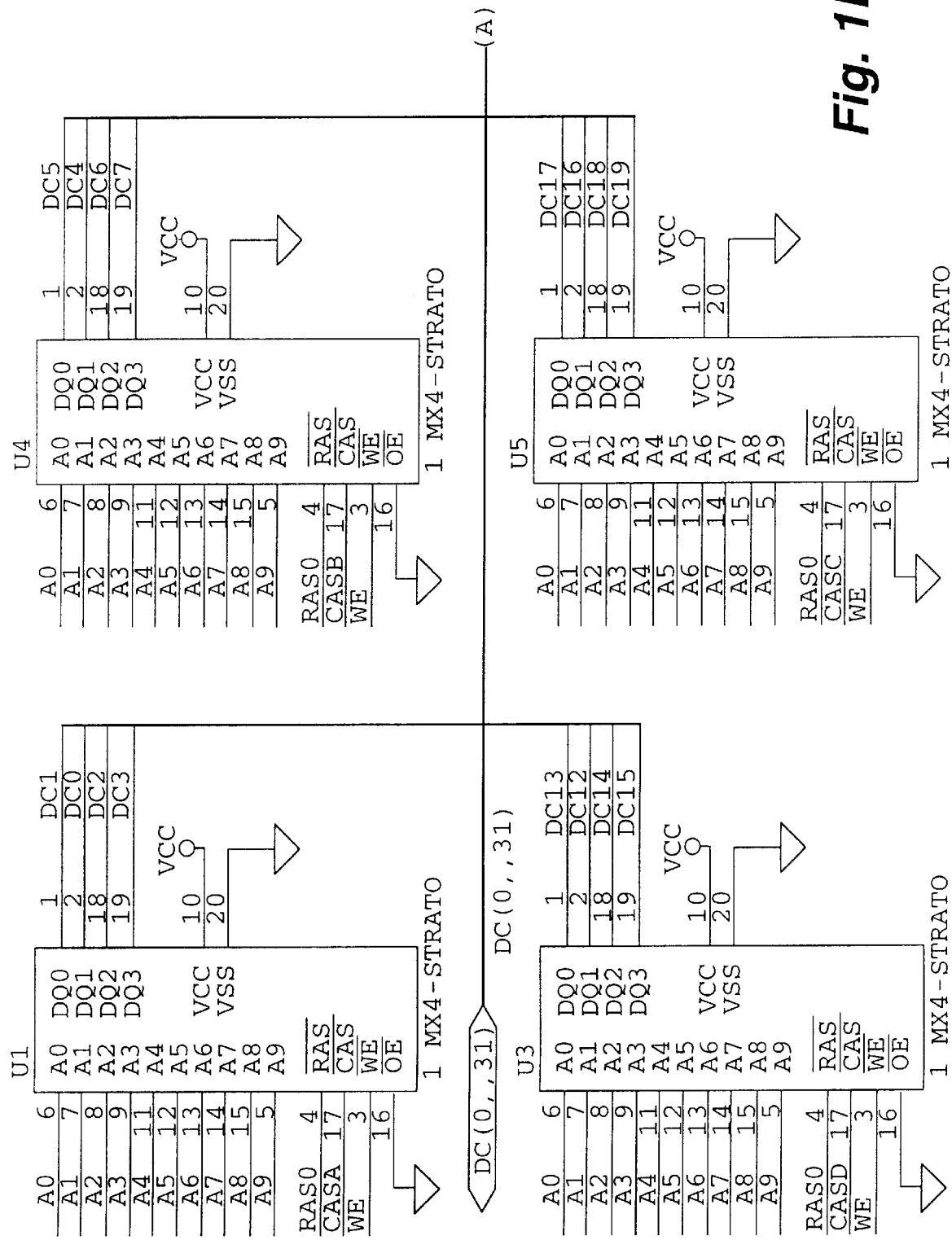
Figure 1C:
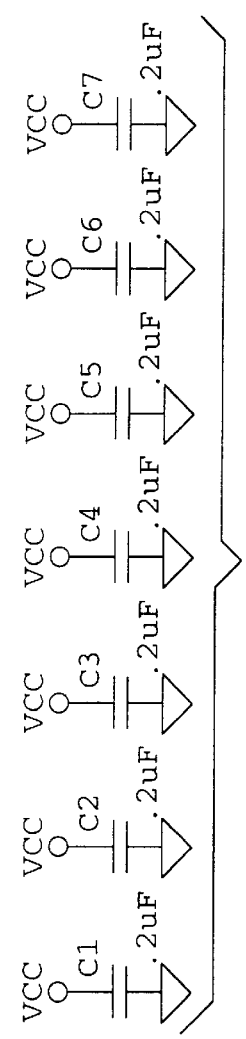
Figure 1D:
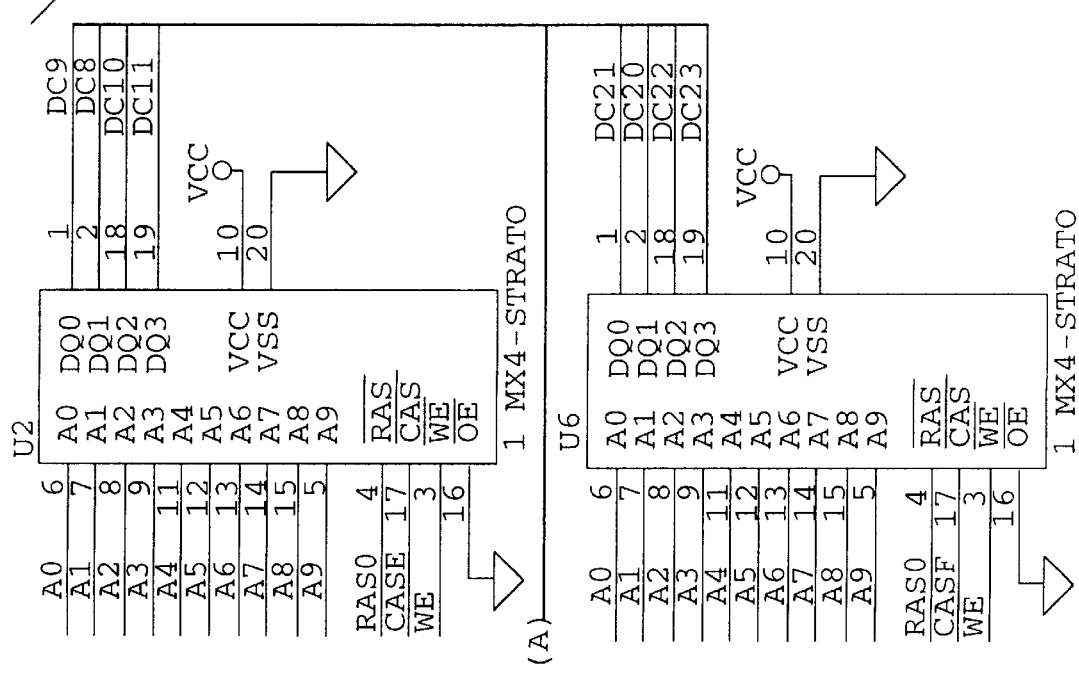
Figure 1E:
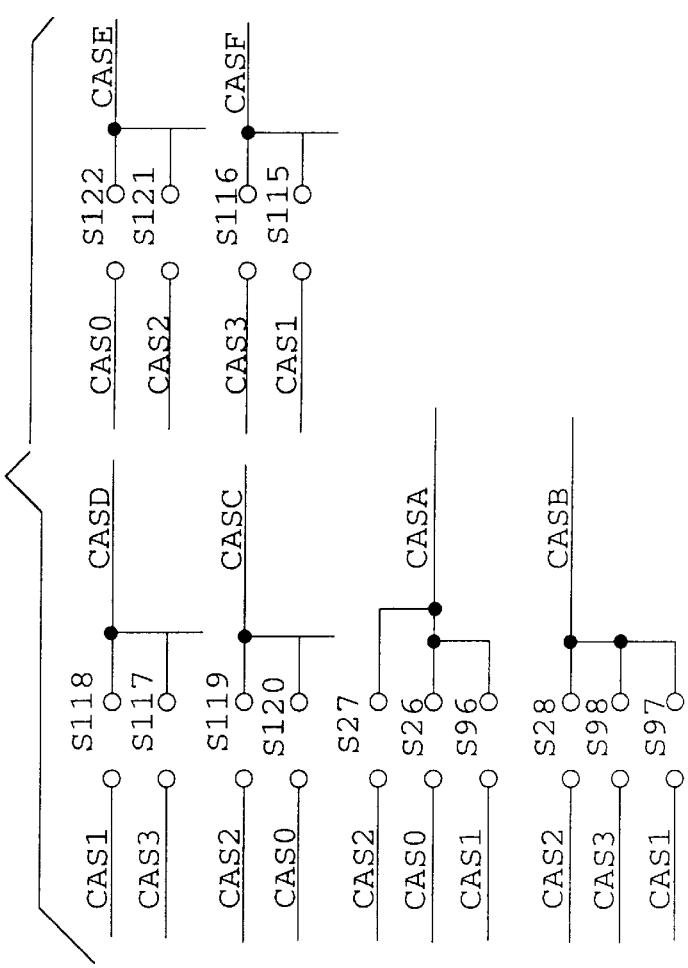
Figure 1F:
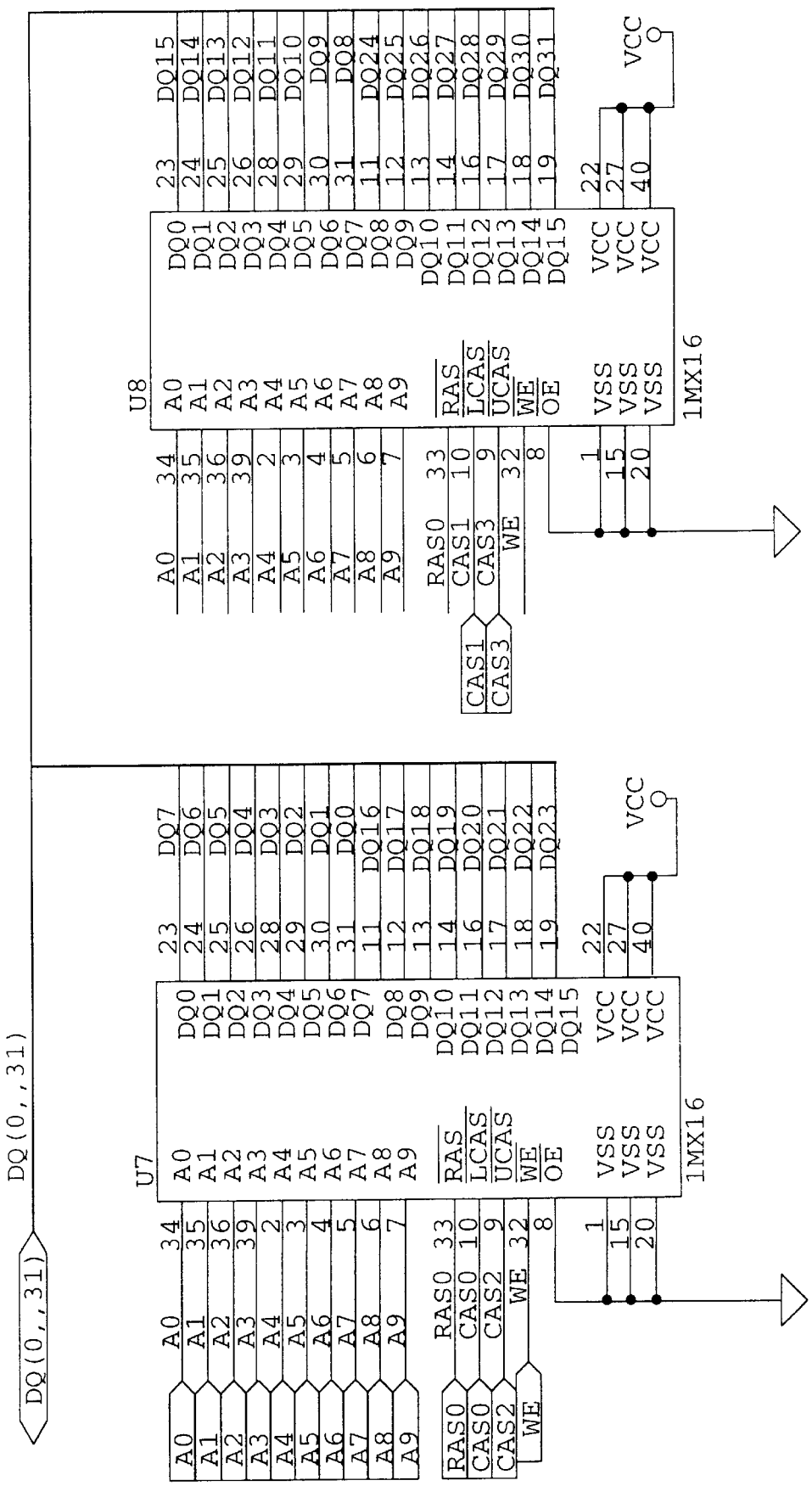
Figure 1G:
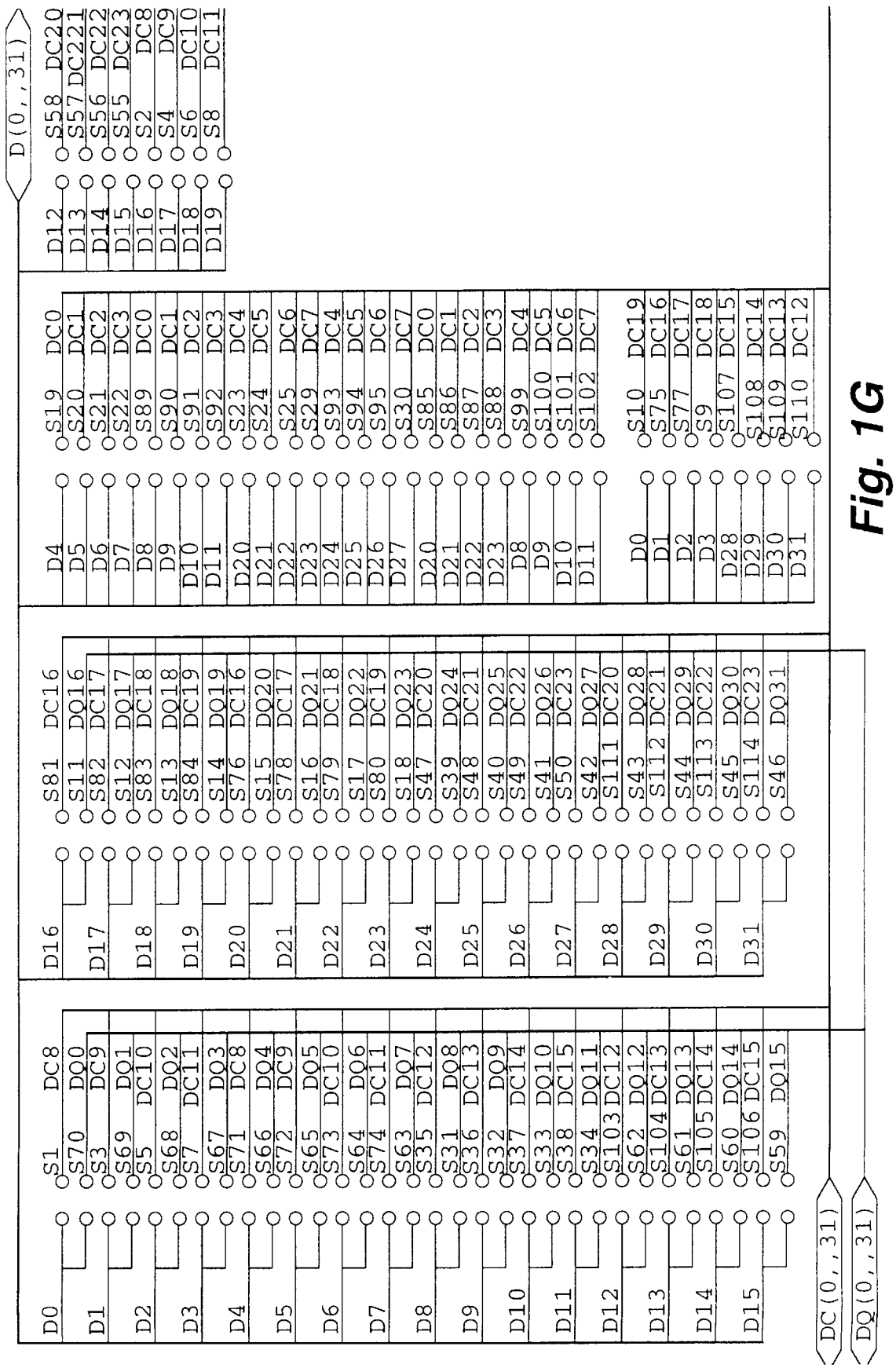

FIGS. 1a, 1b and 1c illustrate a simplified embodiment 1 of a SIMM assembled according to the invention on a PC board in which two 1M×16 memory parts U7, U8 are the primary ones, and six 1M×4 parts U1 through U6 are used as back-up. The module PC board comprises a pattern of solder-dot connections to allow any failing primary part I/O line to be replaced by another from a back-up part. The failing line is disconnected by removing the solder of its solder-dot connection, and the substitute line is connected by filling the applicable solder-dot. In other applications, this may be done by any other means that sever that line during the address cycle. A fully functioning I/O line from another part is then connected in its place. The replacement bit must have exactly the same equivalent function as the failed bit so that to the module user the substitution is transparent.

In order to meet that requirement, the patching or back-up chips or packages must have the same speed drive and input function as the primary one being disconnected. In the majority of cases, all of the bits in a particular part that are being patched with lines from a particular back-up device must have the same CAS and RAS signals.

However, some routing of the CAS signals allows patching more than one byte with a single back-up part, but once one output of a particular back-up part is used for a patch, the other bits must be used to patch the same byte. This limitation applies no matter what connection type is used. In this particular embodiment of the invention, all the data output lines of every part are brought to solder-dot locations S1–S25, S29–S50, S55–S95, and S99–S114 shown in FIG. 1c. These solder-dot locations allow for connecting bit lines from the backup parts or bit lines DO0–DO31 from the primary parts to the module I/O lines DO–D31 on the module output connector J1.

During the initial assembly of the module, all the solder-dot locations associated with the primary parts U7, U8 are filled in 17, and all the locations associated with the backup parts U1–U6 are left open so that the status of the primary parts can be tested independently of the back-up ones U1–U6.

All the primary and backup parts are enabled by the same RAS0 line. On the first 1M×16 primary part, the first byte is enabled by CAS0, the second byte by CAS2. On the second 1M×16 primary part, the first byte is enabled by CAS1, the second byte by CAS3. A series of solder-dot locations S26–S28, S96–S98, and S115–S122 as shown on FIG. 1a are used to selectively enable each of the backup parts U1–U6 with, in the case of U2, U3, U5 and U6, one out of two CAS lines, and in the case of U1 and U4, one out of three CAS lines. According to this scheme, U2 and U5 can be used to patch bits in the first and second bytes of primary chips U7 and U8. U3 and U6 can be used to patch bits in the second bytes of the primary chips U7 and U8. U1 can be used not only to patch sits in the first and second bytes of U7, but also to patch bits in the first byte of U8. Similarly, U4 can not only patch bits in the first and second bytes of U8, but also in the second byte of U7. In other words, two out of the six patch parts can be used to patch bits in three bytes of the primary parts, and four parts are available to patch two bytes. The space constraints of the PC board circuit impose some limitations upon the above-described patching combinations. A particular backup part is not always available to patch any of the bits of a particular primary part. Using the solder-dot connecting options illustrated in FIG. 1c, the first 4 bits of U7 can be patched by U2 or U5. The second 4 bits of U7 can be patched by U2 or U1. The third 4 bits of U7 can be patched by U3, U1 or U4. The fourth 4 bits of U7 can be patched by U3 or U6. The first 4 bits of U8 can be patched by U2 or U5. The second 4 bits of U8 can be patched by U1, U4 or US. The third 4 bits of U8 can be patched by U4 or U6. The fourth 4 bits of U8 can be patched by U3 or U6.

First, the module is tested 18 on a full function circuit tester using the same patterns as for a normal module. The failed bits are noted, and the module is assigned 19 a bar-code identifying these failed bits. The bar-code and/or the test results are fed into a computerized analysis system that generate the patching instructions charts, or are used during a manual patching process that relies on tables to implement the patching functions. A computer-stored chart or a printed one is assigned to each module 20 and travels with it through the patching process.

The process of defining the patching instructions includes an optimization pass. This optimization is designed to maximize the use of the smallest patch parts which have limited use, leaving the larger and more versatile parts available for patching later-discovered failures.

The process comprises looking for unused patch Chips 28 by scanning the bits of the more versatile, usually the wider parts and looking for unused substitute bits in one of the smaller parts. For instance, in a grouping of 1M×4, 1M×3 and 1M×2 parts, the 1M×4 part will be scanned first. Two or more scanning passes may be necessary to shift all the patches toward the smallest parts. The selection of substitute bits is done according to tables that reflect the status of the parts and their patching capabilities. Depending on the order of the programs and the tables used, various part optimizations can be done before building the memory module, allowing and more patch parts to be premounted. This will change the various patch tables, but will result in the use of the premounted parts first. Barring failures in any of the parts in the subsequent test processes, it becomes possible to preassign patch parts and connections and connect all the parts and patches during the initial manufacturing process.

Table I shows the various patching arrangements for each failed bit of the primary parts U7 and U8 listed under the left-hand bit columns.

For each bit that has failed in one of the primary parts and that is flagged in the BIT column, the chart shows which backup parts must be installed and which bit out of each backup part is to be used under the U columns, which solder-dot must be disconnected to isolate the failing bit in the DELETE column, which solder-dot must be filled to patch in the substitute bits in the ADD column, and finally which solder-dot location must be filled to enable the backup part with the appropriate CAS line in the CAS column.

Table I reflects the strategy of using first backup chips U2 and U3 to patch the first and second byte of U7, and backup chips U5 and U6 respectively to patch the first and second byte of U8. In other words, the backup chips that can be enabled by only two CAS lines are used first, and the more versatile backup parts U1 and U4 are used only during subsequent passes when the primary selection is not available.

In a manual implementation of the disclosed process, a chart including Table I is prepared for each memory module where the failed bits of the primary parts are flagged in the BIT column. The chart travels with the memory module to the patching station, where the operator will sequentially perform 21 the additions and deletions necessary to effectuate the patch as indicated on the sheet for each circled or checked failed bit. These additions and deletions can be made either manually or by means of automatic machinery. It should be noted that the indications of failed bits may be derived from the testing of the primary parts on board, or before those primary parts are assembled and may include known-failures discovered during the testing of individual chips at the wafer level or later on.

When the disclosed process is computerized, the patching instructions are generated based on the results of the primary and backup parts test 12 and of the optimization. These instructions are used to control the appropriate assembling machinery. Whether using a printed chart as illustrated, or a totally computerized assembly method, the patch process is physically the same. The module is tested, a decision is made about the viability of the patching scheme based on analysis of the whole board, and, if the patch is possible, the chart is prepared or the tables are used to control a production line.

The first step in the instant example is to check the first four locations on the primary part to determine how many replacement bits are required. Each bit has a corresponding match on the 1×4 patch part. The letters A–D identify the four output pins of a patch part. The algorithm selects the proper letters to patch the 0–3 bits first, keeping a record of which outputs of the backup parts are used. The next step is the assignment of the back-up part I/O pins for the rest of the byte. A failure in bits 1 and 6 in the first byte would result in the selection of pin A of backup part U2 for bit 1, and pin C for patching bit 6. The next step is to install the backup part if it is not yet mounted on the module, then give assembly instructions to connect the required patching bits to pins B and C. In this case, by instructing the operator to open solder-dot location S69 and S64, and place solder on solder-dot locations S3, S73, and S122. The latter applies CAS0 to U2.

This process is continued until a byte has either been patched or until the program discovers that the available hardware cannot perform the patch. The alternate patch locations provided by the hardware allows a certain degree of flexibility in the choice of the particular backup part. In this case, bit 01 may also be patched with bit B of U5 is bit A of U2 is not available. Table I is not limiting but is provided as one specific example of patching pattern.

It should be noted that once a particular backup part is selected and assigned to a byte, it cannot be used for patching any other byte.

However, two defective bits in one byte need not be replaced by bits of a single back-up part.

For maximum flexibility, the PC board is designed so that each patch part can reach more than one byte. Allowing patch parts to be connected provide a great deal of flexibility.

Working the way across a table of failed outputs and assigning the connections necessary to correct the outputs results in either a chosen set of patch parts and connections or an impasse when the number of patches have exceeded the number of available patch parts. In this case, one of the primary parts must be replaced by another with more working lines or another patch part added 26, and the process repeated. The success rate of patching a particular combination will be a function of the board on which they are mounted.

To take full advantage of the alternate patching modes, the decision logic is multitiered. Effectively every patch has a preferred connection as determined by the primary table. When a patch is not possible with the primary parts the process switches to a second level table. The first entry to that second table always finds a successful patch. The program then continues to assign patches from the primary table until a second problem occurs and the secondary table is again used. If the secondary table provides a patch the program continues. If, for reason of byte address preassignment or multiple pin assignment, the secondary table does not provide an executable patch, the program switches to a third level table. The use of such an algorithm results in the best distribution of patches. It usually completes the patching process using a minimum number of parts and minimum number of outputs.

After manufacturing, the module is always retested 22, then run through a high temperature stress test and an extended applications level test with a high number of patterns and application simulations.

If at any time during the process a failure 23 in any primary part of the module is detected, it is isolated to a bit location and the above-process is used to correct the defect. If failure occurs 24 in a patching part, that part is removed 25 from the board and bar-coded as a next lower level part for future use. For example, an originally all good part would be degraded to a ¾ before being reused. The patch part is replaced and the test process restarted 22. If the failure occurs in a large part, a replacement bit is chosen from the same tables using the same logic, if possible. This results either in a new 1×1 being added, or an existing patch part being removed and a higher grade patch part being substituted for it. The effect of failure in a secondary test is handled the same as one occurring in the initial test. Modules that pass 25 the test are readied for shipment.

The above process is very comparatively advantaged with respect to typical chip testing because more patterns can be run. Typical testing procedures demonstrate single bit failures. However, often times the fail is a cell interactivity, meaning the fail effects another cell on the part. The only way to determine this is to run an often pattern test.

Figure 2A:
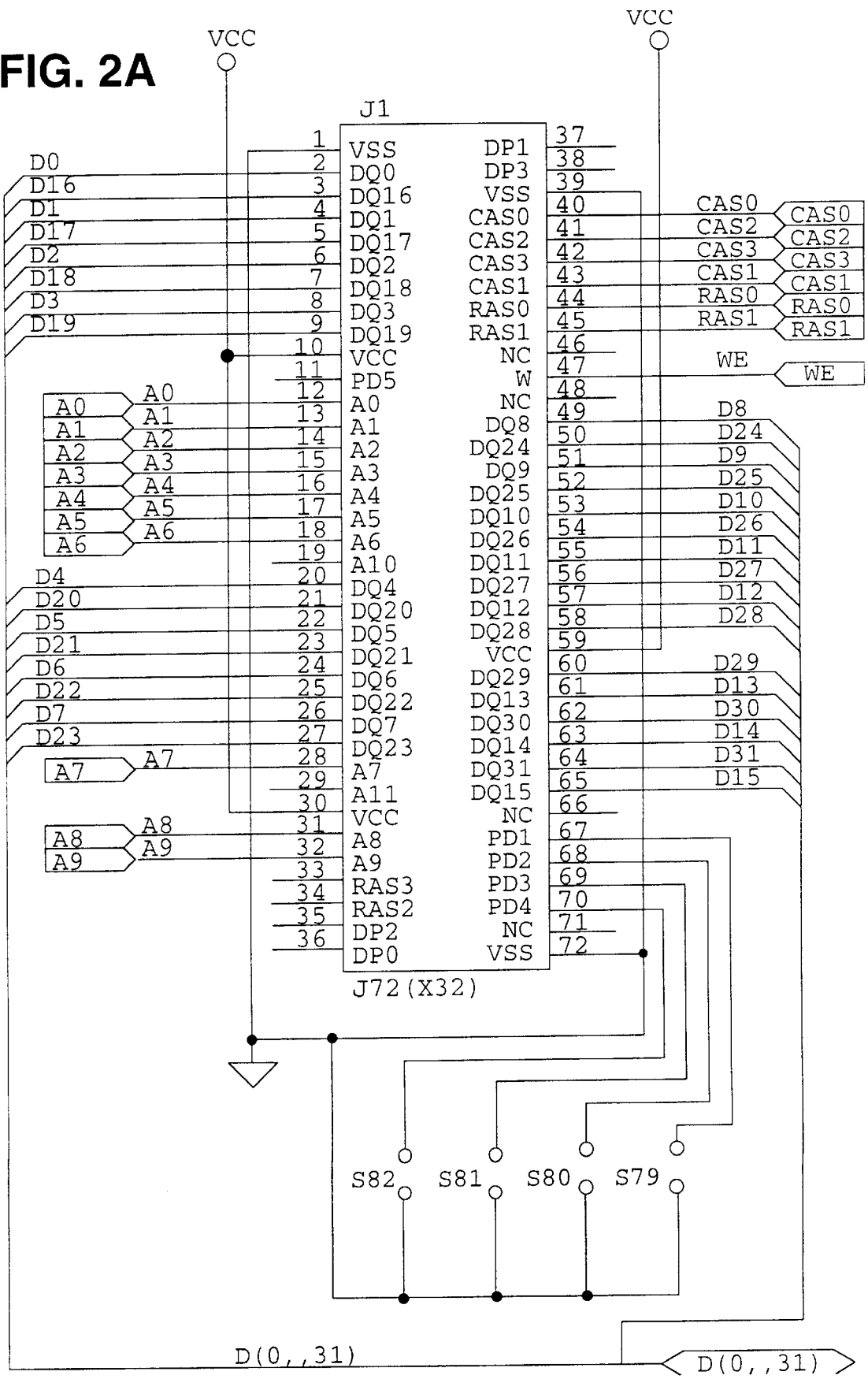
FIGS. 2A–2N are circuit diagram of a second memory module manufactured according to the invention.
Figure 2B:
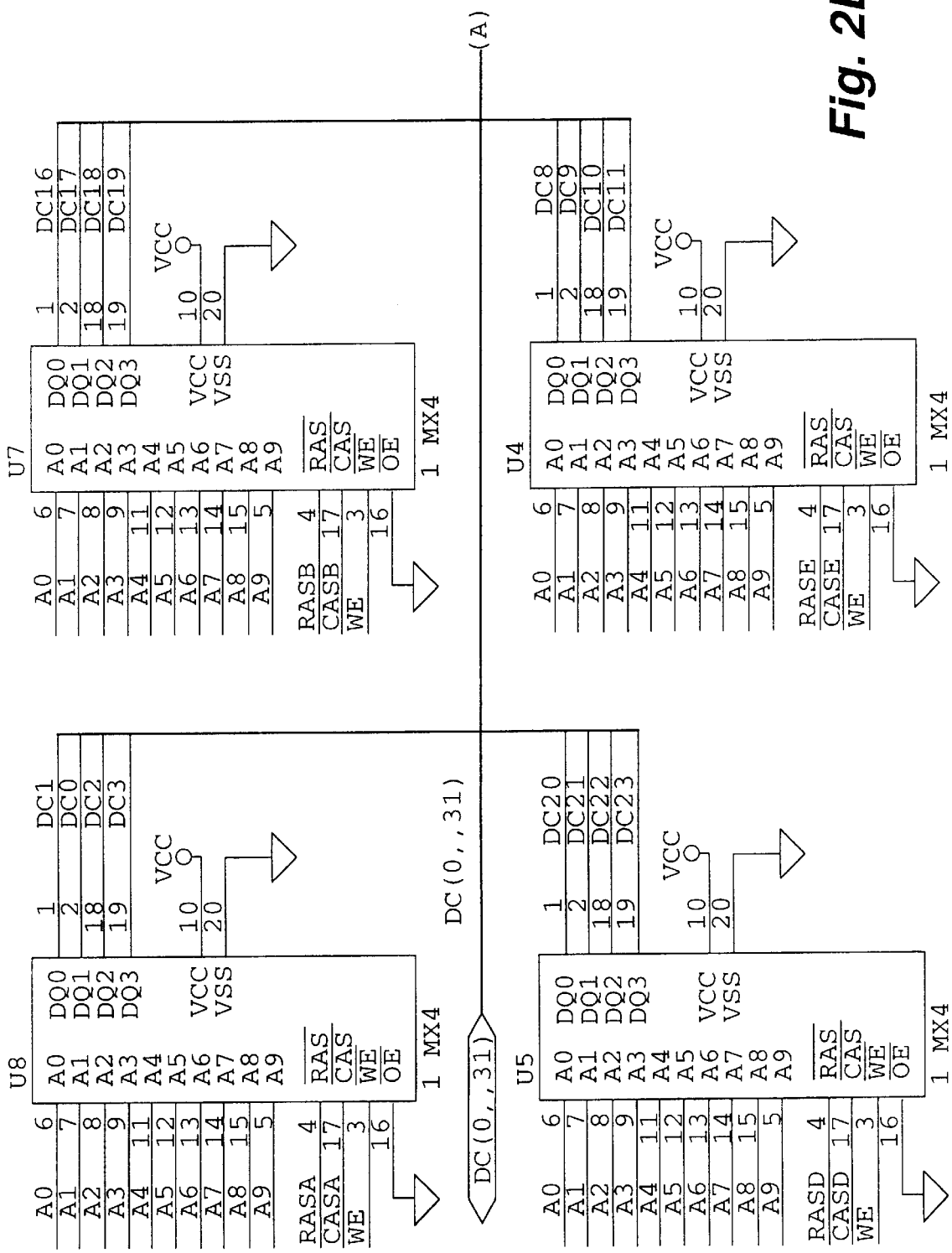
Figure 2C:
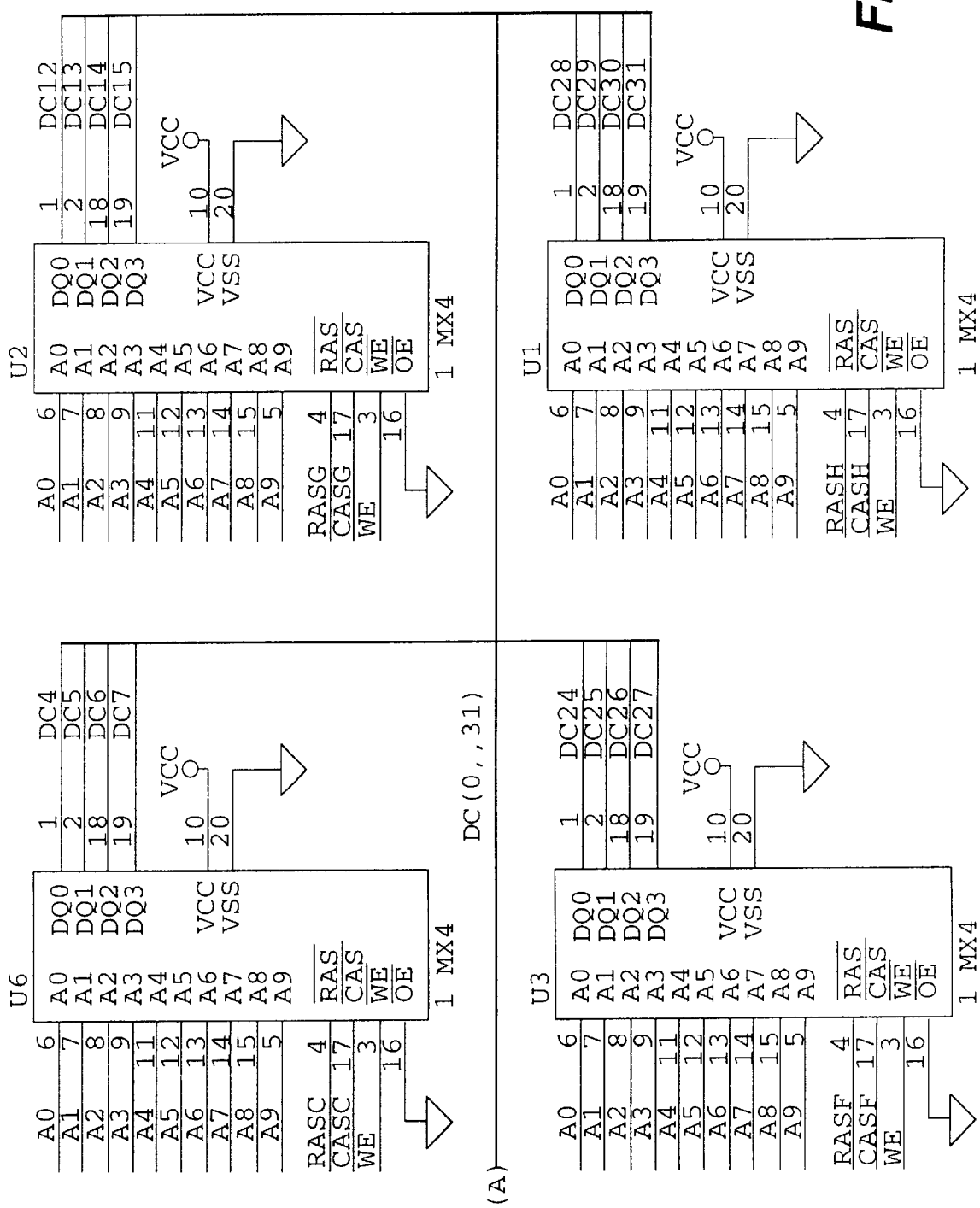
Figure 2D:
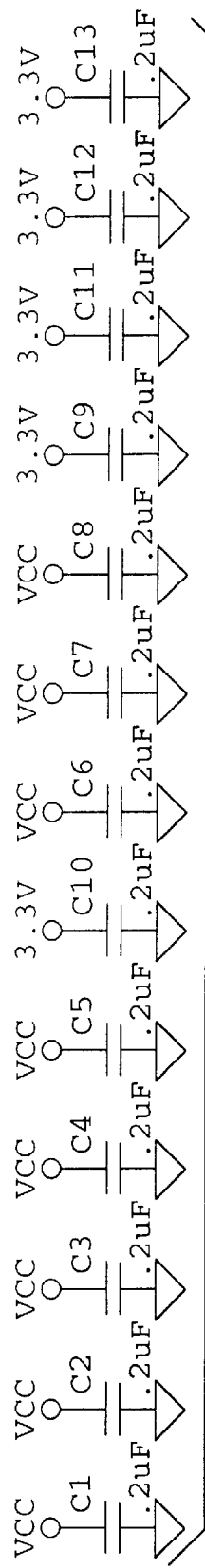
Figure 2E:
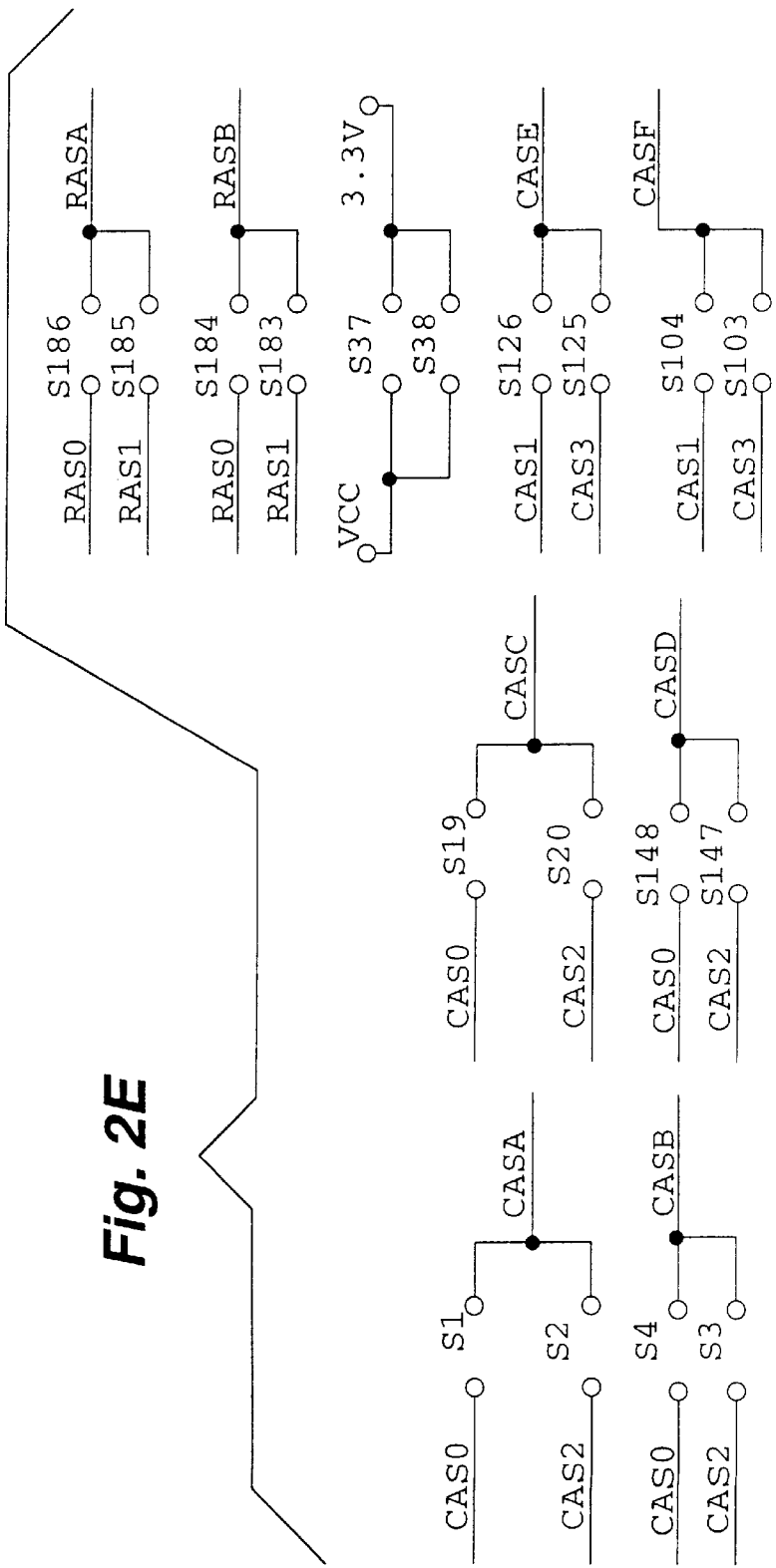
Figure 2G:
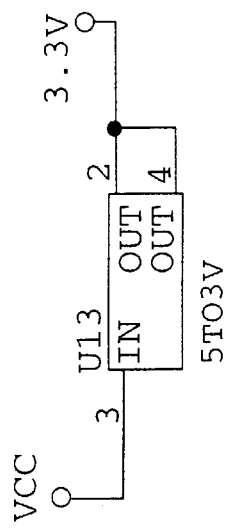
Figure 2H:
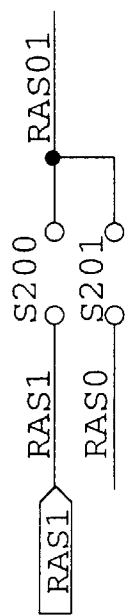
Figure 2F:
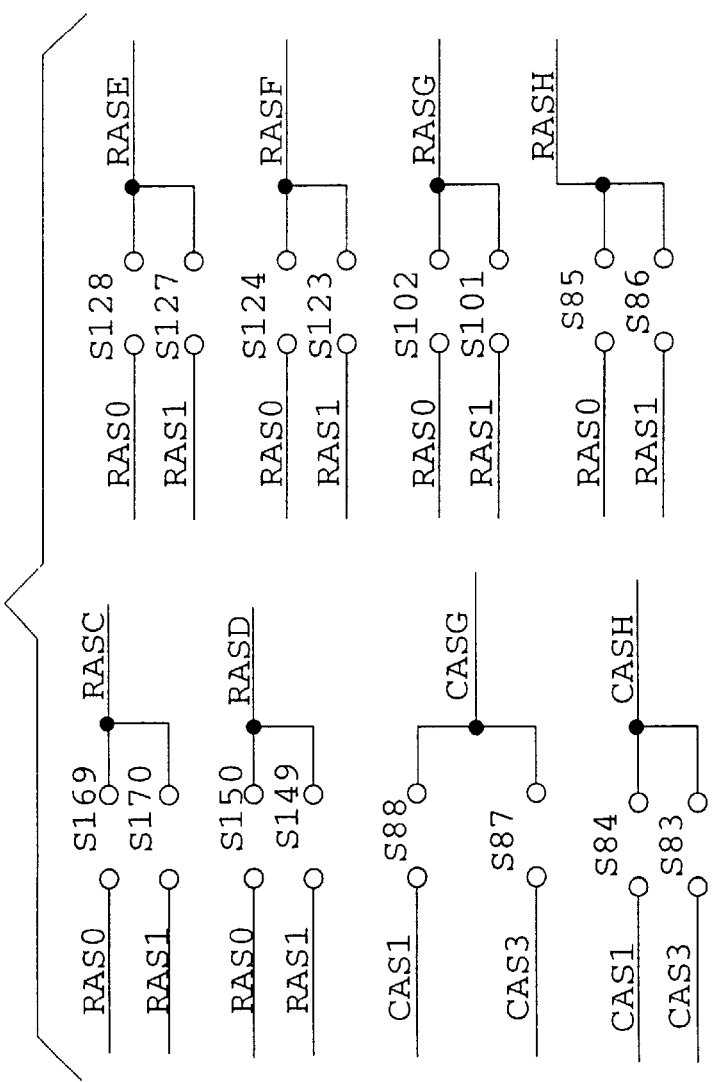
Figure 2K:
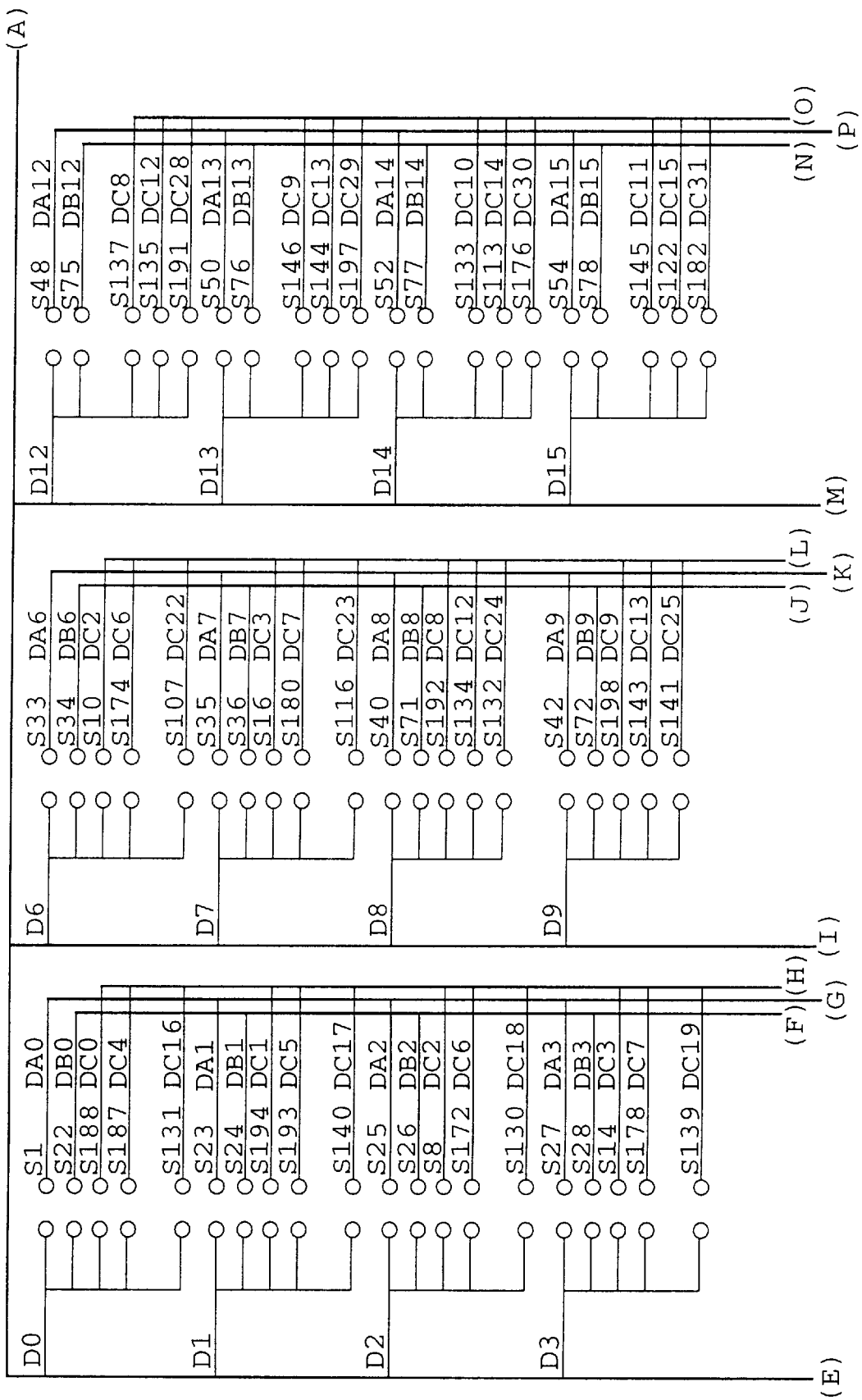
Figure 2L:
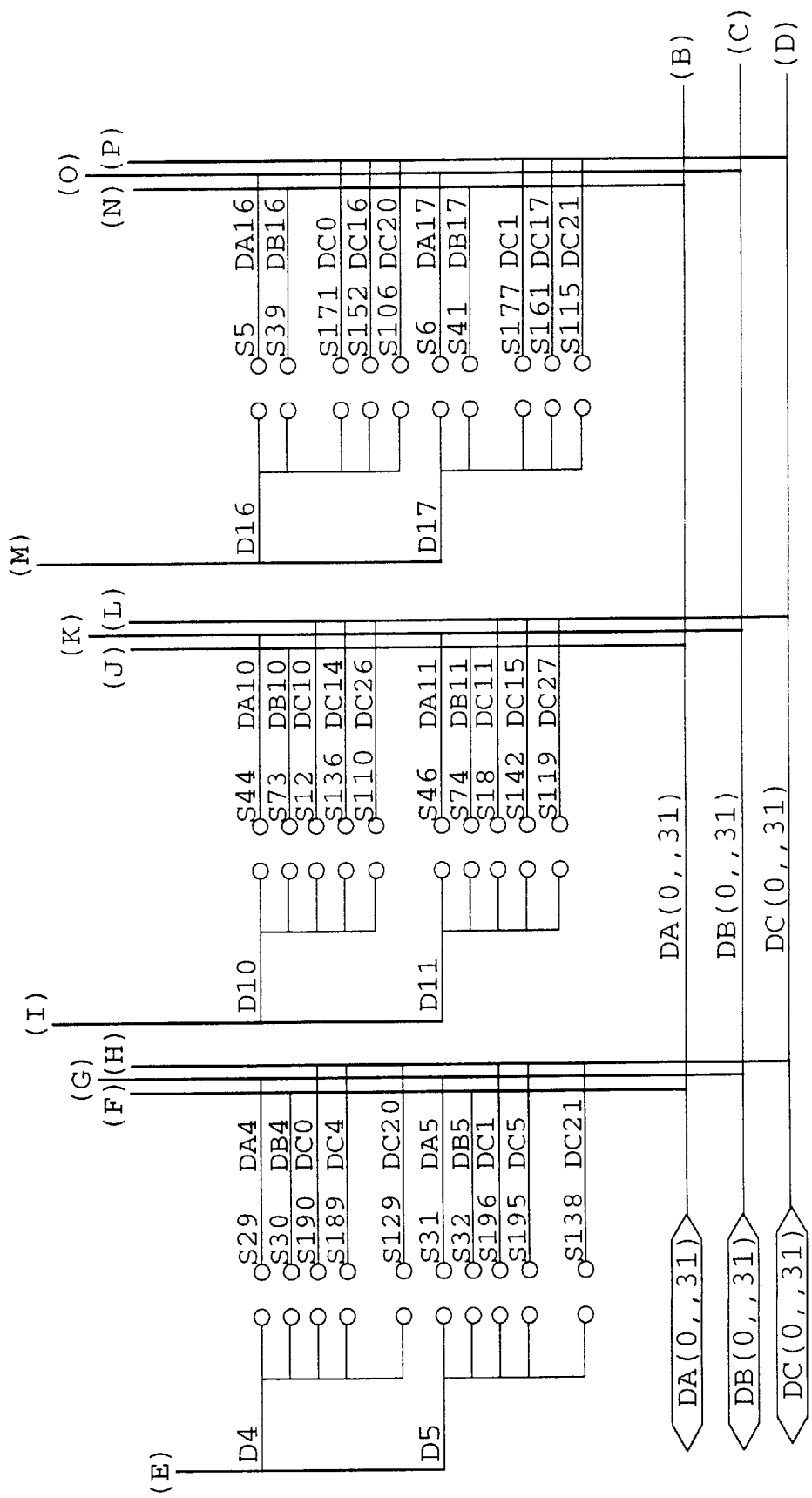
Figure 2M:
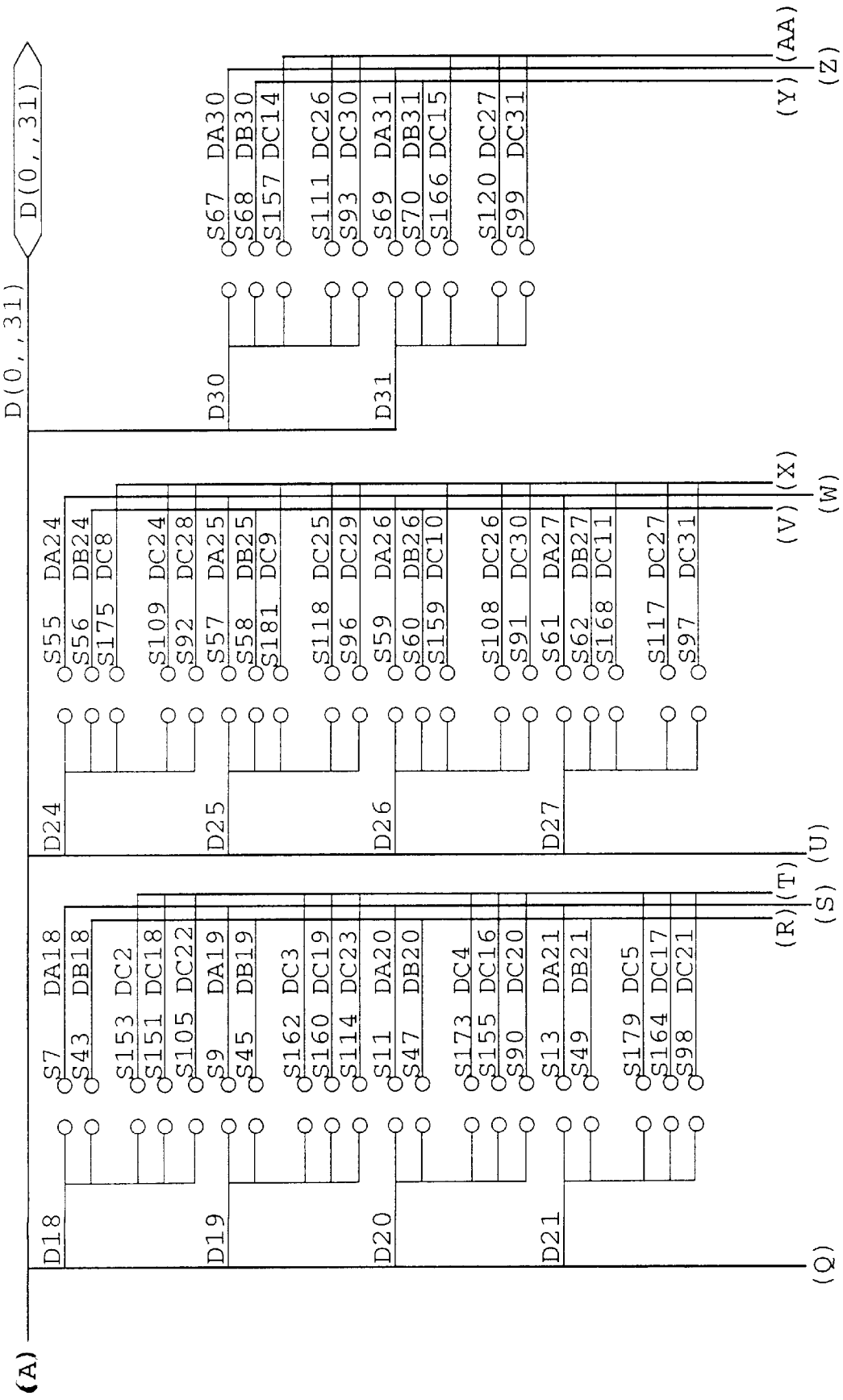
Figure 2N:
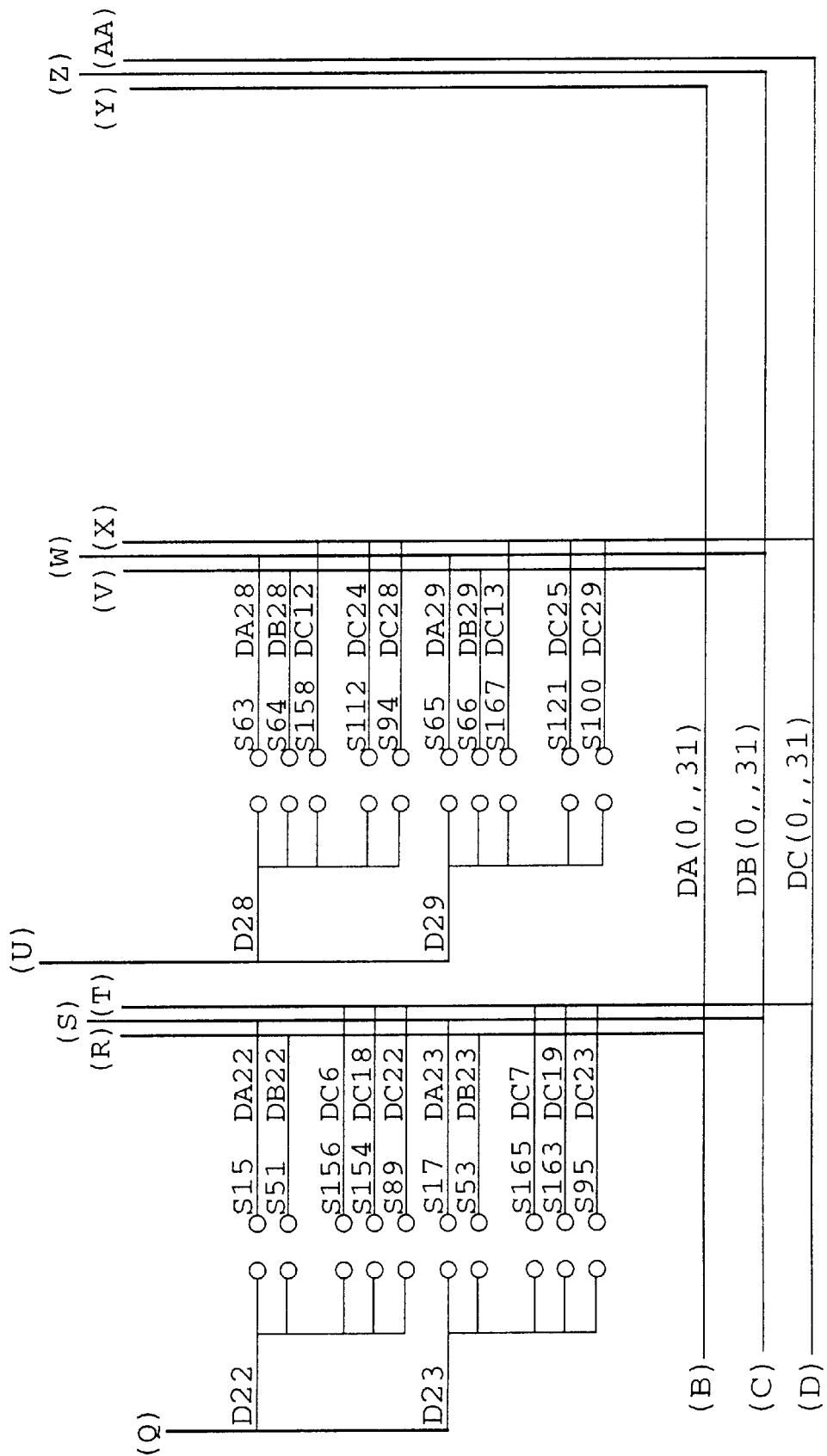

FIGS. 2a, 2b and 2c disclose the schematic of a 2M×32 memory module embodying an expanded embodiment of the patching process and hardware. The primary parts consist of four 1M×16 packages U9–U12. I/O lines are grouped in each pair U9, U10 and U11, U12. Each part in said pairs is addressed by a separate RAS0 or RAS1 signal. In other words, when RAS0 is selected bits 0–7 and bits 16–23 are provided by U9, and bits 8–15 and bits 24–32 are provided by U11.

It should be noted that as the computer selects sequentially by means of the RAS lines, each pair of primary parts and their associated backup parts, their I/O lines appear to be connected to two separate 1M×32 modules mounted in different slots.

The backup parts consist of eight 1M×4 packages U1–U8. Each package can be alternately enabled by RAS0 or RAS1. Primary parts U9 and U10 as well as backup parts U5–U8 can be enabled by CAS0 and CAS2. Primary parts U11 and U12 as well as backup parts U1–U4 can only be enabled by CAS1 and CAS3. Accordingly, each bit in a primary part could be patched by a bit from either one of four backup parts. However, board size constraints limit the patching options to a choice between three backup sources.

The solder-dot connections shown in FIG. 2c provide for any I/O line to be connected to their corresponding bit in either part of a pair of primary parts or to either one of three backup parts. For example, I/O line D0 may be connected to bit 7 of U9 or bit U10 or U8 as well as to backup bits O of U4, or bit 1 or U7 or U8. Similarly, I/O line D16 can be connected to either bit 8 or U9 or bit 7 of U10, or patched with bit O of either U2, U5 or U6. It should also be noted that pairs of backup parts controlled by different CAS lines are available to supply more than one set of I/O lines by replacing different primary parts segments. For instance, U4 and U8 can be used to supply either I/O lines D0–D3, D8–D11 or D12–D15 by replacing either bits out of U9 or U10, or bits out of U11 or U12. As in previous embodiments, a automatic computer-driven, or a manual, table-guided testing and patching procedures can be implemented. This second embodiment of the invention represents a trade-off or compromise dictated by the hardware limitations that provides higher density but slightly-reduced patching flexibility.

Multiple paths are possible using the same basic structure. Table II lists the patching combinations available in connection with the second embodiment of FIGS. 2a, 2b and 2c. It is laid out in the same format, and is to be used in the same manners as Table I. It should be noted that each I/O line byte may be connected to either of a pair of primary parts, thus reflecting the interchangeability of U9 with U10, and U11 and U12, subject to appropriate re-routing of the CAS and RAS lines. This feature offers an additional configuration option to get around a patching impasse. In the event the patching process runs into an inextricable impasse such as the unavailability of a patching line resulting from a failure in a patching part or total exhaustion of patching bits, then the entire process may be restarted after cross-switching all the RAS and CAS lines between the two pairs of primary parts as well as between their associated set U1–U4 and U5–U8 of backup parts.

Figure 4A:
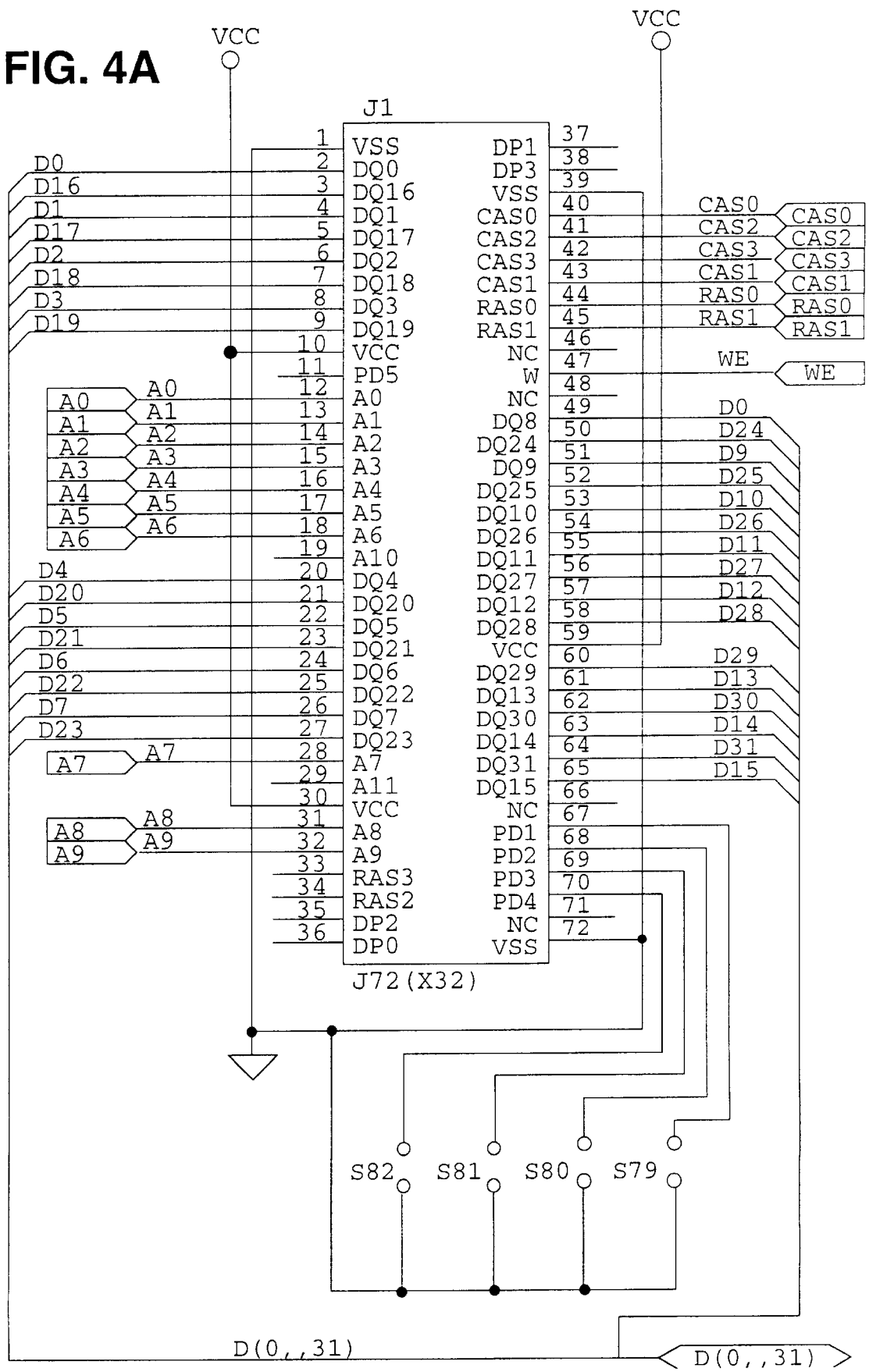
Figure 4B:
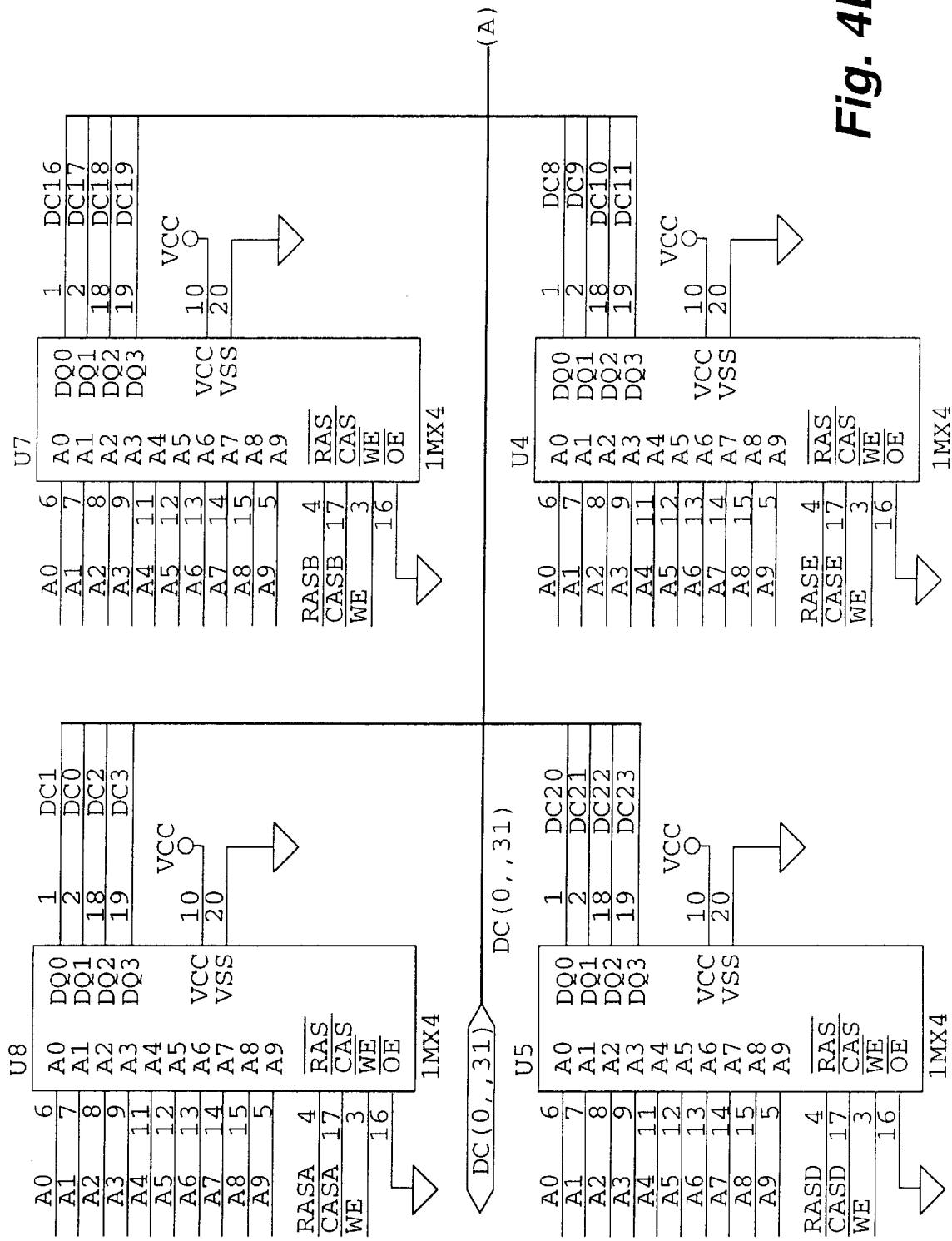
Figure 4C:
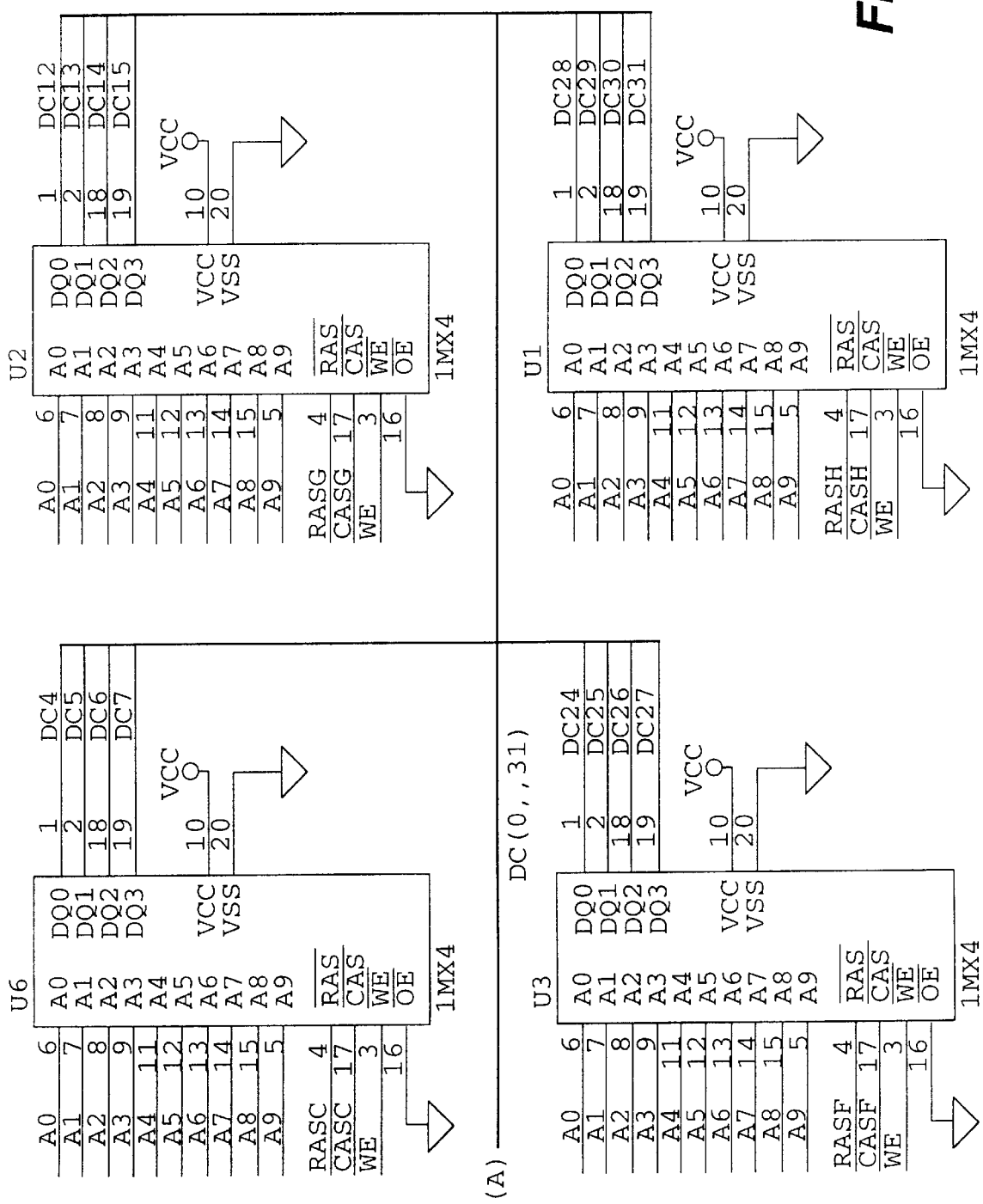
Figure 4D:
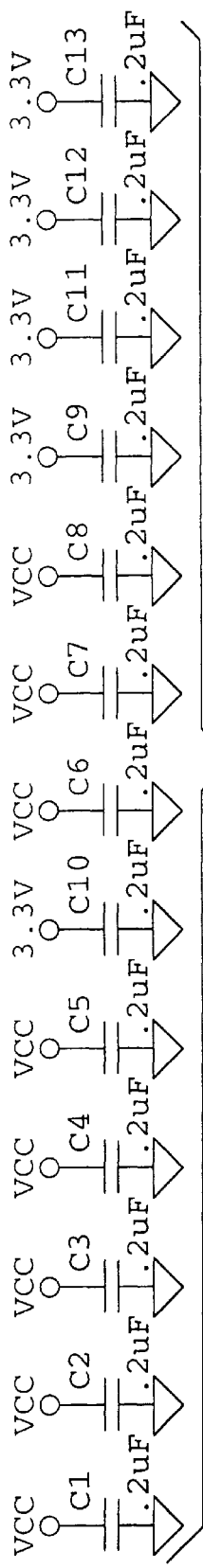
Figure 4E:
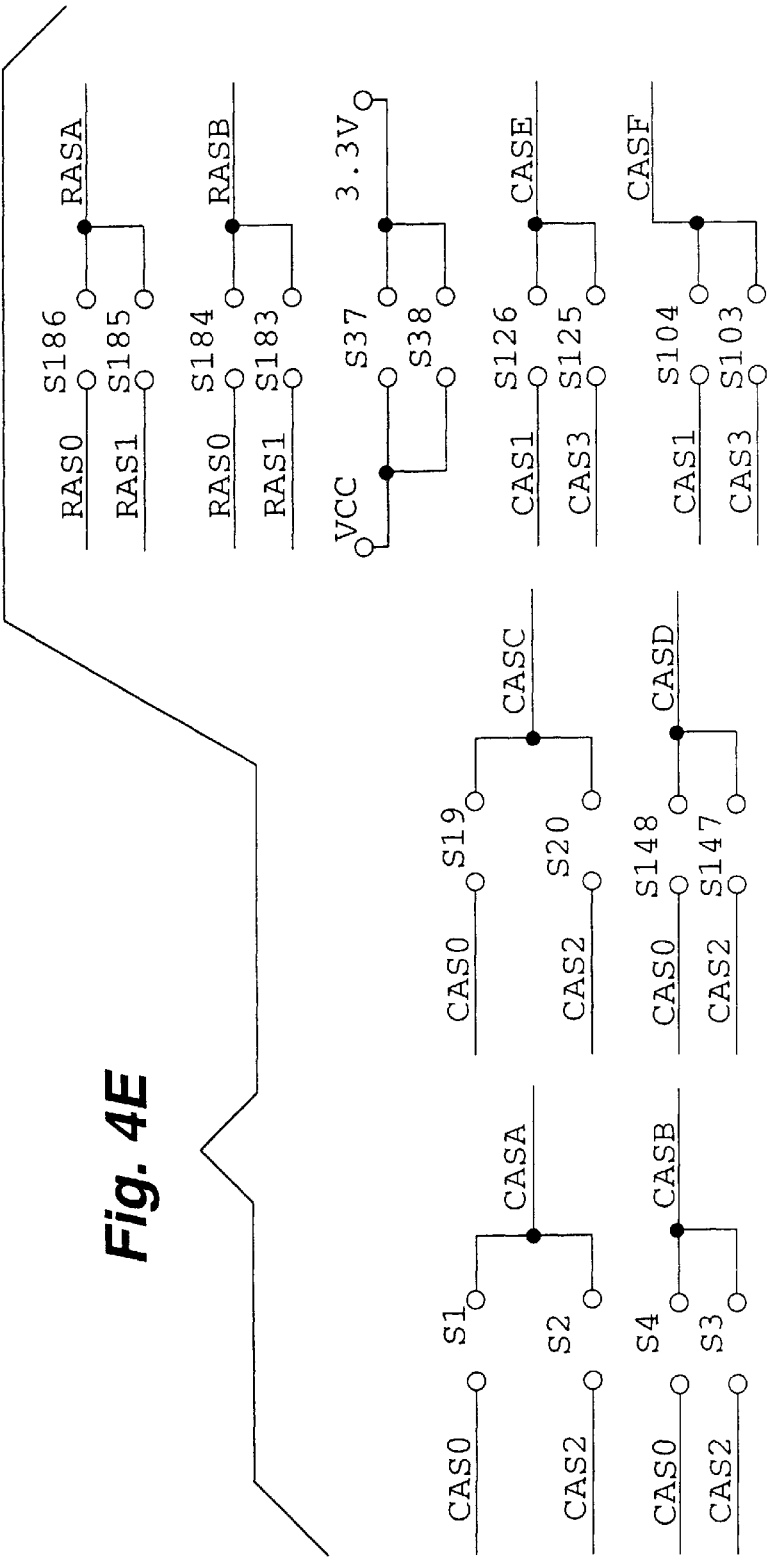
Figure 4J:
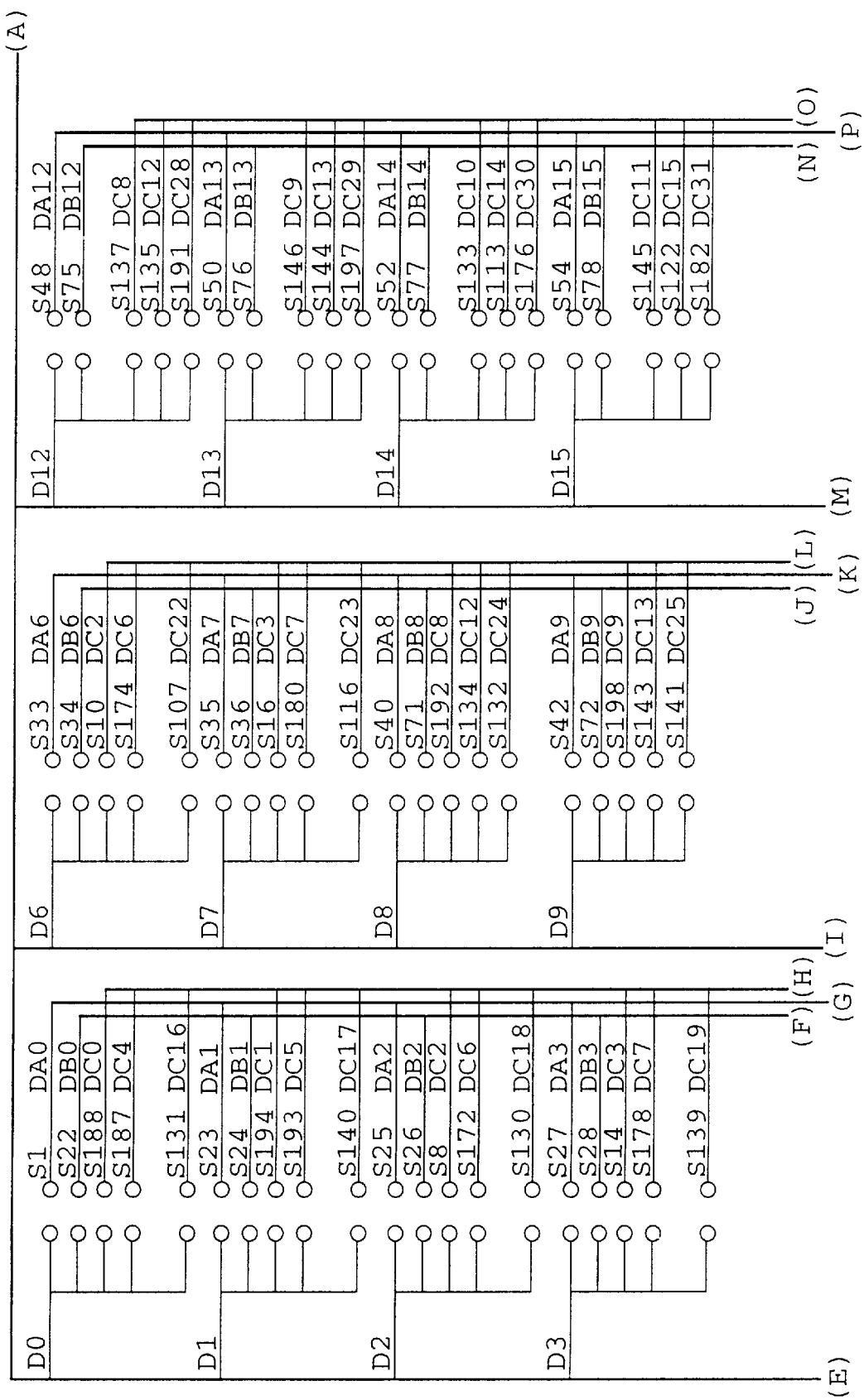
Figure 4K:
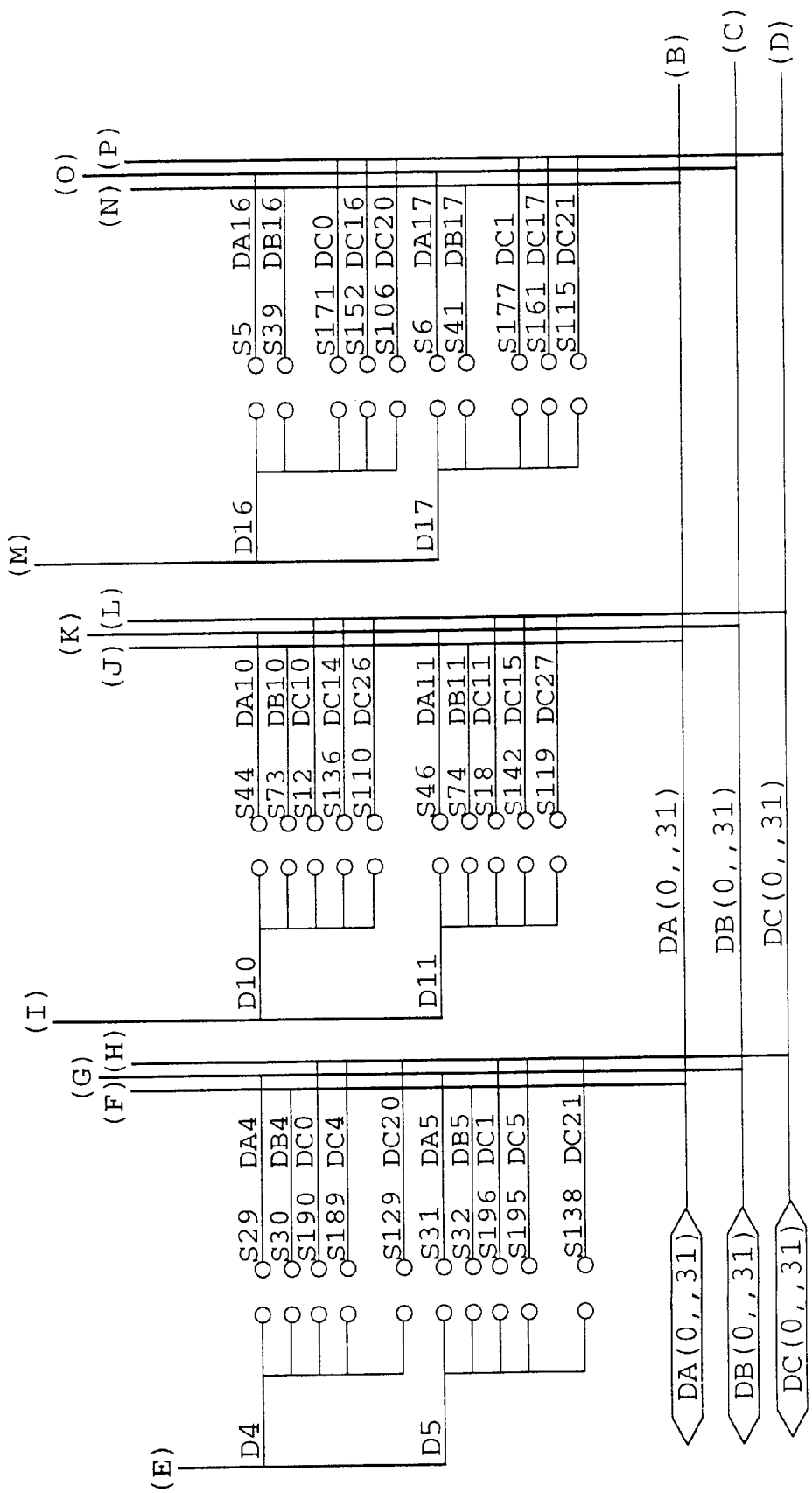
Figure 4L:
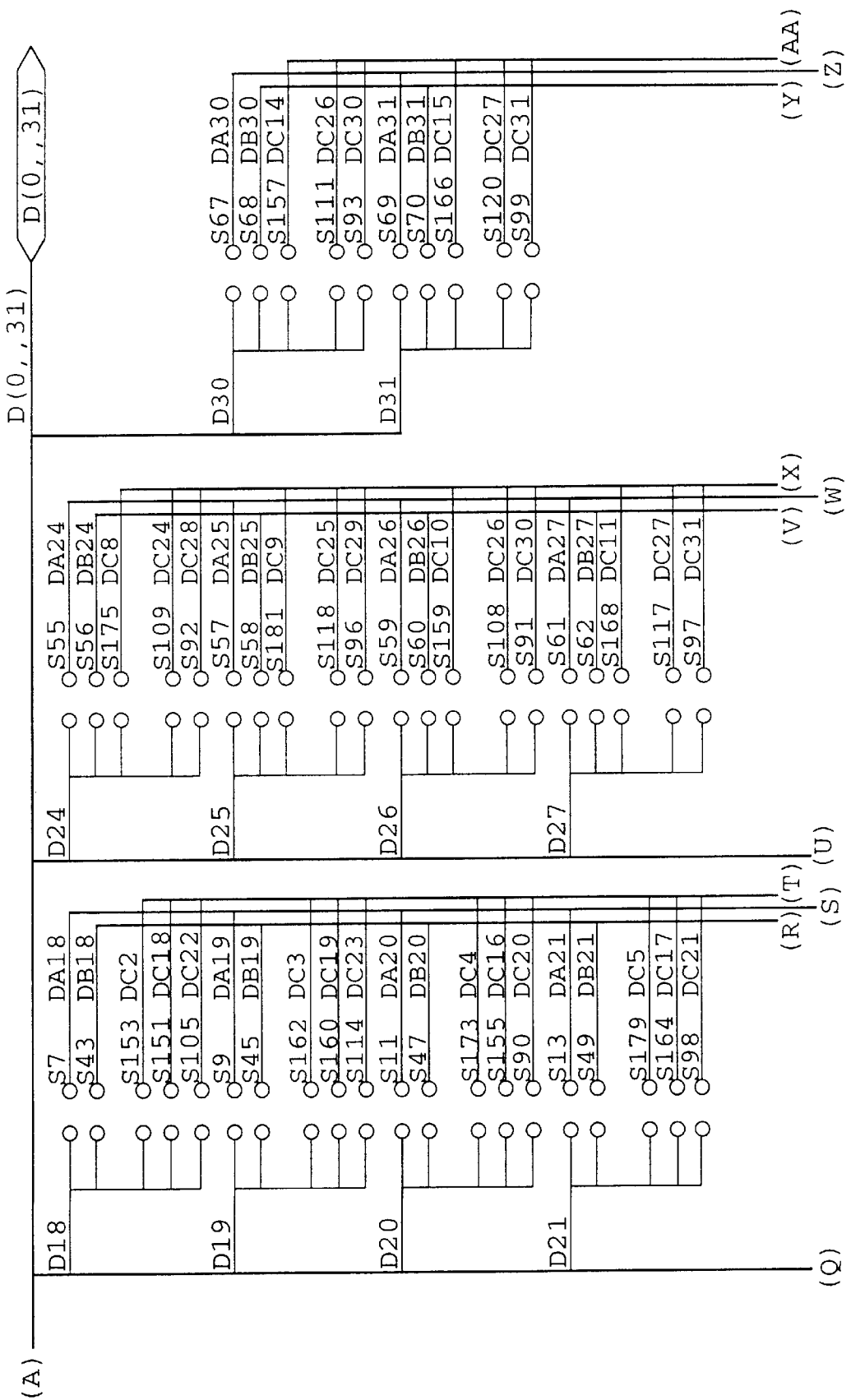
Figure 4M:
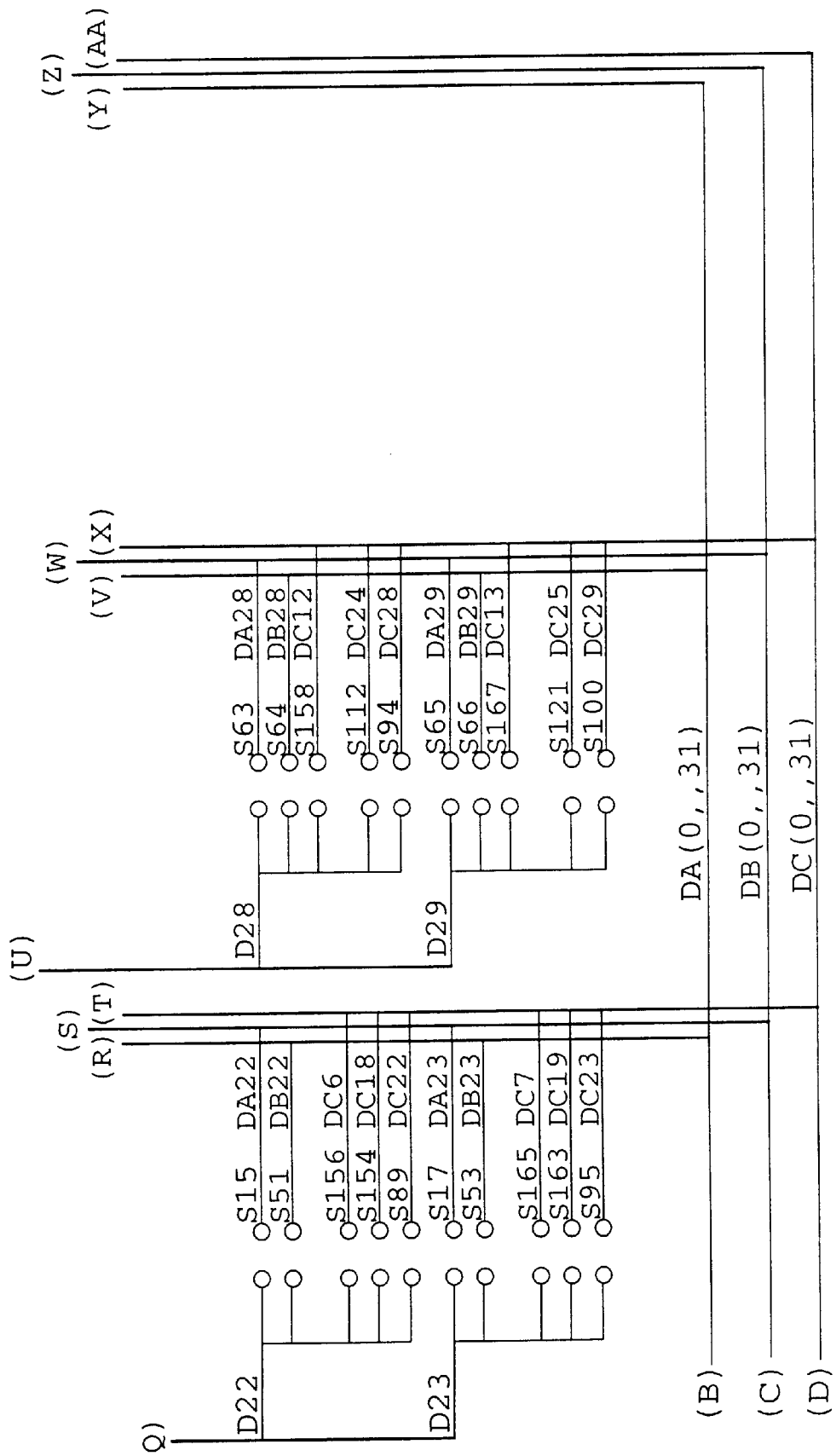

FIGS. 4a, 4b and 4c illustrate another embodiment of the invention using COB technology.

The COB technology is very useful for building modules with partial memories, particularly where the density of the chips is high vs. the application. A 1×32 SIMM requires only two COB devices, a 2×32 SIMM or a 256×64 VGA card only requires 4 devices to be mounted COB.

In these small chip count configurations, the benefit of the small amount of the total footprint of the module being devoted to the large parts, allows a module to contain more patch parts and a higher density of correction circuits than does a packaged part.

The process for doing COB is to carefully select at the die level, combinations of chips which will have a very high probability of being patched successfully. This is done by an analysis of the total fails and the distribution of fails projected at the die level. The economics of the process favor the use of 4 chips per module for 1×16s. Although there are other possibilities, it is likely that patches for some modules will consists of 8 or 10 patch chips with potential sizes up to one by four each. This yields a decision tree requiring that initial chip projected failure counts be under 30 for four chips. This is not a major limitation as many parts show a normal distribution of failures in the 3–4 range making the probability of 4 devices having more than 20 unlikely.

Mixing of parts with high failure rates and some low failure rates will normally give good results. The layouts for COB parts will have to contain additional patching arrangements. For packaged parts, if a combination of parts on a module is not patchable, one device is removed and a different device substituted, allowing the patches to be made. For COB parts that would involve the loss of the part removed so more combinations of patches are implemented, mostly taking advantage of the extra space available because of the use of COB. Under all circumstances, the process consists of testing and sorting at the die level according to a series of criteria and then mounting the better devices on a 4 chip board and lesser value chips on 2 chip boards. Once assembled, the devices are protected by a plastic overcoating and the module tested using a fully functional chip test applied at the module pins. The failing pins are noted and the corrective techniques detailed in section 5 are applied to patch the module to working conditions.

It should be noted that this technique is the only viable solution for using byte addressing partials in a COB application.

In some cases it may be necessary or advantageous to degrade the capacity of a memory module that cannot be patched to maintain its originally rated capacity. For example, in a module grouping four 1M×16 parts in a 2M×32 configuration, two of the primary parts may be used as patching parts. The module is then degraded to a 1M×32. This option is available on the module illustrated in FIG. 2.

Figure 5A:
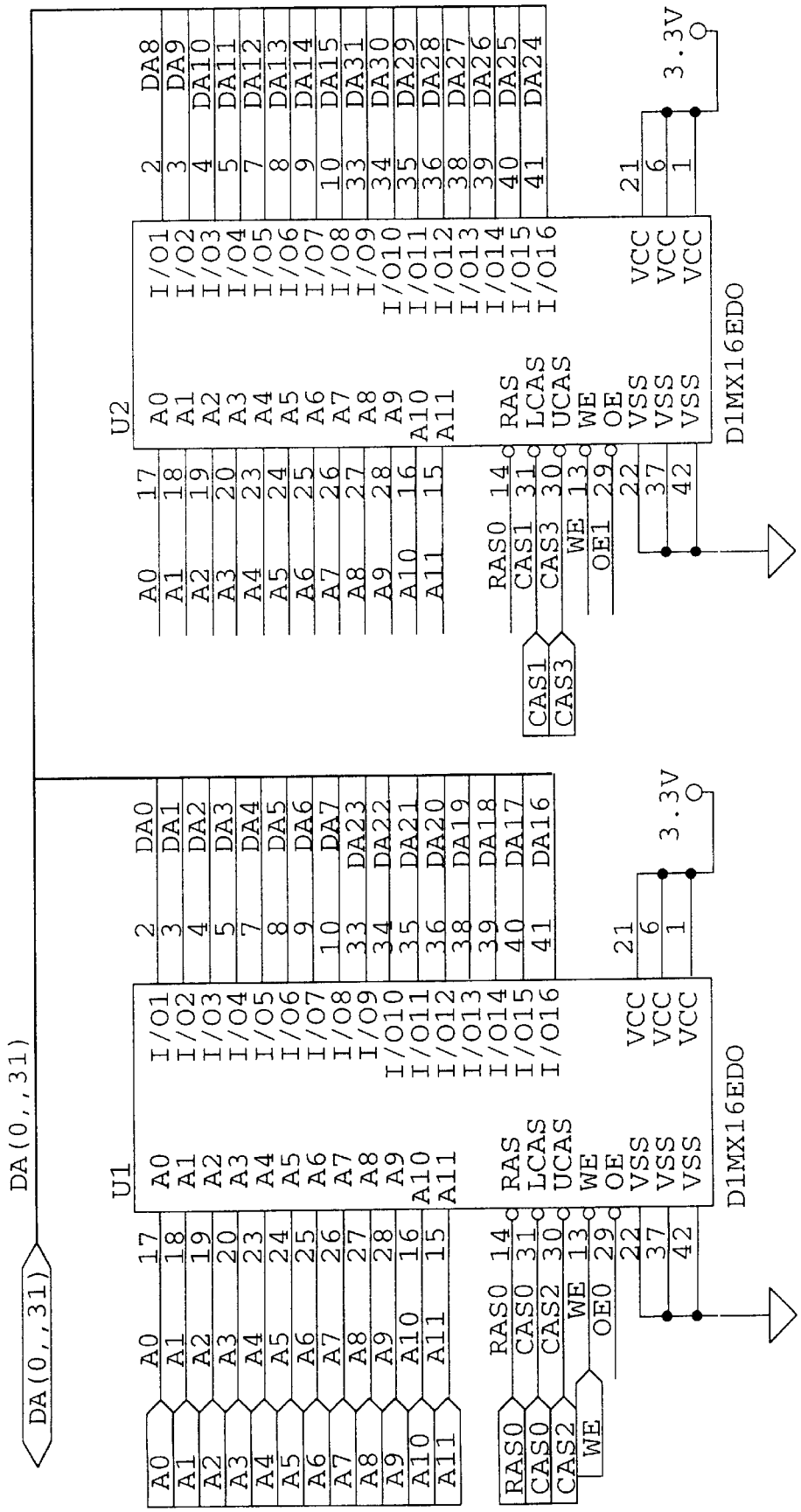
Figure 5B:
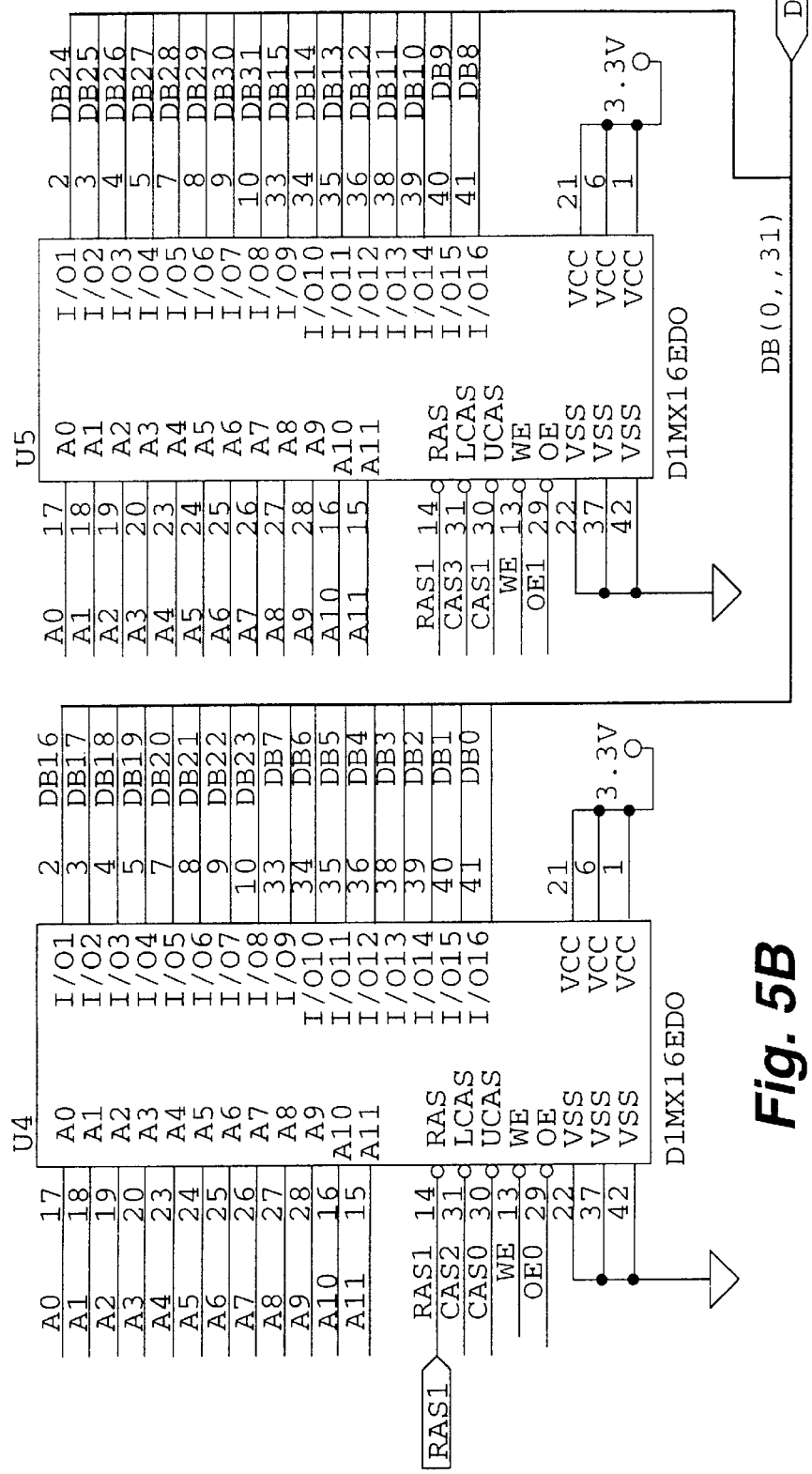
Figure 5H:
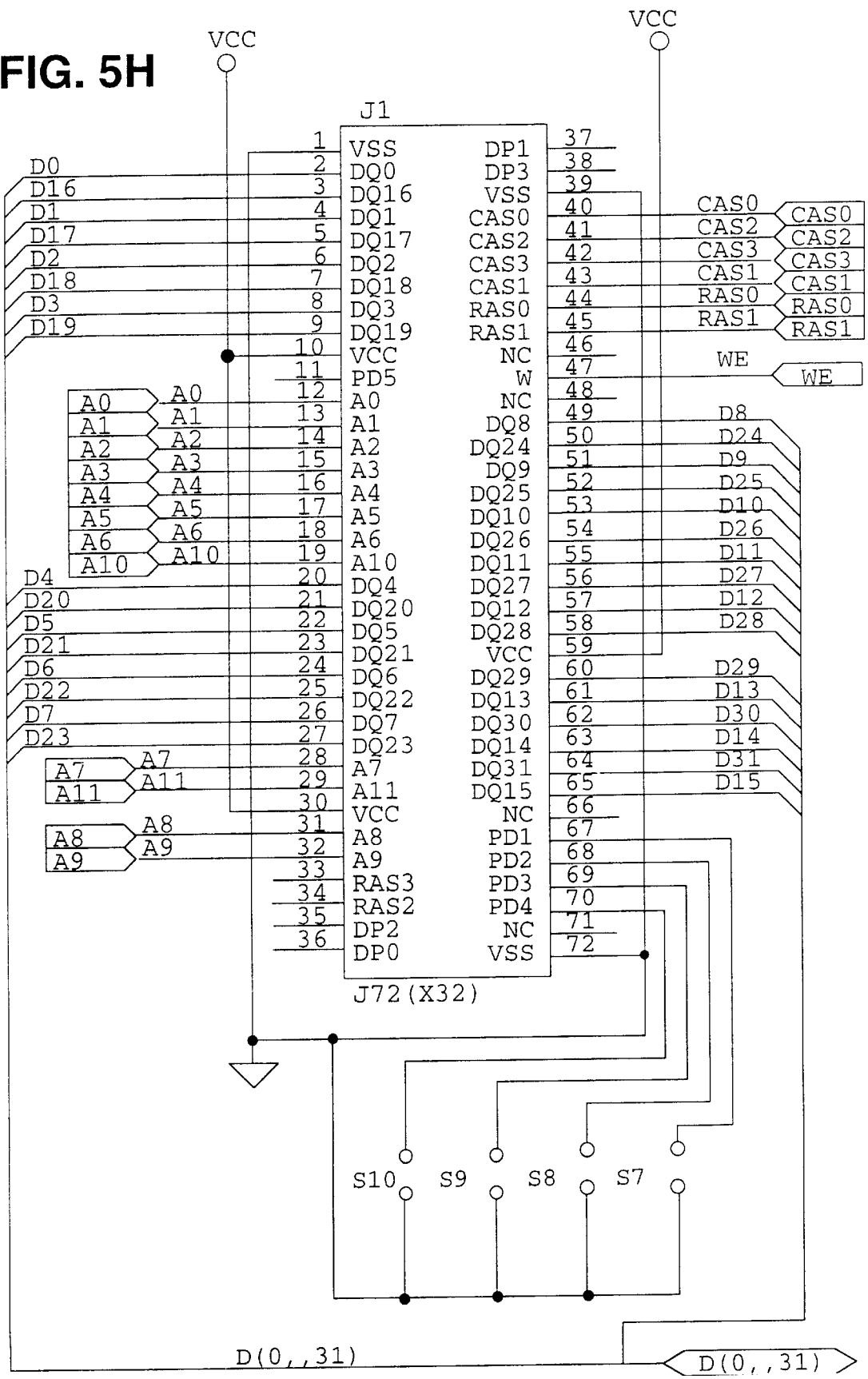
Figure 5I:
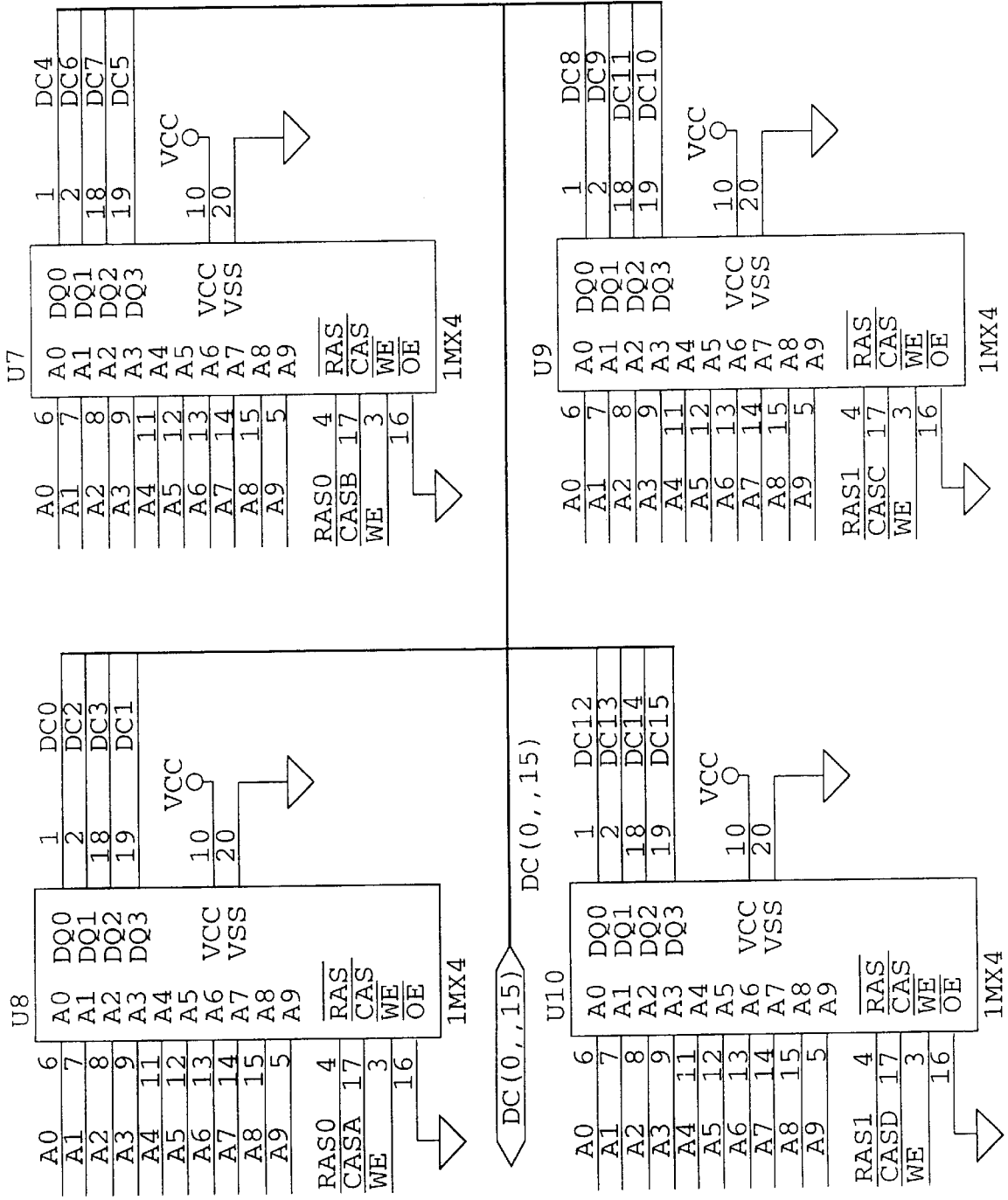
Figure 5J:
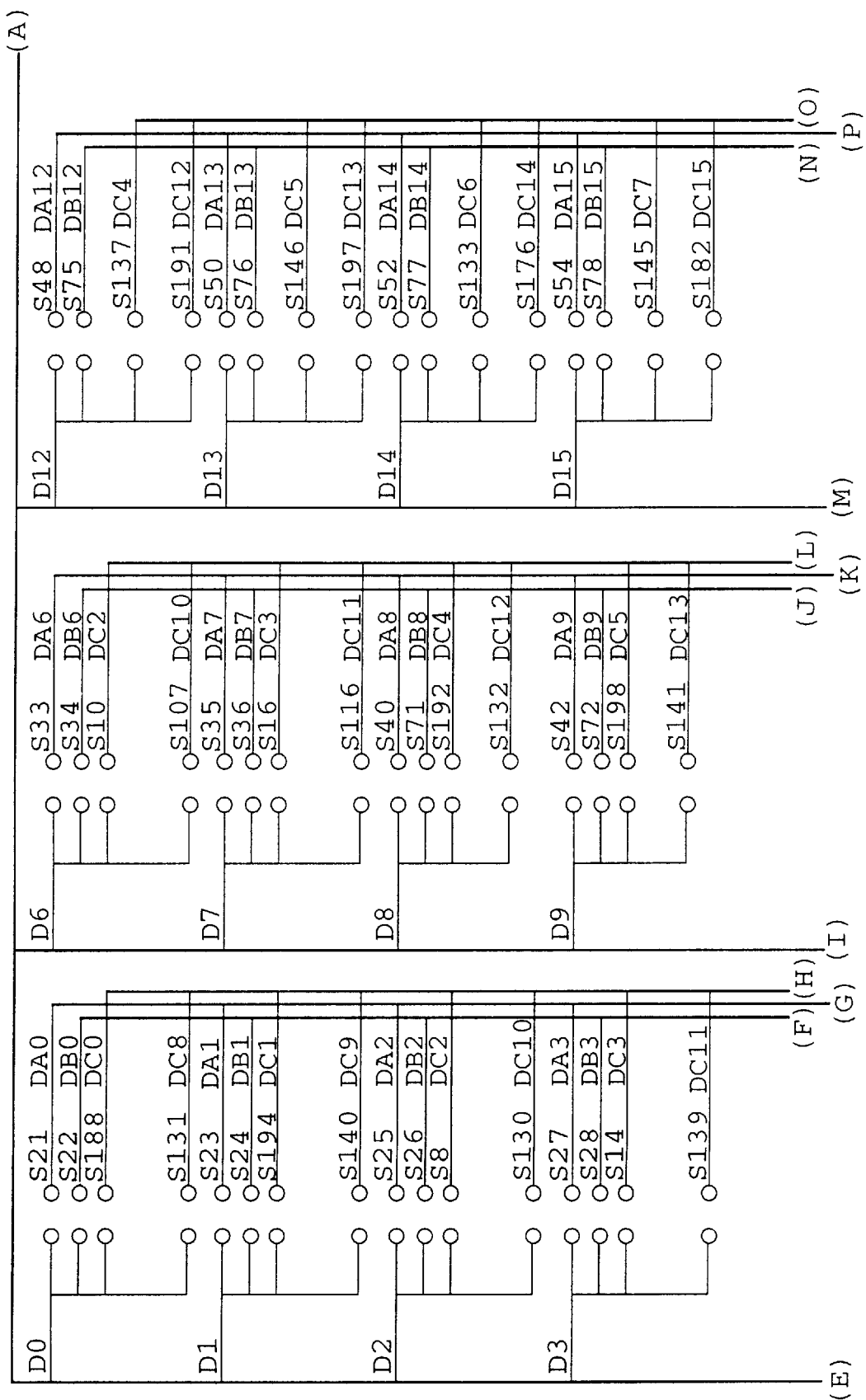
Figure 5K:
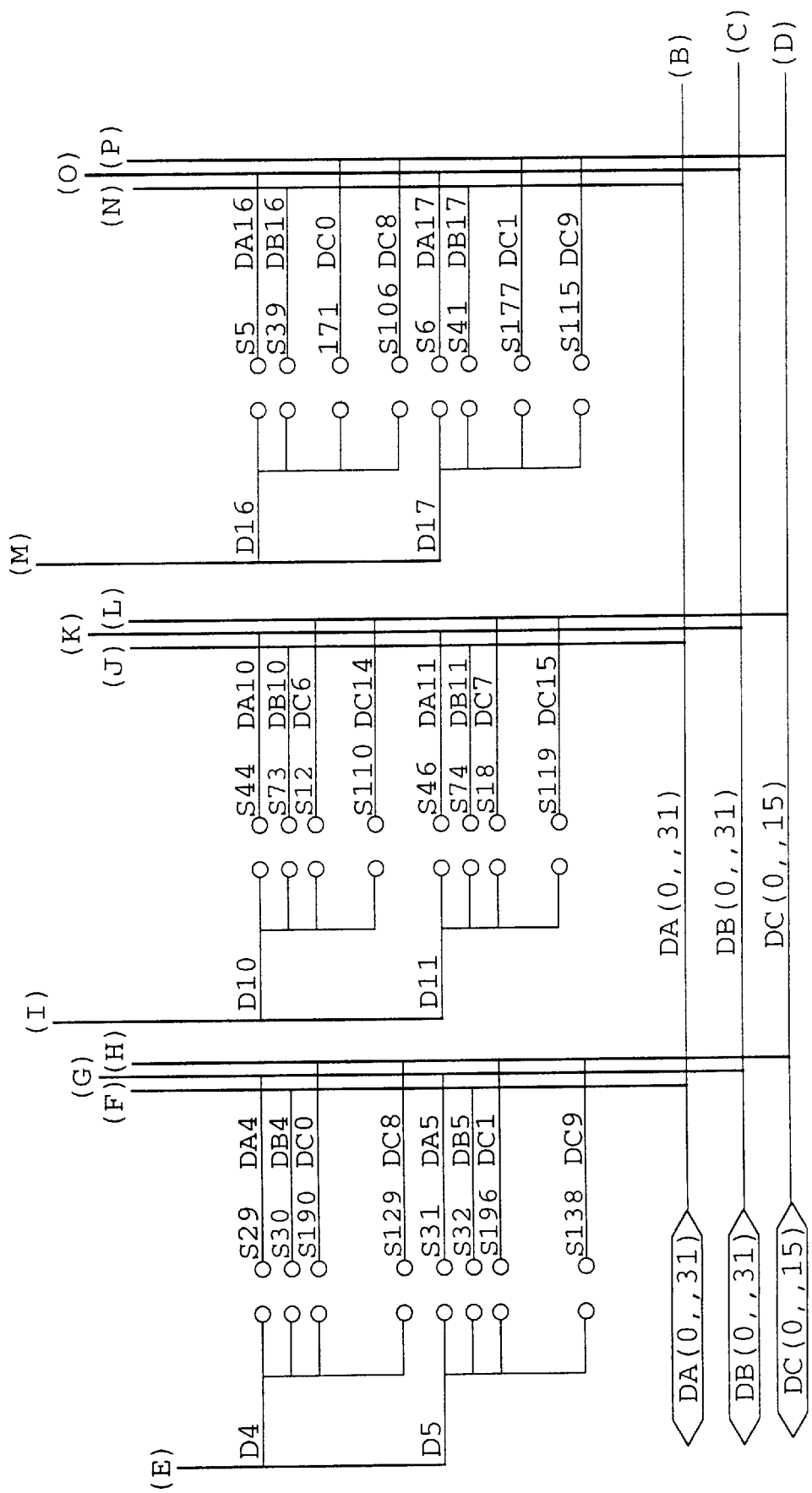
Figure 5L:
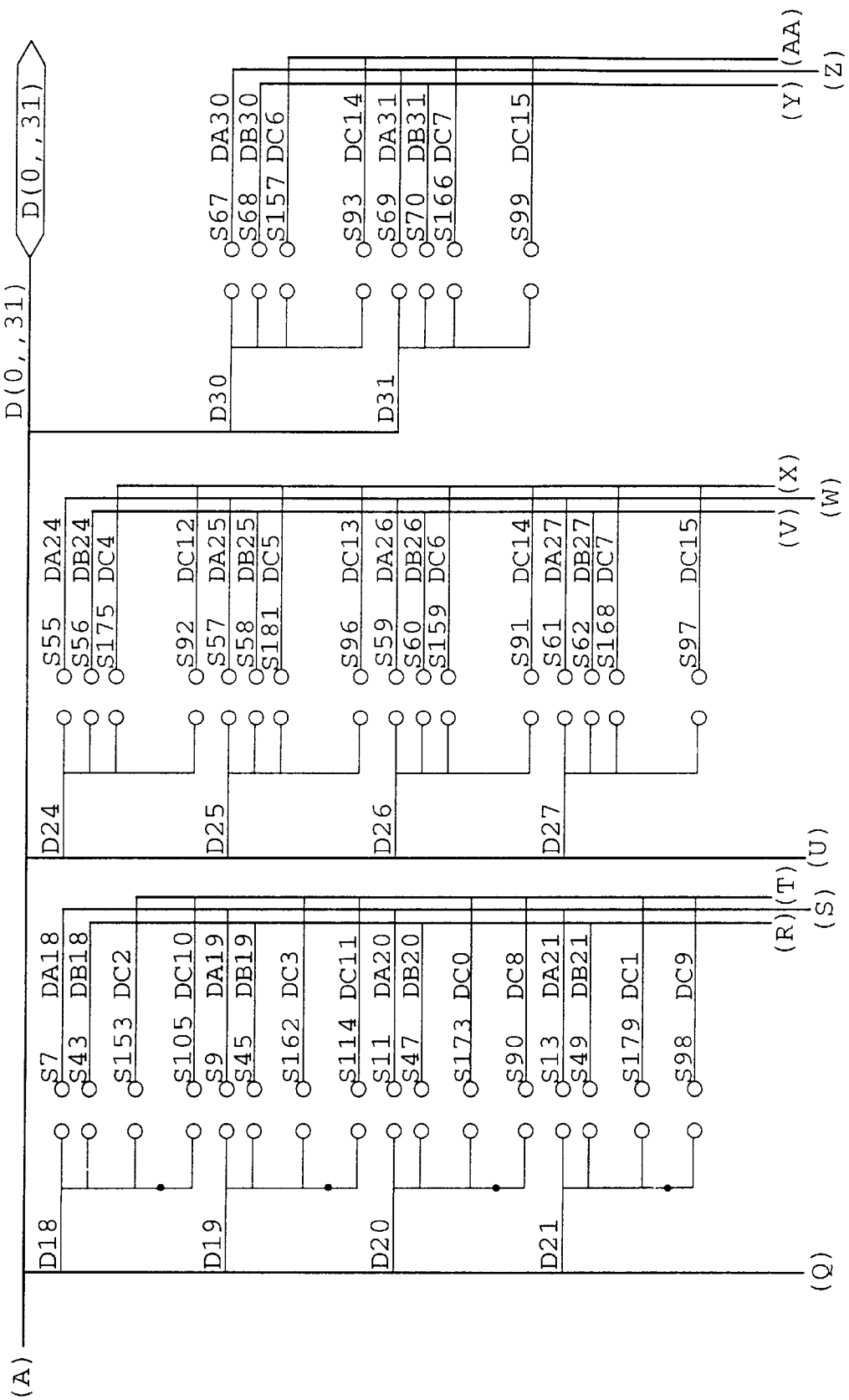
Figure 5M:
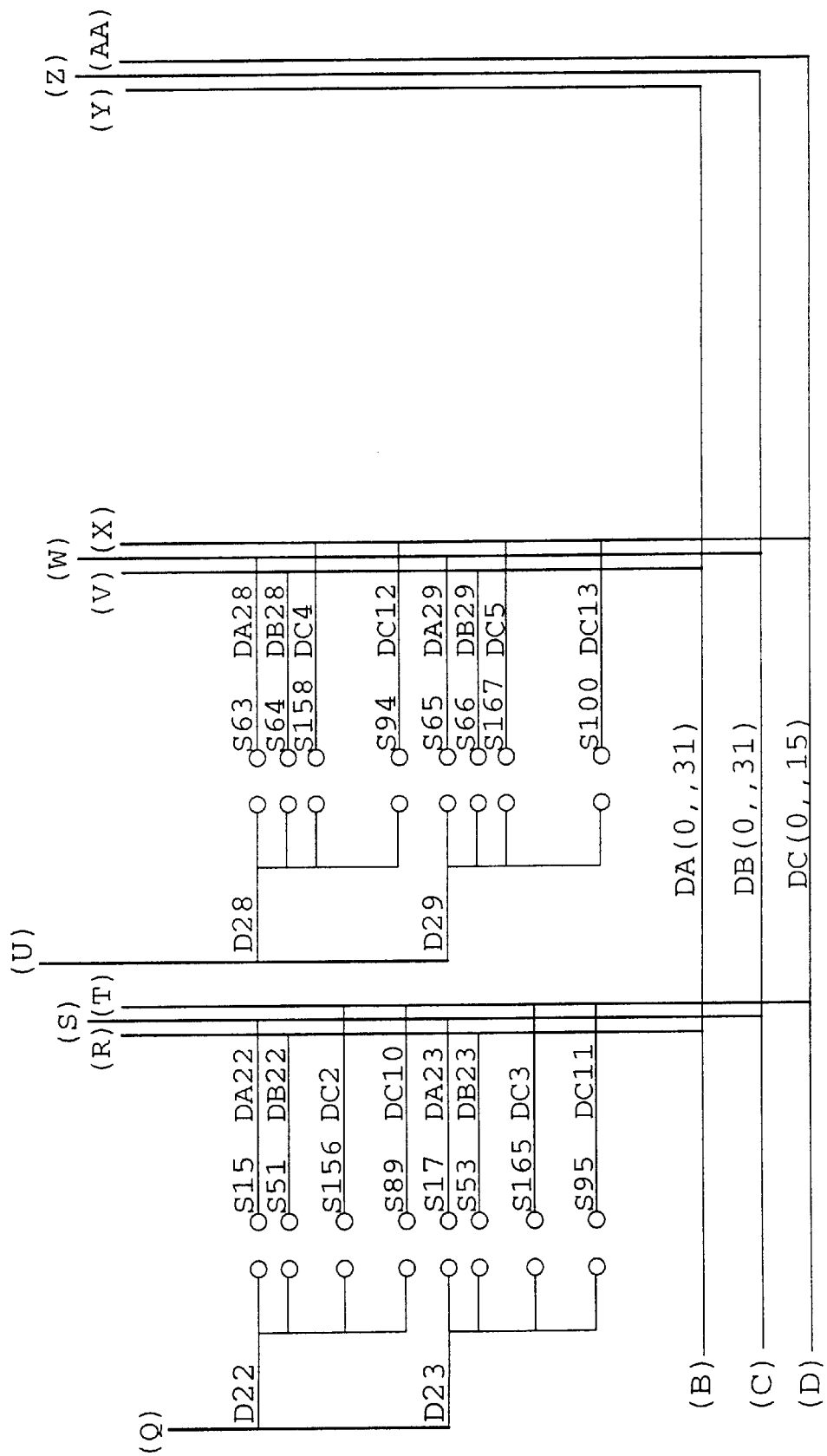

FIGS. 5a, 5b and 5c illustrate another board embodiment. This module has the benefit of being efficiently and economically packaged, and further, allows great flexibility in terms of maximizing the utilization of fully functional and partially failed Extended Data Out (EDO) parts (i.e., those that are tested slower than 60 nsec), as described below. Additionally, the board is versatile in that it can work with either 3.3 or 5 volt chips, also described below.

The module shown in FIG. 5 has four 1M×16 memory parts, which are the primary parts. Thus, the memory module can store two million 32-bit words. The diagrams for the primary parts are shown in FIG. 5a. The four 1M×4 memory parts U7 through U10 are used as patch parts, diagrams of which are shown in FIG. 5b. In the preferred embodiment, the parts are layed out horizontally with the card edge, with two 1M×16 primary parts and two 1M×4 patch parts per side. The primary parts U1 and U2 are located on the front side of the board. The primary parts U4 and U5 are located on the back side of the board. To facilitate this preferred layout, each patch chip is connected with each output covering only two bits on the card edge. The preferred dimensions of the board are shown in FIG. 6. This configuration provides an efficient and normal appearance when the 1M×16 parts do not require patching and when patching is necessary, the board appears to be populated with parity chips.

The module board comprises a pattern of solder-dot connections to allow any failing primary part connection to be replaced by another from a patch part. For the expected single or double bit failure, the failure is detected during the testing process and the corresponding output connection is disabled. The failing line is disconnected by removing the solder of its solder-dot connection, and the substitute line is connected by filling the applicable solder-dot. After the appropriate dot to the back-up part is selected and the back-up part with a working output matches the primary part being patched (i.e., either a 60 nsec EDO or 70 nsec non-EDO), the unit can be retested.

In this particular embodiment of the invention, all of the data output lines of every part are brought to the solder-dot locations shown in FIG. 5c. These solder-dot locations allow for connecting bit lines from the back-up parts or bit lines DA0–DA31 and DB0–DB31 from the primary parts to the module I/O lines D0–D31 on the module output connector.

Large blocks of memory on the board can be addressed by use of the two Row Address Select (RAS0 and RAS1) signals, the individuals bytes of memory are differentiated by selecting a combination of Column Address Signals (CAS0–CAS3) signal for each independent byte. The difference between the two 1M×16 primary parts on the top side of the board, U1 and U2, and the two 1M×16 primary parts on the back side of the board, U4 and U5, is the particular RAS connection. The two 1M×16 parts on the top side of the board, U1 and U2, are addressed and enabled by the Row Address Select 0 (RAS0) signal. The 1M×16 memory parts, U4 and U5, on the backside of the board are addressed and enabled by the Row Address Select 1 (RAS1) signal. The signals that are enabled on the front side by the RAS0 signal are DA0–DA31, as shown in FIG. 5a. The signals connected to RAS1 on the back side are DB0–DB31.

An important advantage of the board is the capability to configure the primary parts on the board to operate as one of three different kinds of parts, including: (1) a 60 nsec Extended Data Out (EDO); (2) a Fast Page part (i.e., a 70 nsec non-EDO part); and (3), an EDO which runs at 70 nsec, and thus, appears to be a Fast Page part. This flexibility allows for parts to perform as manufactured, or alternatively, still enables them to be of use by allowing them to function as if they were another part.

Referring to FIG. 5a, the particular part can be operated as manufactured by simple connecting the output enable to ground (i.e., dotting S2 and S4). Alternatively, a 60 nsec EDO part can be transformed into a 70 nsec Fast Page part, if, for example, the EDO part does not meet the 60 nsec speed requirement. Instead of wastefully discarding the partially failed EDO, this part can now still be used on the board, but as a slower part. The same technique applies to parts which are partially EDO and partially fast page parts. The board, shown in FIG. 5a, contains a logic circuit for the suppression of the EDO feature. This circuit is an AND gate, implemented with a74F08. The AND gate is connected to each of the two CAS lines of the 1M×16 part and the output is optionally connected through dots of the OE input on the 1M×16 part. This conversion is completed by dotting S1 instead of S2 and dotting S3 instead of S4. In this manner, a 60 nsec EDO part has been transformed into a 70 nsec Fast Page part. This circuit implements the function of disabling the data outputs during the time when both CAS's are high or inactive, giving the same effect as if the chips did not have the Extended Data Output (EDO) feature.

Enhanced flexibility can also be provided using the board, shown in FIG. 5, by enabling the board to work with 3.3 or 5 V parts. Referring to the lower left hand corner of FIG. 5, a variable voltage regulator is diagrammed. By adding the voltage regulator, the board is extremely versatile. It can work with fast 60 nsec EDO's and Fast Page parts jumpered with output enable (OE) tied to ground and with 70 nsec slowed EDO parts with the 74F08 dotted to output enable (OE). Alternatively, if a voltage regulator is not utilized, the voltage can be jumpered to 5V by dotting S5 and S6.

Referring to FIG. 5a, on primary part U1, the first byte is enabled by CAS0, the second byte by CAS2. On primary part U2, the first byte is enabled by CAS1, and the second byte by CAS3. On primary part U4, the first byte is enabled by CAS2, the second byte by CAS0. Further, on primary part U5, the first byte is enabled by CAS3, the second byte by CAS1. A series of solder-dot locations S11–S18, as shown in FIG. 5b, are used to selectively enable each of the back-up parts U7, U8, U9 and U10, with one of two CAS lines.

According to this scheme, back-up part U9 can be used to patch the first and second bytes of primary parts U1 and U4. Back-up part U8 can also be used to patch the first and second bytes of primary parts U1 and U4. Patch parts U7 and U10 can be used to patch the first and second bytes of primary parts U2 and U5. In other words, all four of the patch parts can be used to patch bits in four bytes of the primary parts.

FIG. 5c shows all of the possible patching combinations. DC0, for example, is shown connected to D0, D4, D16 and D20, and thus, has four connections. DC0 therefore can patch any of these four bits. Likewise, DC1 is connected to D1, D5, D17 and D21, and thus, can similarly patch any of these four bits. A particular patch part is not always available to patch any of the bits of the particular primary part. If CAS0 is used to allow U8 to patch bit D0 through D7, U8 cannot then patch D16 through D23. However, with the preferred solution, part U9 could be used to patch this second byte by connecting RAS0 to U9. If the output lines D0 and D4 fail, for example, there is no solution to use U8. This is an example where a single part can not patch multiple bit fails within a byte. If a combination of parts is not patchable on the board, one 1×16 part can be removed and a different 1×16 device substituted that allows the patches to be made.

For those parts which have had four or more bits fail or which have conflicting outputs not patchable with another patch chip, the 1M×16 primary part is preferably mounted on a board such as that disclosed above and shown in FIG. 4. Therefore, the more extensive routing algorithm of the COB board in FIG. 4 can be used to patch the part on the board.

As part of the original sort process, described above, the chips are divided into 60 nsec EDO parts (with simple one or two bits fails), 70 nsec Fast Page parts (with simple one or two bits fails), slowed EDO parts that will be converted into Fast Page parts, as described above (with simple one or two bits fails), and those parts with multiple bit failures. As set forth above, those parts with multiple bit failures are preferably mounted onto the COB embodiment shown in FIG. 4. The 60 nsec EDO parts are mounted onto the board, shown in FIG. 5, and then tested. These boards result in four part EDO modules. Those slow EDO parts that are to be converted to Fast Page parts can also be mounted onto the boards, as shown in FIG. 5. The EDO features are then suppressed on the desired EDO parts to form a 70 nsec Fast Page part, as described above. These parts are then tested. Finally, the original Fast Page parts are mounted onto boards and tested for failures. In any of the above cases, any failures during the patch process are patched as described above.

In summary, the board, shown in FIG. 5, is most useful for patching single bit failures. Because the normal distribution happens to be centered on single bit failures, however, around 95% of chips can be patched on the board shown in FIG. 5.

This board allows for unburned-in-parts which have tested "all good" at the die level to be directly mounted and processed through the burn-in and test process, assuming that in most cases the parts will either pass resulting in a 4 chip solution or require on average only one patch chip. Parts that can not be patched are removed and used on other more comprehensive boards.

The above discussion applies to COB boards using the same logic as the board shown in FIG. 5. Because at least 8% of the Cob die will fail the test and burn-in process, the logic used on this design will allow those failures to be patched very cost effectively.

Because of the inability to patch larger failures, the selection of die in the initial test becomes more restrictive but still covers most of the parts manufactured.

Table III shows the various patching arrangements for each failed bit of the primary parts U1, U2, U4 and U5. For each bit that has failed in one of the primary parts and that is flagged in the PIN column, the chart shows the appropriate primary part connection in the "u con" column, which solder dot must be disconnected to isolate the failing bit in the "1×16 dot" column, which solder-dot must be filled to patch in the substitute bits in the "patch Dot" column and finally which solder-dot location must be filled to enable a patch part in the "patch bit column" with the appropriate CAS line in the "CAS dot" column. When all the dots are finished, the patch parts are chosen by the outputs required. For example, if bit 3 of U1 failed, solder-dot 31 must be disconnected to isolate the failed bit. Solder-dot 33 must then be filled to patch in the substitute bits in the "patch Dot." Cas line 11 is then dotted and patch bit 8C is selected to be filled.

It is noted, however, that certain combinations of failures cannot be patched using the embodiment set forth in FIG. 5. For example, a problem arises if both bit 3 and bit 7 of U1 fail. As mentioned above, patch bit 8C is selected to be filled for the bit 3 failure. Referring to Table III, it is noticed that patch bit 8C would also be selected for the bit 7 failure. Thus, it can't be used to solve the second failure. In this case, the primary part U1 would preferably be taken off the board and mounted on a board such as that disclosed above and shown in FIG. 4.

Figure 7A:
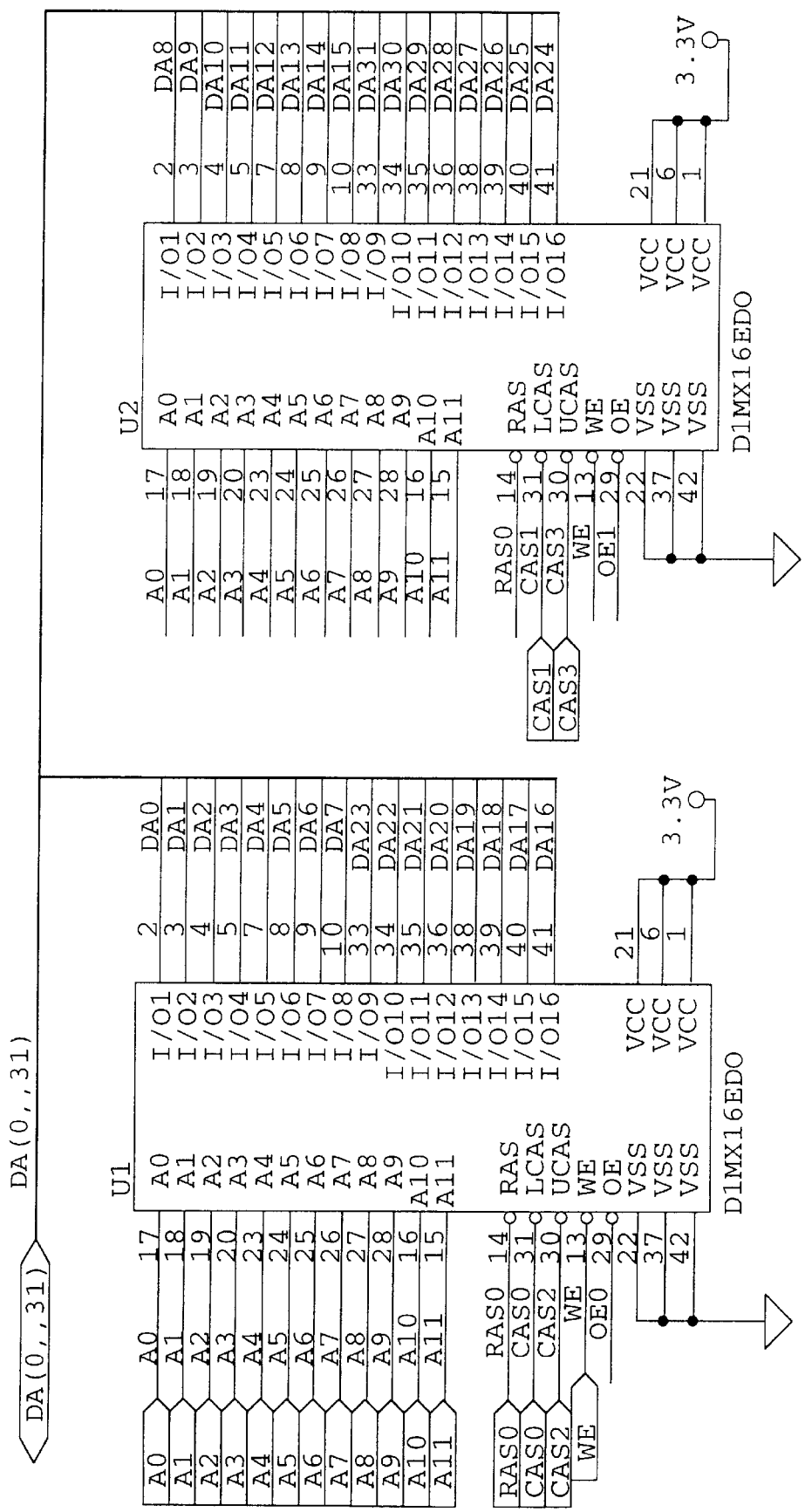
FIGS. 7A–7N circuit diagram of another memory module.
Figure 7B:
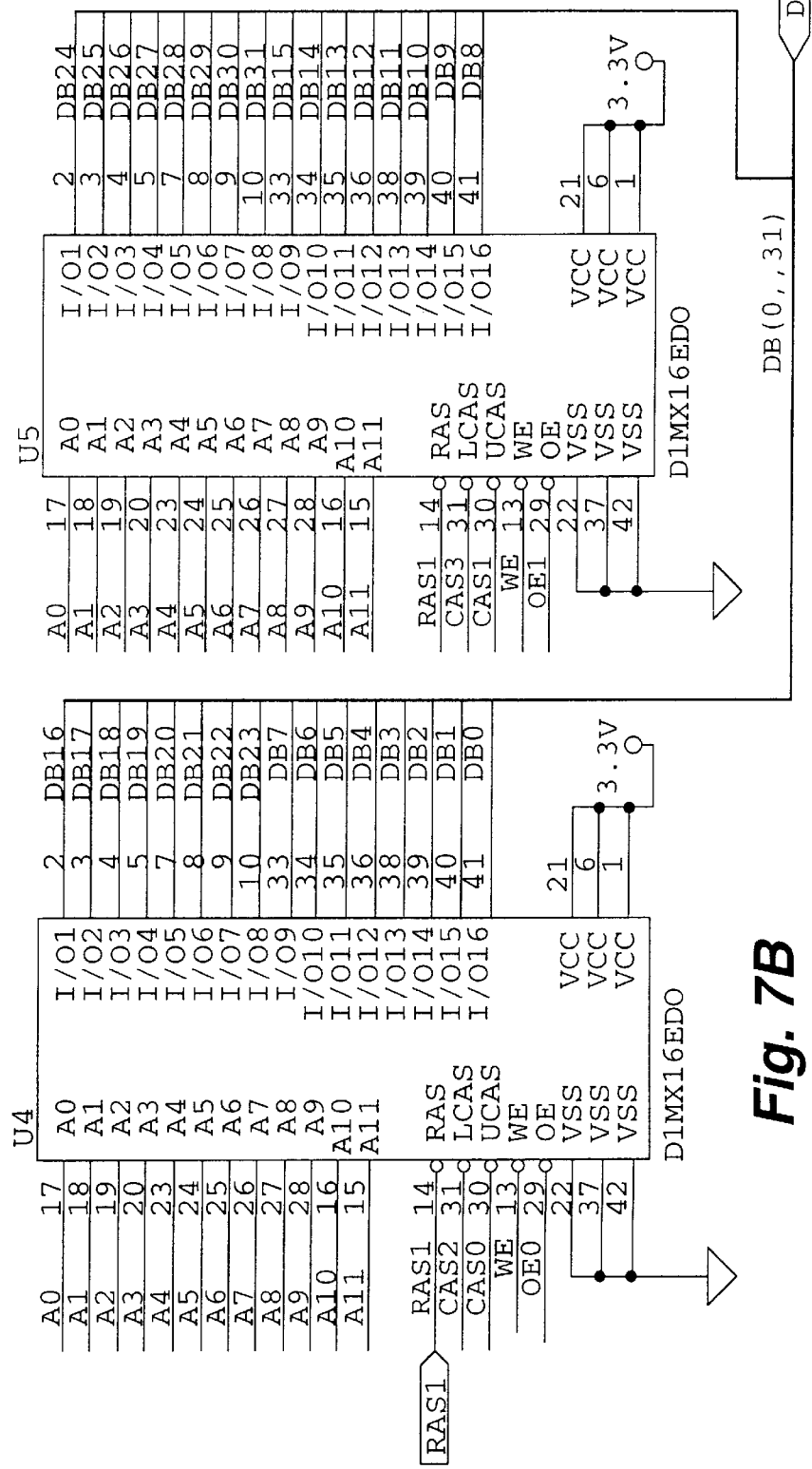
Figure 7H:
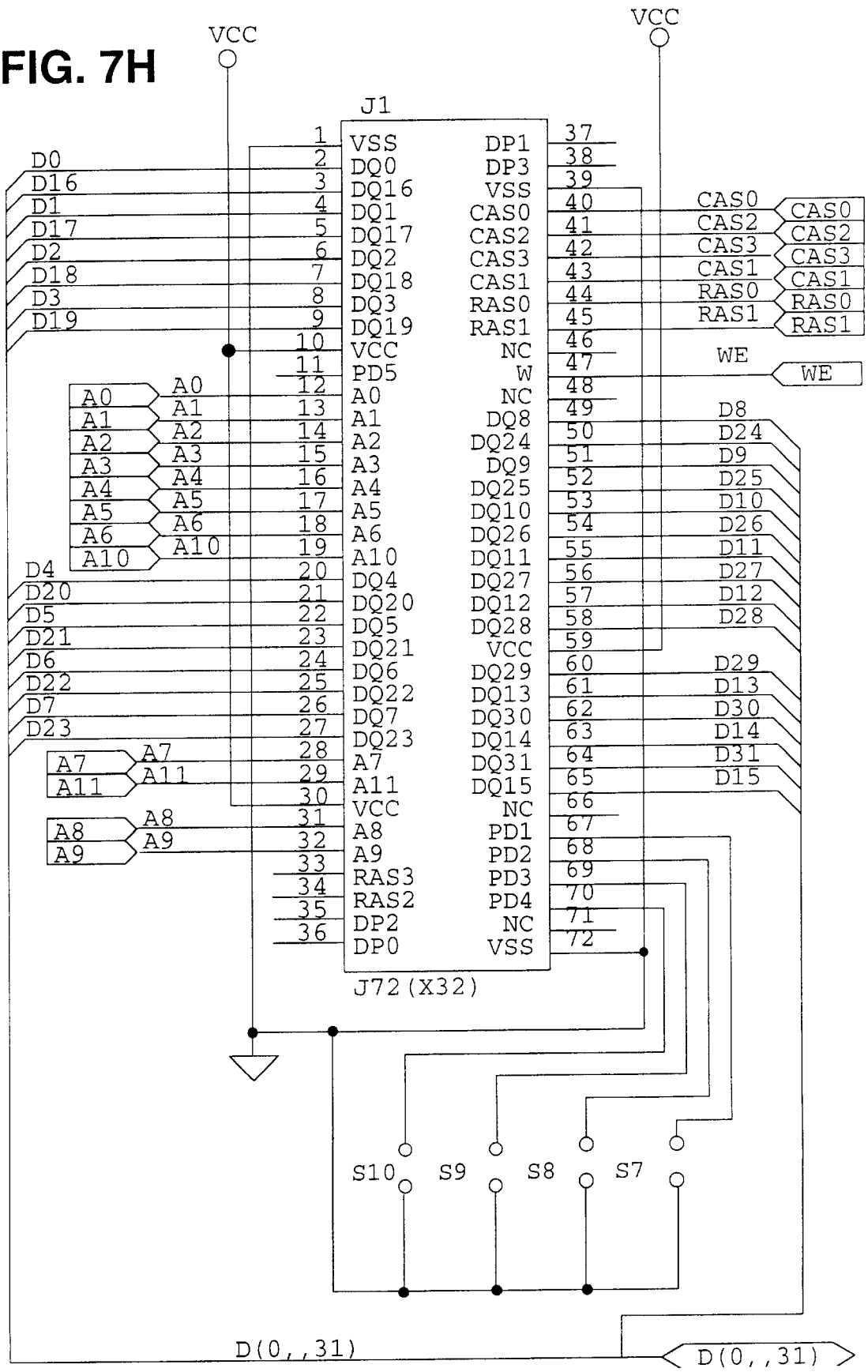
Figure 71:
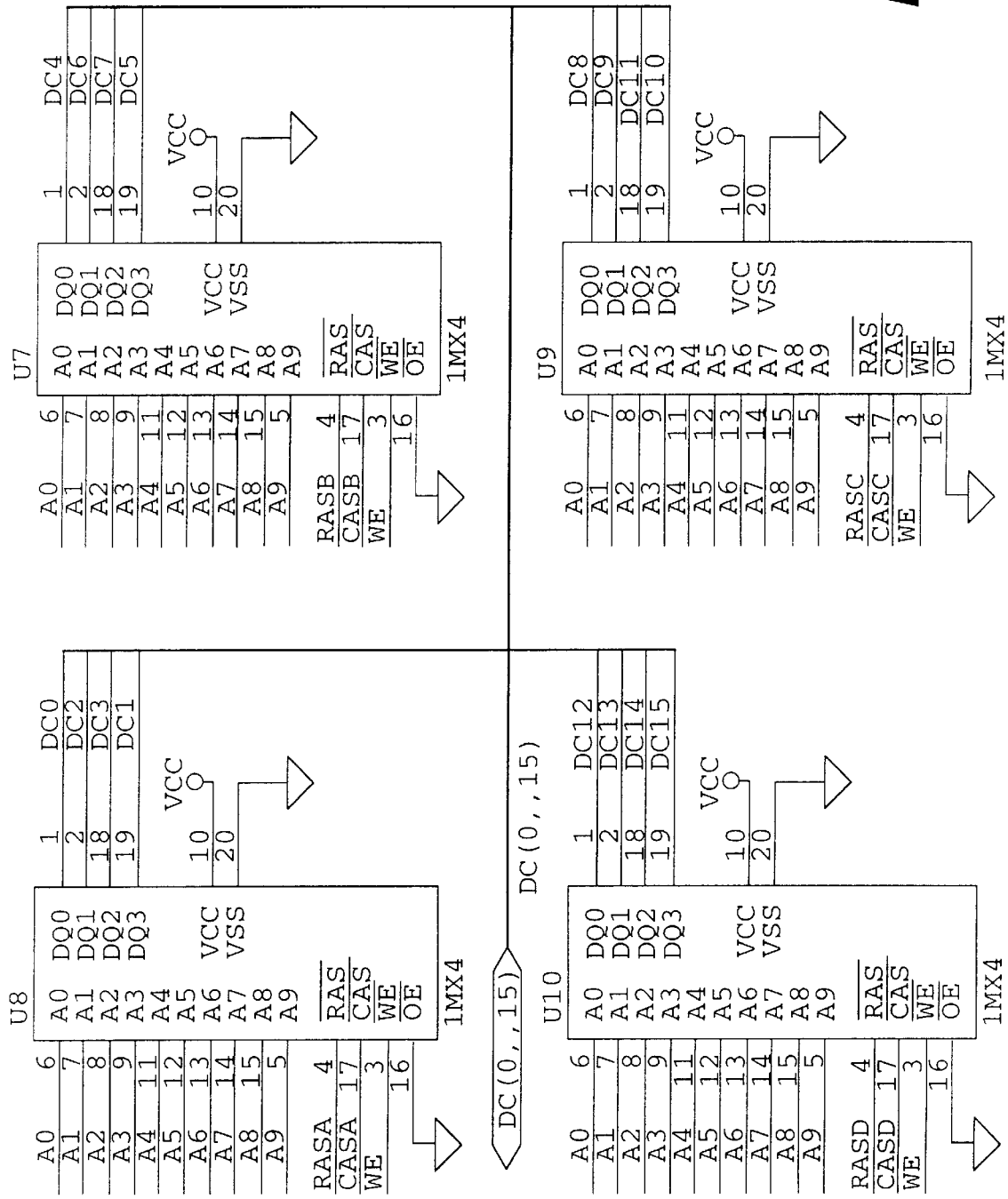
Figure 7K:
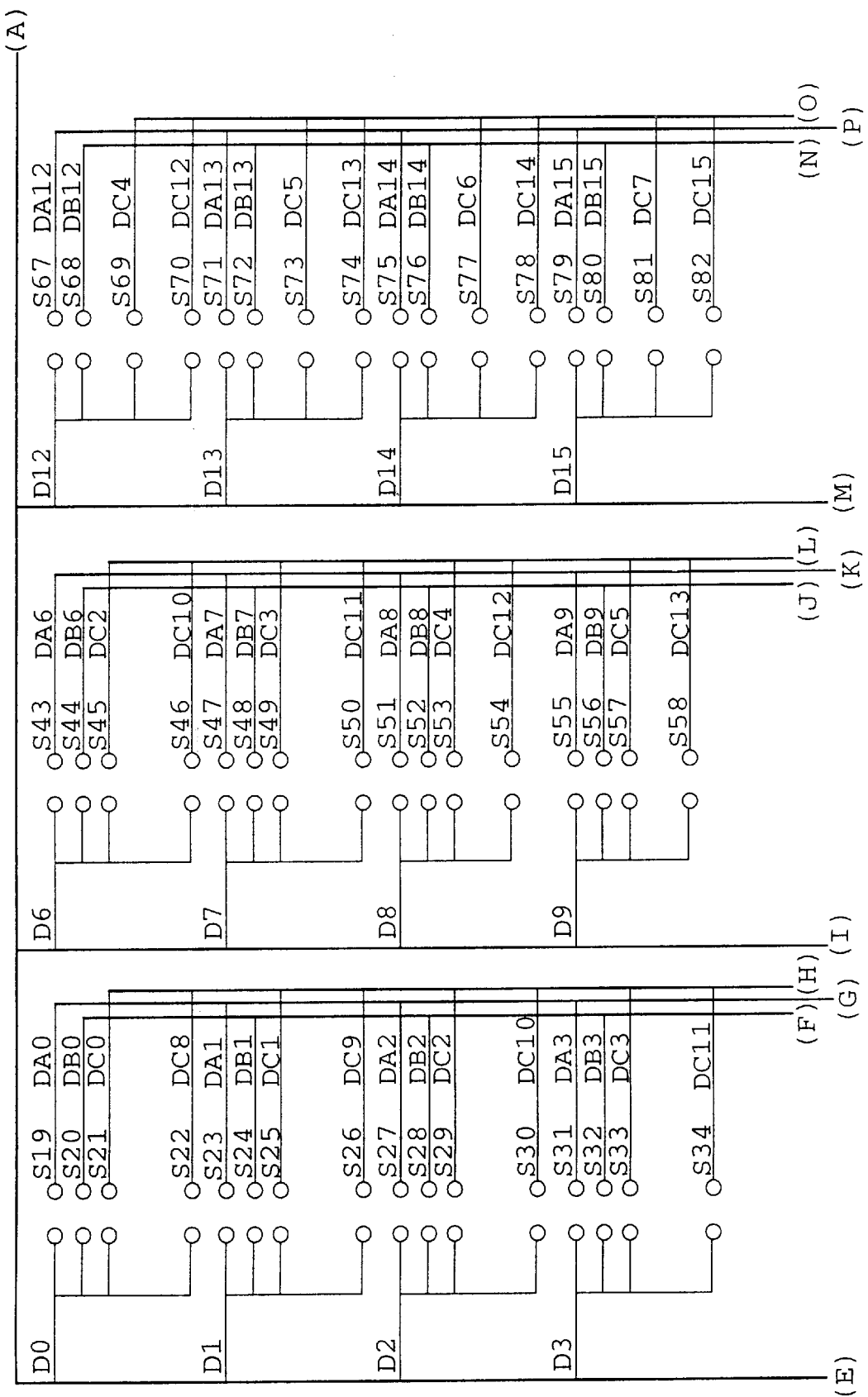
Figure 7L:
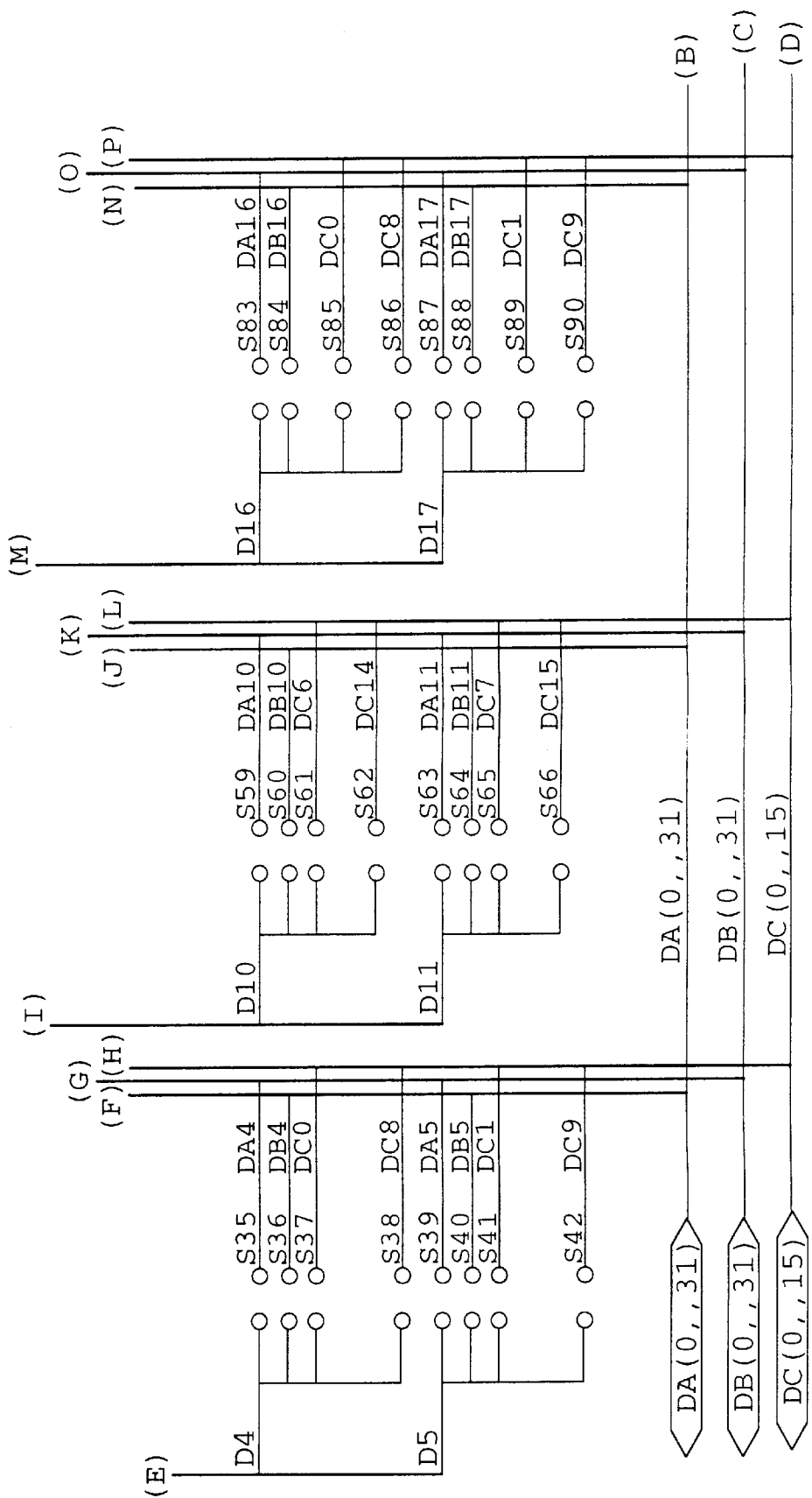
Figure 7M:
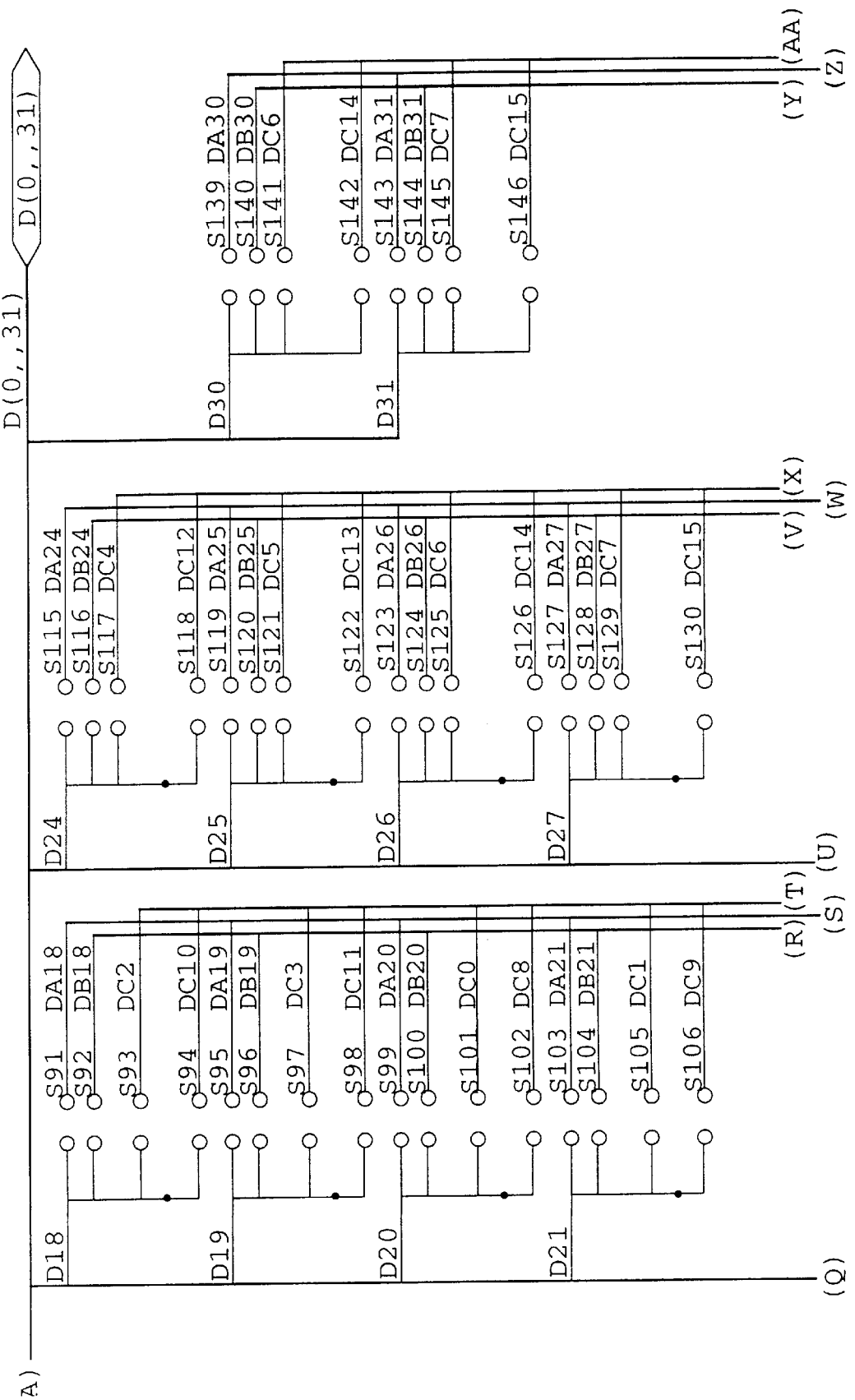
Figure 7N:
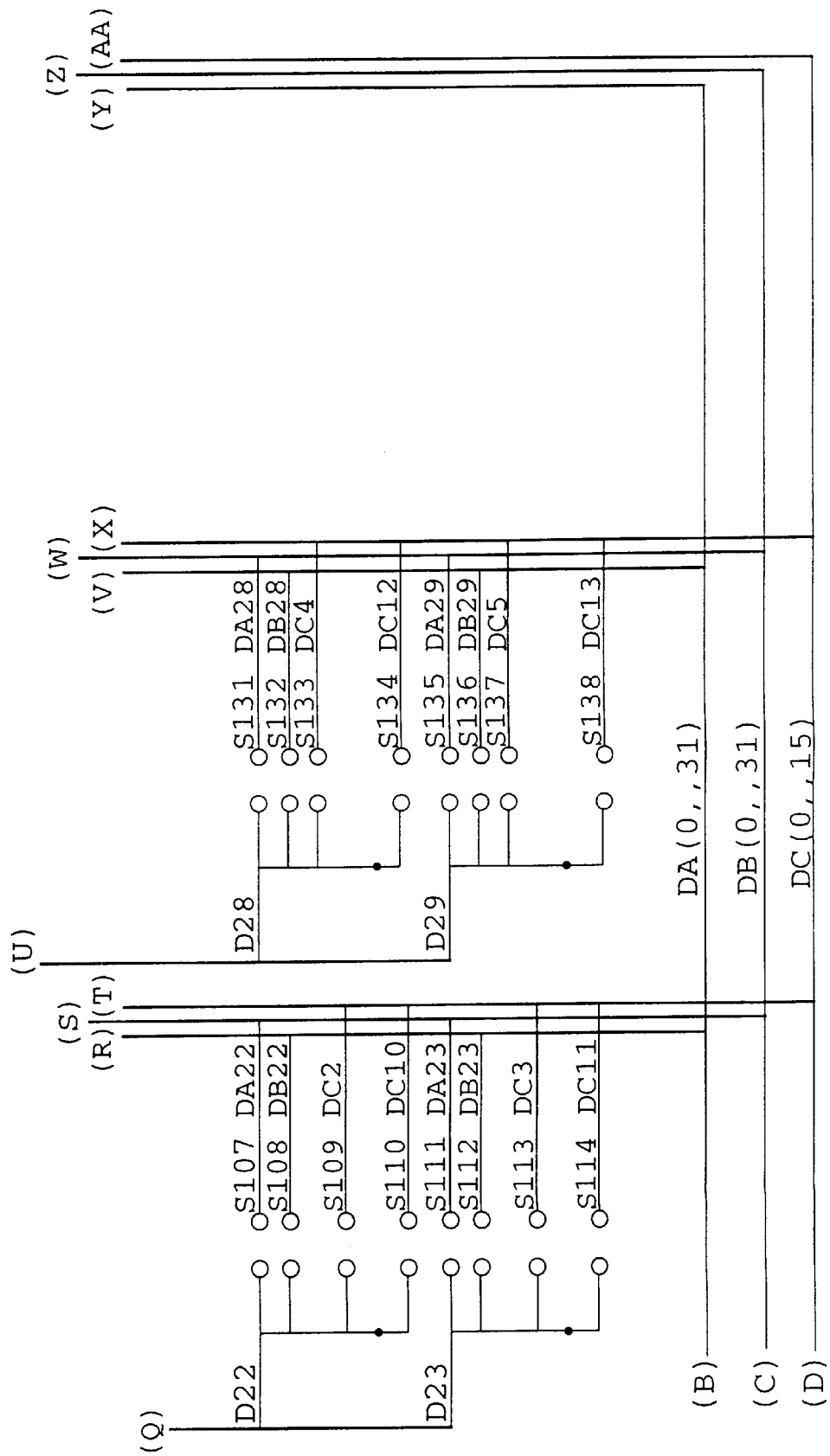

Alternatively, the board, shown in FIG. 5, can be slightly revised to have dottable RAS connections, thus, enhancing flexibility by allowing two patch parts to patch a single primary part if the other side of the board is "all good." This revised embodiment is shown in FIGS. 7a, 7b and 7c. the diagrams for the primary parts and patch parts are shown in FIGS. 7a and 7b. The primary difference between the embodiments shown in FIGS. 5 and 7 are the dottable RAS connections, shown on the right hand side of FIG. 7b. Referring to Table IV, which is prepared for the memory module of FIG. 7, assuming the same failure scenario described about with respect to FIG. 5 (i.e., bits 3 and 7 fail), once the process determines that patch bit 8C has already been selected to solve the bit 3 failure, solder-dot 49, which had previously been dotted, must now be undotted, and as a replacement, solder-dot 50 is dotted. The corresponding CAS line 15 is dotted, and subsequently, solder dot 9D is filled, and RAS line 151 is dotted, thereby connecting RAS0 to patch part U9. Thus, flexibility is improved in the embodiment of FIG. 7 due to the allowance of two patch parts to patch a single part.

Obviously, variations and other means and processes for carrying out the teachings of the invention may occur to one ordinary skill in the art, and this invention is meant to covers all such variations.

We claim:

1. A method for developing a fully functional transparent memory module comprising an assembly of selected independent primary and backup memory parts,
   the method comprising the steps of:
   testing a plurality of independent memory parts for failed I/O data line segments;
   sorting the parts according to the results of the testing;
   identifying failed and working I/O data line segments in the sorted parts;
   selecting at least one primary part having at least one I/O data line failure, and at least one different partially defective backup memory part from said sorted parts; and
   combining working I/O data line segments of different selected memory parts, including at least one working I/O data line segment of at least one partially defective backup memory part and working I/O data line segments of a primary part to form a fully functional transparent memory module.

2. A memory module made by the method of claim 1.

3. The method of claim 1, where at least one of the memory parts is a package.

4. The method of claim 1, further comprising:
   testing the completed memory module as to its operational status to approve the module for use or to identify any operating problems; and, as required, changing the combination of working segments of memory parts to overcome any such identified problem.

5. A memory module formed by the method of claim 4.

6. The method of claim 1, wherein the combination of working segments is done by patching using solder-dot connections on a printed circuit board.

7. The method of claim 1, wherein the combination of working segments is done by patching using jumper installations on a printed circuit board.

8. A method for developing effective chip-on-board memory modules comprising an assembly of a selected combination of independent partially defective memory chips,
   comprising the steps of:
   assembling the selected chips as primary chips and backup chips onto a chip-on-board memory module assembly;
   testing the assembled module for failed I/O data lines in the chips;
   identifying operating I/O data line segments in the chips; and
   combining identified working I/O data line segments of a partially defective primary chip with a required number of working I/O data line segments of backup memory chips.

9. A chip-on-board memory module made by the method of claim 8.

10. The method of claim 8 further comprising the steps of:
    pretesting the parts while in die form; and
    sorting the parts according to the results of the pretesting.

11. A chip-on-board memory module made by the method in claim 10.

12. A method for patching selected partially defective independent primary memory parts with selected different partially defective independent backup memory parts to form a memory module functionally transparent to the user, comprising the steps of:
    testing the primary memory parts and the backup memory parts before mounting the parts on a board to;
    identify operating and failed I/O data line segments of the primary parts and of the backup memory parts;
    determining which operating I/O data lines from the backup memory parts to use for selectively patching failed I/O data lines segments of the primary memory parts; and
    substituting said determined operating I/O data lines from the backup parts for failed I/O data lines in one or more primary parts to form a completed memory module.

13. A memory module made by the method of claim 12.

14. The method of claim 12 wherein the resultant memory module comprises all good and partially defective memory parts.

15. The method of claim 12, further comprising;
    testing the completed memory module as to its operational status to approve the module for use or to identify any operating problems; and, as required,
    the step of replacing at least one of the parts with a replacement part to overcome any such identified operating problem.

16. A memory module made by the method of claim 15, wherein the memory module comprises all good, partially defective, and replacement parts.

17. The method of claim 12, wherein the patching is done by using solder-dot connections on a printed circuit board.

18. The method of claim 12, wherein the patching is done using jumper installations on a printed circuit board.

19. A method for patching primary parts with partially defective parts, comprising the steps of:
perform a wafer test on memory die;
identify the working and nonworking segments in the parts;
package the primary and partially defective parts according to working segments;
test the parts;
give each part an identification code, the identification code containing a quadrant test pattern of the part;
select parts for assembly on a module board;
assemble the parts on the module board according to the nature and location of the parts' working segments;
fill in the solder-dot locations of the primary parts, wherein the solder-dot locations of the back-up parts are left open;
test the module on a full function circuit tester, wherein failed bits are noted, and the module is assigned a new identification code designating the failed bits;
generate patching instruction charts for the module, wherein the development of the patching instruction charts includes an optimization pass designed to maximize use of smaller patch parts, leaving the larger parts available for patching later-discovered failures;
disconnect solder-dot connections on the primary parts to isolate the failed line;
fill the solder-dot connections to patch in the substitute lines, the solder-dot connections selected as identified in the patching instruction charts; and
re-test the module, including high temperature stress testing of the module.

20. The method of claim 19 wherein the disconnecting and filling steps are automated.

21. A memory module made by the method of claim 19.

22. The method of claim 19 wherein the resultant memory module comprises all good and partially defective memory parts.

23. The method of claim 19, further comprising the step of replacing at least one of the parts with a replacement part.

24. A memory module made by the method of claim 19, wherein the memory module comprises all good, partially defective and replacement parts.

25. A method for generating patching instruction traveler charts using optimization, comprising the following steps:
scanning bits of wider parts;
identifying unused bits in the smaller parts, wherein the unused bits will be used for substitution;
optimizing the selection of the parts to use in patching;
generating patching instructions; and
implementing the generated patching instructions into a traveler chart.

26. The method of claim 25, wherein at least one computer is used to automate all of the steps.

27. A module made up of primary parts and partially defective backup parts, comprising:
at least one primary part, the primary part having at least one line failure;
a plurality of partially defective parts;
a module PC board containing a pattern of solder-dot connections, the solder-dot connections allowing any failing primary part I/O lines to be replaced by I/O substitute lines from the backup parts.

28. The module of claim 27, wherein the failing line is disconnected from the primary part by removing the solder of its solder dot connection and the substitute line is connected by filling the applicable solder-dot, the substitute line having the equivalent function as the failing line so that the module is transparent to the user.

29. The module of claim 27 wherein the module comprises all good and partially defective memory parts.

30. The module of claim 27, wherein the module contains at least one replacement part.

31. The module of claim 27, wherein the module comprises all good, partially defective and replacement parts.

32. The module of claim 27 wherein the selection of substitute lines are identified in patching instruction charts developed for the module, wherein the development of the patching instruction charts includes part optimization.

33. A SIMM module made up of primary parts and partially defective parts, comprising:
at least two primary parts, at least one of the primary parts having at least one line failure;
a plurality of partially defective parts;
a module PC board containing a pattern of solder-dot connections, the solder-dot connections allowing the failing primary part lines to be replaced by I/O substitute lines from the partially defective parts;
wherein the failing line is disconnected from the primary part by removing the solder of its solder dot connection and the substitute line is connected by filling the applicable solder-dot, the substitute line having the equivalent function as the failing line so that the module is transparent to the user.

34. The module of claim 33 wherein the selection of substitute lines are identified in patching instruction charts developed for the module, wherein the development of the patching instruction charts includes part optimization.

35. The module of claim 33 wherein the module comprises all good and partially defective memory parts.

36. The module of claim 33, wherein the module contains at least one replacement part.

37. A module of claim 33, wherein the memory module comprises all good, partially defective and the replacement parts.

38. The module of claim 33, wherein the primary parts are 1MX16 parts.

39. The module of claim 38, wherein the partially defective parts are 1MX4 parts.

40. A memory module made up of primary parts and partially defective backup parts, comprising:
four primary parts, each of the primary parts having at least one line failure;
eight partially defective backup parts;
a module PC board containing a pattern of solder-dot connections, the solder-dot connections allowing the failing primary part lines to be replaced by I/O substitute lines from the backup parts;
wherein the failing line is disconnected from the primary part by removing the solder of its solder dot connection and the substitute line is connected by filling the applicable solder-dot, the replacement line having the equivalent function as the failing line so that the module is transparent to the user.

41. The memory module of claim 40, wherein the memory module is a 2MX32 memory module, the four primary parts consist of 1MX16 packages, and the backup parts consist of eight 1MX4 packages.

42. The memory module of claim 40, wherein each line in a primary part can be patched by a line from either one of the eight partially defective backup parts.

43. The module of claim 40, wherein the selection of substitute lines are identified in patching instruction charts developed for the memory module, wherein the development of the patching instruction charts includes part optimization.

44. The module of claim 40 wherein the memory module comprises all good and partially defective memory parts.

45. The module of claim 40, wherein the memory module contains at least one replacement part.

46. A module of claim 40, wherein the memory module comprises all good, partially defective and the replacement parts.

47. A chip-on-board module made up of primary parts and partially defective backup parts, comprising:
   at least one primary part, the primary part having at least one line failure;
   a plurality of partially defective parts;
   a module PC board containing a pattern of solder-dot connections, the solder-dot connections allowing any failing primary part I/O lines to be replaced by I/O substitute lines from the backup parts;
   wherein the failing line is disconnected from the primary part by removing the solder of its solder dot connection and the substitute line is connected by filling the applicable solder-dot, the replacement line having the equivalent function as the failing line so that the chip-on-board module is transparent to the user.

48. The memory module of claim 47, wherein the four primary parts consist of 1MX16 parts, and the backup parts consist of eight 1MX4 parts.

49. The module of claim 47, wherein the selection of substitute lines are identified in patching instruction charts developed for the module, wherein the development of the patching instruction charts includes part optimization.

50. A method for selecting and assembling primary parts and backup parts on a chip-on-board module assembly comprising patterns of solder dot locations for the primary and backup parts, the process comprising the steps of:
   performing a wafer test on a memory die;
   selecting, as primary parts, partially defective dies that have a reasonable probability of being patched successfully;
   selecting, as backup parts, other partially defective dies that test to be suitable for patching;
   assembling the selected primary and backup parts on the PC module;
   applying a plastic over coating to the assembled parts; and
   testing the module using a chip test applied at the module pins; and
   patching failed segments of the primary parts with working segments of the backup parts.

51. A method for selecting and assembling primary parts and backup parts on a chip-on-board module assembly comprising patterns of solder dot locations for the primary and backup parts,
   the process comprising the steps of:
      performing a wafer test on a memory die;
      selecting, as primary parts, dies that have a reasonable probability of being patched successfully;
      selecting, as backup parts, other dies for assembly on a PC module;
      assembling the selected primary and backup parts on the PC module;
      applying a plastic over coating to the assembled parts; and
      test the module using a chip test applied at the module pins;
      assigning a bar code to the module to identify failed bits;
      fill in the solder-dot locations of the primary parts, the solder-dot locations of the back-up parts are left open;
      test the module on a full function circuit tester, wherein failed bits are noted, and the module is assigned a bar-code identifying the failed bits;
      generate patching instruction charts for the module, wherein the development of the patching instruction charts includes an optimization pass designed to maximize use of smaller patch parts, leaving the larger parts available for patching later-discovered failures;
      disconnect solder-dot connections on the primary parts to isolate any failed line;
      fill the solder-dot connections to patch in substitute lines, the solder-dot connections selected as identified in the patching instruction charts;
      re-test the module, including high temperature stress testing of the module.

52. The method of claim 51 wherein the disconnecting and filling steps are automated.

53. A memory module made up of primary parts and partially defective backup parts, comprising:
   at least four primary parts, the primary parts having at least one line failure, and the primary parts are laid out horizontally with a card edge;
   at least four partially defective parts;
   a module PC board containing a pattern of solder-dot connections, the solder-dot connections allowing any failing primary part I/O lines to be replaced by I/O substitute lines from the backup parts;
   wherein the failing line is disconnected from the primary part by removing the solder of its solder dot connection and the substitute line is connected by filling the applicable solder-dot, the replacement line having the equivalent function as the failing line so that the module is transparent to the user.

54. The memory module of claim 53, wherein the four primary parts consist of 1MX16 parts, and the backup parts consists of 1MX4 memory parts.

55. The memory module of claim 53, wherein two primary parts and two back-up parts are located on the front side of the board and the other two primary parts and the other two back-up parts are located on the back side of the board.

56. The memory module of claim 53, wherein at least one of the primary parts is an extended data out part that runs at about 60 nsec.

57. The memory module of claim 53, wherein at least one of the primary parts is a extended data out part that runs at about 70 nsec.

58. The memory module of claim 53, wherein at least one of the primary parts is a Fast Page part.

59. The memory module of claim 53, further comprising a variable voltage regulator, the variable voltage regulator connected to the module PC board.

60. The memory module of claim 53, further comprising a variable voltage regulator, the variable voltage regulator connected to the module PC board, wherein the variable voltage regulator works with the extended data out primary part by tying output enable to ground.

61. The memory module of claim 53, further comprising a variable voltage regulator, the variable voltage regulator connected to the module PC board, wherein the variable voltage regulator works with the Fast Page primary part by tying output enable to ground.

62. The module of claim 53 wherein the resultant memory module comprises all good and partially defective memory parts.

63. The module of claim 53, wherein the resultant memory module contains at least one replacement part.

64. A module of claim 53, wherein the memory module comprises all good, partially defective and the replacement parts.

65. A memory module comprising:

primary part memory means for storing data;

independent backup part memory means for storing data;

connection means for selectively substituting an operational I/O data line of said backup memory means for a failed I/O data line of said primary memory means;

said memory module has a target memory capability X, said primary part memory means has a memory capacity X minus the capacity of any defective I/O data lines therein; and said independent backup part memory means has available memory capacity at least equal to the capacity of said defective I/O data lines.

66. A memory module in accordance with claim 65 wherein:

said connection means comprises a pattern of solder dot connections.

67. A memory module in accordance with claim 65 wherein:

said connection means comprises a pattern of jumper wire connections.

68. A memory module in accordance with claim 65 wherein:

said primary part memory means comprise 1MX16 parts; and said backup part memory means comprise 1MX4 parts.

69. A method for constructing a fully functional memory module which utilizes partially defective independent memory circuit parts comprising:

(a) testing and classifying memory parts in a set of defined classifications;

(b) selecting a primary memory part having a selected classification;

(c) selecting a backup memory part having a selected different classification;

(d) constructing a memory module wherein any defective data lines of the selected primary memory part are replaced by operational data lines of the backup circuit structure; and (e) testing constructing step (d) comprises: providing a selected pattern of solder dot connections.

70. A memory module constructed in accordance with any of the claims 69.

71. A method for constructing a fully functional memory module which utilizes partially defective independent memory circuit parts comprising:

(a) testing and classifying memory parts in a set of defined classifications (b) selecting a primary memory part having a selected classification;

(c) selecting a backup memory part having a selected different classification;

(d) constructing a memory module wherein: any defective data lines of the selected primary memory part are replaced by operational data lines of the backup circuit structure;

(e) testing said so constructed module as to its operational status to approve use of said module or to identify any operating problem in said module;

(f) reconstructing said module to remove any identified operating problem;

(g) testing said module as to its operational status to approve use as reconstructed or to identify any operating problems; and (j) repeating steps (h) and (i) as required until the module is approved for service.

* * * * *